United States Patent
Tanaka et al.

(10) Patent No.: US 9,502,434 B2
(45) Date of Patent: Nov. 22, 2016

(54) SEMICONDUCTOR DEVICE AND ELECTRONIC DEVICE

(71) Applicant: Semiconductor Energy Laboratory Co., Ltd., Atsugi-shi, Kanagawa-ken (JP)

(72) Inventors: Tetsuhiro Tanaka, Kanagawa (JP); Masayuki Sakakura, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/683,567

(22) Filed: Apr. 10, 2015

(65) Prior Publication Data
US 2015/0303217 A1    Oct. 22, 2015

(30) Foreign Application Priority Data
Apr. 18, 2014    (JP) .................................. 2014-086311

(51) Int. Cl.
*H01L 27/12*    (2006.01)
*H01L 23/532*    (2006.01)
(Continued)

(52) U.S. Cl.
CPC ..... *H01L 27/1207* (2013.01); *H01L 23/53257* (2013.01); *H01L 29/517* (2013.01);
(Continued)

(58) Field of Classification Search
None
See application file for complete search history.

(56) References Cited

U.S. PATENT DOCUMENTS 5,731,856 A    3/1998    Kim et al.
5,744,864 A    4/1998    Cillessen et al.
(Continued)

FOREIGN PATENT DOCUMENTS

CN    102171833 A    8/2011
CN    103426898 A    12/2013
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Charles Garber
*Assistant Examiner* — Alia Sabur
(74) *Attorney, Agent, or Firm* — Fish & Richardson P.C.

(57) ABSTRACT

The electric characteristics of a semiconductor device using an oxide semiconductor are improved. The reliability of a semiconductor device using an oxide semiconductor is improved. The semiconductor device includes an element layer. The element layer includes a first film, a transistor, and a second film. The first film and the second film are partly in contact with each other. The region in which the first film and the second film are in contact with each other has a closed-loop shape when seen from above. The transistor is located between the first film and the second film. The region in which the first film and the second film are in contact with each other is located between a side surface of the element layer and the transistor.

18 Claims, 33 Drawing Sheets

(51) Int. Cl.
*H01L 29/51* (2006.01)
*H01L 29/786* (2006.01)
*H01L 23/495* (2006.01)
*H01L 23/31* (2006.01)

(52) U.S. Cl.
CPC ......... *H01L 29/518* (2013.01); *H01L 29/7869* (2013.01); *H01L 29/78603* (2013.01); *H01L 29/78606* (2013.01); *H01L 23/3192* (2013.01); *H01L 23/49513* (2013.01); *H01L 23/49575* (2013.01); *H01L 23/5329* (2013.01); *H01L 2224/32245* (2013.01); *H01L 2224/48091* (2013.01); *H01L 2224/48247* (2013.01); *H01L 2224/48465* (2013.01); *H01L 2224/73265* (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0094791 A1 | 5/2004 | Ito et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0234487 A1* | 10/2006 | Kim ................. H01L 21/28518 438/597 |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |

| | | |
|---|---|---|
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0073684 A1* | 3/2008 | Hidaka ................. H01L 27/105 257/295 |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0078939 A1* | 3/2009 | Yamazaki ......... H01L 21/67144 257/59 |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0052021 A1* | 3/2010 | Mocho .................... H01L 28/55 257/295 |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0117079 A1* | 5/2010 | Miyairi ............... H01L 27/1225 257/43 |
| 2011/0001146 A1* | 1/2011 | Yamazaki ............. H05B 33/04 257/79 |
| 2011/0101351 A1 | 5/2011 | Yamazaki |
| 2011/0156026 A1* | 6/2011 | Yamazaki ......... H01L 21/02422 257/43 |
| 2011/0180802 A1 | 7/2011 | Morosawa et al. |
| 2011/0263084 A1 | 10/2011 | Yamazaki |
| 2013/0020569 A1* | 1/2013 | Yamazaki ........... H01L 27/1225 257/43 |
| 2013/0240878 A1 | 9/2013 | Morosawa et al. |
| 2013/0270563 A1 | 10/2013 | Yamazaki |
| 2013/0313545 A1 | 11/2013 | Saito et al. |
| 2014/0065430 A1 | 3/2014 | Yamazaki et al. |
| 2014/0138711 A1 | 5/2014 | Yamazaki et al. |
| 2015/0179774 A1 | 6/2015 | Yamazaki et al. |

FOREIGN PATENT DOCUMENTS

| | | |
|---|---|---|
| EP | 1737044 A | 12/2006 |
| EP | 2226847 A | 9/2010 |
| EP | 2667413 A | 11/2013 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |

(56) References Cited

FOREIGN PATENT DOCUMENTS

| | | |
|---|---|---|
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-049192 A | 2/2007 |
| JP | 2007-096055 A | 4/2007 |
| JP | 2007-123861 A | 5/2007 |
| JP | 2009-272319 A | 11/2009 |
| JP | 2010-093064 A | 4/2010 |
| JP | 2010-114413 A | 5/2010 |
| JP | 2011-029176 A | 2/2011 |
| JP | 2012-212714 A | 11/2012 |
| JP | 2013-246248 A | 12/2013 |
| JP | 2014-063723 A | 4/2014 |
| JP | 2014-239045 A | 12/2014 |
| KR | 2011-0069042 A | 6/2011 |
| KR | 2013-0132258 A | 12/2013 |
| KR | 2014-0029181 A | 3/2014 |
| TW | 201025614 | 7/2010 |
| TW | 201349480 | 12/2013 |
| WO | WO-2004/114391 | 12/2004 |
| WO | WO-2010/041686 | 4/2010 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposiium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3-BO Systems [A; Fe, Ga, or Al; B: Mg, Mn, Fe, Ni, Cu,or Zn] at temperatures over 1000° C.", Journal of Solid State Chemistry, 1985, vol. 60, pp. 382-284.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

(56) References Cited

OTHER PUBLICATIONS

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IgZo Oxide TFT", SID Digest '08 : SID International Symposium Digest of Technical Papers, May 20, 2008, vol. 39, pp. 625-628.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds $InMO_3(ZnO)_m$ (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symosium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline $InGaO_3(ZnO)_5$ films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide $InGaO_3(ZnO)_m$ (m<4):a Zn4s conductor", Philosophical Magazine, 2001, vol. 81, No. 5, pp. 501-515.

Orita.M et al., "Mechanism of Electrical Conductivity of Transparent $InGaZnO_4$", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest'08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GiZo ($Ga_2O_3$—$In_2O_3$—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on $SrTiO_3$ With Sputtered $Al_2O_3$ Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

International Search Report (Application No. PCT/IB2015/052486) Dated Jul. 21, 2015.

Written Opinion (Application No. PCT/IB2015/052486) Dated Jul. 21, 2015.

* cited by examiner

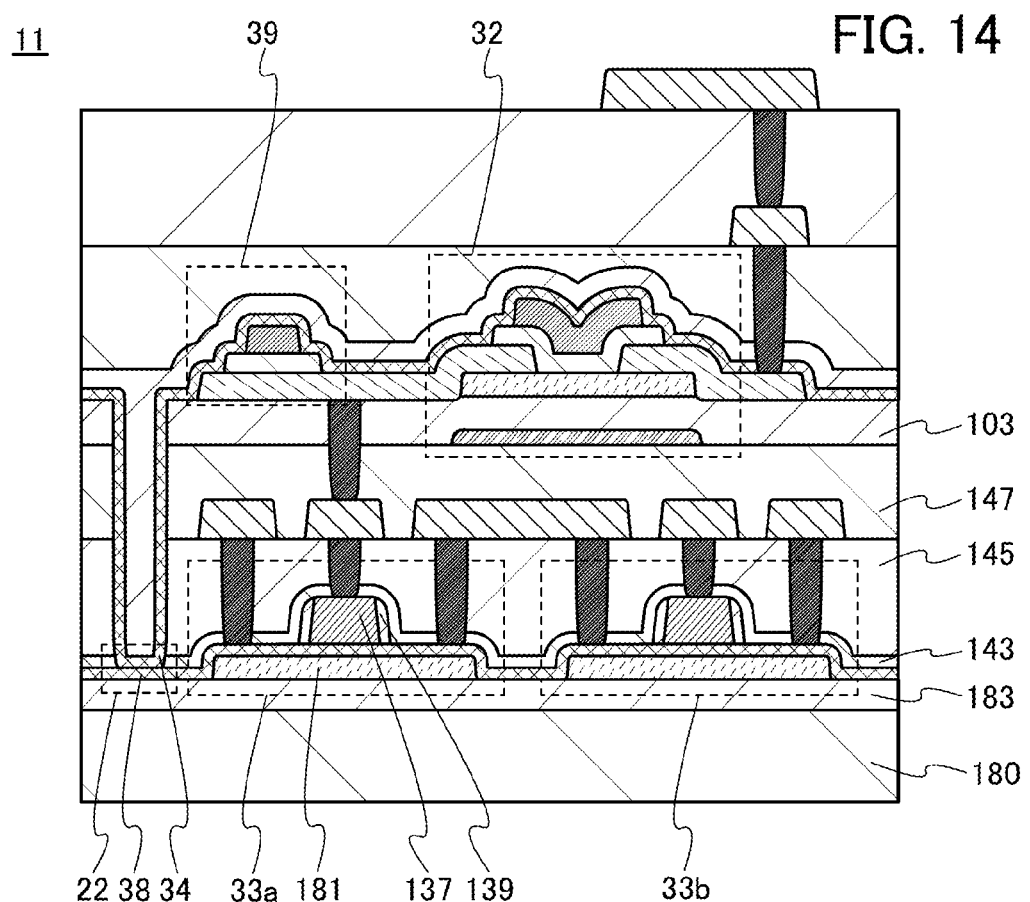

SEMICONDUCTOR DEVICE AND ELECTRONIC DEVICE

TECHNICAL FIELD

The present invention relates to an object, a process (including a method and a manufacturing method), a machine, a manufacture, or a composition of matter. In particular, one embodiment of the present invention relates to a semiconductor device, a display device, a light-emitting device, a driving method thereof, a manufacturing method thereof, or the like. In particular, one embodiment of the present invention relates to a semiconductor device, a display device, a memory device, a light-emitting device, or the like including an oxide semiconductor.

Note that in this specification, a semiconductor device includes all devices that can function by utilizing electronic characteristics of a semiconductor in its category, and for example, a semiconductor circuit is an example of the semiconductor device. Moreover, an electro-optic device, a display device, an electric appliance, and the like may include a semiconductor device.

BACKGROUND ART

Transistors used for most flat panel displays typified by a liquid crystal display device or a light-emitting display device are formed using a silicon semiconductor such as amorphous silicon, single crystal silicon, or polycrystalline silicon provided over a glass substrate. Further, such a transistor using such a silicon semiconductor is used in integrated circuits (ICs) and the like.

In recent years, attention has been drawn to a technique in which, instead of a silicon semiconductor, a metal oxide exhibiting semiconductor characteristics is used in a transistor. Note that in this specification, a metal oxide exhibiting semiconductor characteristics is referred to as an oxide semiconductor.

For example, a technique has been disclosed in which a transistor is manufactured using zinc oxide or an In—Ga—Zn-based oxide as an oxide semiconductor and the transistor is used as a switching element or the like of a pixel of a display device (see Patent Documents 1 and 2).

REFERENCE

[Patent Document 1] Japanese Published Patent Application No. 2007-123861

[Patent Document 2] Japanese Published Patent Application No. 2007-096055

DISCLOSURE OF INVENTION

Hydrogen contained in the oxide semiconductor film reacts with oxygen bonded to a metal atom to be water, and in addition, an oxygen vacancy is formed in a lattice from which oxygen is released (or a portion from which oxygen is released). Entry of hydrogen into the oxygen vacancy generates an electron serving as a carrier. Furthermore, bonding of part of hydrogen to oxygen bonded to a metal atom causes generation of an electron serving as a carrier. Thus, a transistor including an oxide semiconductor that contains hydrogen is likely to be normally on.

In view of the above, an object of one embodiment of the present invention is to improve electric characteristics of a semiconductor device including a transistor using an oxide semiconductor. Another object of one embodiment of the present invention is to improve reliability in a semiconductor device including a transistor using an oxide semiconductor. Another object of one embodiment of the present invention is to suppress an increase in the hydrogen concentration in an oxide semiconductor by the entry of hydrogen, water, and/or the like from the outside. Another object of one embodiment of the present invention is to reduce oxygen vacancies in an oxide semiconductor. Another object of one embodiment of the present invention is to prevent a transistor from becoming normally-on. Another object of one embodiment of the present invention is to control a change, a variation, or a decrease in threshold voltage of a transistor. Another object of one embodiment of the present invention is to provide a transistor having a low off-state current. Another object of one embodiment of the present invention is to provide a novel semiconductor device or the like.

Note that the description of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a semiconductor device including an element layer. The element layer includes a first film, a transistor, and a second film. The first film and the second film have a region in which they are in contact with each other. The region in which the first film and the second film are in contact with each other has a closed-loop shape when seen from above. The transistor is located between the first film and the second film. The region in which the first film and the second film are in contact with each other is located between a side surface of the element layer and the transistor.

Note that the first film and the second film each have a function of suppressing diffusion of one or more of hydrogen, water, and the like. Thus, the first film and the second film each serve as a hydrogen barrier film and/or a water barrier film. The semiconductor device may include a first transistor and a second transistor.

The first transistor includes a first gate electrode, an oxide semiconductor film, and a first gate insulating film between the first gate electrode and the oxide semiconductor film. The second transistor includes a second gate electrode, a semiconductor region formed in a semiconductor substrate, and a second gate insulating film between the second gate electrode and the semiconductor region.

One of the first film and the second film may be in contact with the first transistor, and the other of the first film and the second film may be provided between the first transistor and the second transistor.

The one of the first film and the second film may be in contact with the first transistor, and the other of the first film and the second film may serve as the second gate insulating film in the second transistor.

The first transistor includes the first gate electrode, the oxide semiconductor film, and the first gate insulating film between the first gate electrode and the oxide semiconductor film. The second transistor is provided over a substrate and includes the second gate electrode, the semiconductor film, and the second gate insulating film between the second gate electrode and the semiconductor film.

The one of the first film and the second film may be in contact with the first transistor, and the other of the first film and the second film may be provided between the first transistor and the second transistor.

The one of the first film and the second film may be in contact with the first transistor, and the other of the first film and the second film may be provided between the substrate and the second transistor.

The second film in contact with the first film and a third film in contact with the first film may be provided. The one of the first film and the second film may be in contact with the first transistor, the other of the first film and the second film may be provided between the substrate and the second transistor, and the third film may be provided between the first transistor and the second transistor.

The third film in contact with the first film and the second film is provided. The one of the first film and the second film may be in contact with the first transistor, the other of the first film and the second film may be provided between the substrate and the second transistor, and the third film may be provided between the first transistor and the second transistor.

Note that like the first film and the second film, the third film has a function of suppressing diffusion of hydrogen, water, and/or the like. Thus, the third film serves as a hydrogen barrier film and/or a water barrier film.

At least one of the first to third films includes any of a silicon nitride film, a silicon nitride oxide film, an aluminum oxide film, an aluminum oxynitride film, a gallium oxide film, a gallium oxynitride film, a yttrium oxide film, a yttrium oxynitride film, a hafnium oxide film, and a hafnium oxynitride film.

The semiconductor device may further include a terminal electrically connected to the transistor included in the element layer.

One embodiment of the present invention can improve the electric characteristics of a semiconductor device including a transistor using an oxide semiconductor. One embodiment of the present invention can improve reliability of a semiconductor device including a transistor using an oxide semiconductor. One embodiment of the present invention can suppress an increase in the hydrogen concentration in an oxide semiconductor by the entry of hydrogen, water, and/or the like from the outside. One embodiment of the present invention can reduce oxygen vacancies in an oxide semiconductor. One embodiment of the present invention can provide a normally-off transistor. One embodiment of the present invention can control a change, a variation, or a decrease in threshold voltage of a transistor. Furthermore, one embodiment of the present invention allows fabrication of a semiconductor device including a transistor having a low off-state current. Furthermore, one embodiment of the present invention enables fabrication of a novel semiconductor device or the like. Note that the description of these effects does not disturb the existence of other effects. One embodiment of the present invention does not necessarily have all the effects listed above. Other effects will be apparent from and can be derived from the description of the specification, the drawings, the claims, and the like.

BRIEF DESCRIPTION OF DRAWINGS

In the accompanying drawings:

FIG. 14 illustrates one embodiment of a semiconductor device;

BEST MODE FOR CARRYING OUT THE INVENTION

Figure 1A:
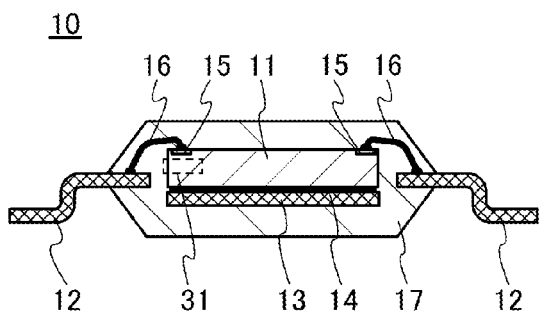
FIGS. 1A to 1E illustrate embodiments of semiconductor devices.

Embodiments of the present invention will be described below in detail with reference to the drawings. Note that the present invention is not limited to the following description. It will be readily appreciated by those skilled in the art that modes and details of the present invention can be changed in various ways without departing from the spirit and scope of the present invention. Therefore, the present invention should not be construed as being limited to the following description of the embodiments. In addition, in the following embodiments, the same portions or portions having similar functions are denoted by the same reference numerals or the same hatching patterns in different drawings, and the description thereof will not be repeated.

Note that in each drawing described in this specification, the size, the film thickness, or the region of each component is exaggerated for clarity in some cases. Therefore, the embodiments and examples of the present invention are not limited to such a scale.

In addition, terms such as "first", "second", and "third" in this specification are used in order to avoid confusion among components, and the terms do not limit the components numerically. Therefore, for example, the term "first" can be replaced with the term "second", "third", or the like as appropriate.

Functions of a "source" and a "drain" are sometimes replaced with each other when the direction of current flow is changed in circuit operation, for example. Therefore, the terms "source" and "drain" can be interchanged with each other in this specification.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

In this specification, trigonal and rhombohedral crystal systems are included in a hexagonal crystal system.

Note that a voltage refers to a difference between the potentials of two points, and a potential refers to electrostatic energy (electric potential energy) of unit charge at a given point in an electrostatic field. Note that in general, a difference between a potential of one point and a reference potential (e.g., a ground potential) is merely called a potential or a voltage, and a potential and a voltage are used as synonymous words in many cases. Thus, in this specification, a potential may be rephrased as a voltage and a voltage may be rephrased as a potential unless otherwise specified.

Note that a transistor including an oxide semiconductor film is an n-channel transistor; therefore, in this specification, a transistor that can be regarded as having no drain current flowing therein when a gate voltage is 0 V is defined as a transistor having normally-off characteristics. In contrast, a transistor that can be regarded as having a drain current flowing therein when the gate voltage is 0 V is defined as a transistor having normally-on characteristics.

Note that the channel length refers to, for example, a distance between a source (a source region or a source electrode) and a drain (a drain region or a drain electrode) in a region where an oxide semiconductor film (or a portion where a current flows in an oxide semiconductor film when a transistor is on) and a gate electrode overlap with each other or a region where a channel is formed in a schematic top view of the transistor. In one transistor, channel lengths in all regions are not necessarily the same. In other words, the channel length of one transistor is not fixed to one value in some cases. Therefore, in this specification, the channel length is any one of values, the maximum value, the minimum value, or the average value in a region where a channel is formed.

The channel width refers to, for example, the length of a portion where a source and a drain face each other in a region where an oxide semiconductor film (or a portion where a current flows in an oxide semiconductor film when a transistor is on) and a gate electrode overlap with each other or a region where a channel is formed. In one transistor, channel widths in all regions are not necessarily the same. In other words, the channel width of one transistor is not fixed to one value in some cases. Therefore, in this specification, a channel width is any one of values, the maximum value, the minimum value, or the average value in a region where a channel is formed.

Note that depending on the transistor structure, a channel width in a region where a channel is formed actually (hereinafter referred to as an effective channel width) is different from a channel width shown in a schematic top view of a transistor (hereinafter referred to as an apparent channel width) in some cases. For example, in a transistor having a three-dimensional structure, an effective channel width is greater than an apparent channel width shown in a schematic top view of the transistor, and its influence cannot be ignored in some cases. For example, in a miniaturized transistor having a three-dimensional structure, the proportion of a channel region formed in a side surface of an oxide semiconductor film is higher than the proportion of a channel region formed in a top surface of the oxide semiconductor film in some cases. In that case, an effective channel width obtained when a channel is actually formed is greater than an apparent channel width shown in the schematic top view.

In a transistor having a three-dimensional structure, an effective channel width is difficult to measure in some cases. For example, estimation of an effective channel width from a design value requires an assumption that the shape of an oxide semiconductor film is known. Therefore, in the case where the shape of an oxide semiconductor film is not known accurately, it is difficult to measure an effective channel width accurately.

In view of the above, in a schematic top view of a transistor, an apparent channel width that is a length of a portion where a source and a drain face each other in a region where an oxide semiconductor film and a gate electrode overlap with each other may be referred to as a "surrounded channel width (SCW)" in this specification. Furthermore, in this specification, in the case where the term "channel width" is simply used, it may denote a surrounded channel width and an apparent channel width. Alternatively, in this specification, in the case where the term "channel width" is simply used, it may denote an effective channel width. Note that the values of a channel length, a channel width, an effective channel width, an apparent channel width, a surrounded channel width, and the like can be determined by obtaining and analyzing a cross-sectional TEM image and the like.

Note that in the case where electric field mobility, a current value per channel width, and the like of a transistor are obtained by calculation, a surrounded channel width may be used for the calculation. In that case, a value different from one when an effective channel width is used for the calculation is obtained in some cases.

Embodiment 1

In this embodiment, structures of semiconductor devices will be described with reference to FIGS. 1A to 1E, FIGS. 2A and 2B, FIGS. 3A to 3C, and FIGS. 4A and 4B.
<Structures of Semiconductor Devices>

FIG. 1A is a schematic cross-sectional view of a semiconductor device 10. The semiconductor device 10 illustrated in FIG. 1A includes an element layer 11 and a terminal 12 electrically connected to the element layer 11. The element layer 11 includes a conductive film 15 serving as an electrode pad. The semiconductor device 10 further includes a conductive member 16 that electrically connects the terminal 12 and the conductive film 15 in the element layer 11. The semiconductor device 10 may further include an organic resin layer 17 that covers the element layer 11 and the conductive member 16. The element layer 11 may be fixed to a die pad 13 with the use of a conductive paste 14. Although the semiconductor device illustrated in FIG. 1A has a quad flat package (QFP) structure, any of the following structures may alternatively be employed as appropriate: a dual in-line package (DIP) structure and a pin grid array (PGA) structure, which are of an insertion mount type; a small outline package (SOP) structure, a shrink small outline package (SSOP) structure, a thin-small outline package (TSOP) structure, a leaded chip carrier (LCC) structure, a quad flat non-leaded package (QFN) structure, a ball grid array (BGA) structure, and a fine pitch ball grid array (FBGA) structure, which are of a surface mount type; a dual tape carrier package (DTP) structure and a quad tape-carrier package (QTP) structure, which are of a contact mount type; and the like.

The terminal 12 and the die pad 13 can be formed using an iron-nickel alloy, copper, a copper alloy, or the like. The terminal 12 can have a straight line shape, an L shape, or a J shape as appropriate in accordance with a mounting method of the semiconductor device.

The conductive paste 14 contains an organic resin and conductive particles each with a size of several nanometers to several tens of micrometers. Examples of the organic resin include an epoxy resin and a silicone resin. As the conductive particles, any of the following can be used: particles of any one or more of metals selected from silver, gold, copper, nickel, platinum, palladium, tantalum, molybdenum, titanium, and the like; fine particles of silver halide; and dispersive nanoparticles thereof.

The conductive film 15 can be formed using aluminum, an alloy containing aluminum, gold, an alloy containing gold, copper, an alloy containing copper, or the like.

The conductive member 16 can be formed using a metal thin wire (hereinafter referred to as a wire) made of aluminum, an alloy containing aluminum, gold, an alloy containing gold, copper, an alloy containing copper, or the like.

The organic resin layer 17 can be formed using an epoxy resin or the like.

Figure 1B:
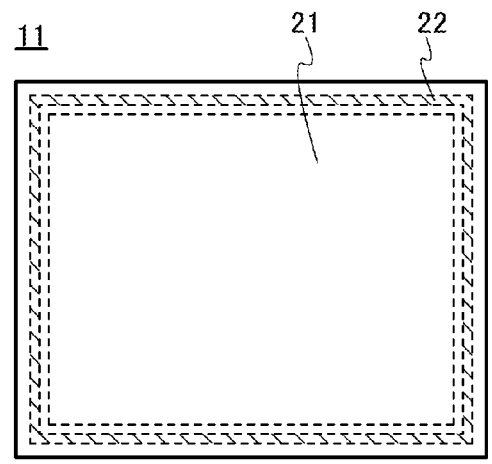
Figure 2A:
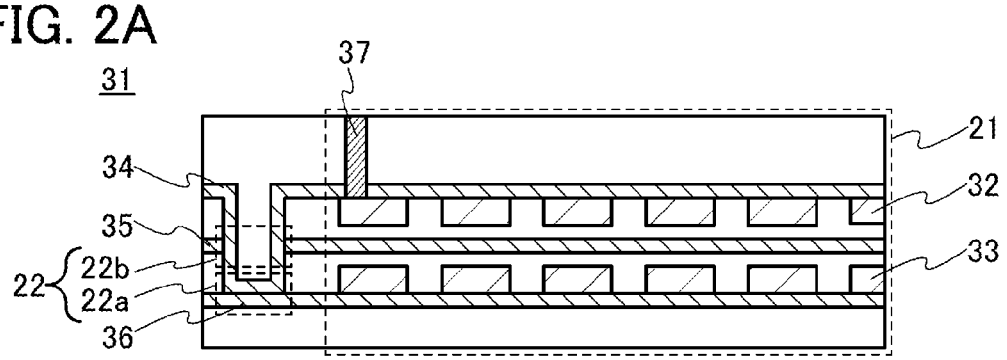
FIGS. 2A and 2B illustrate embodiments of semiconductor devices.
Figure 2B:
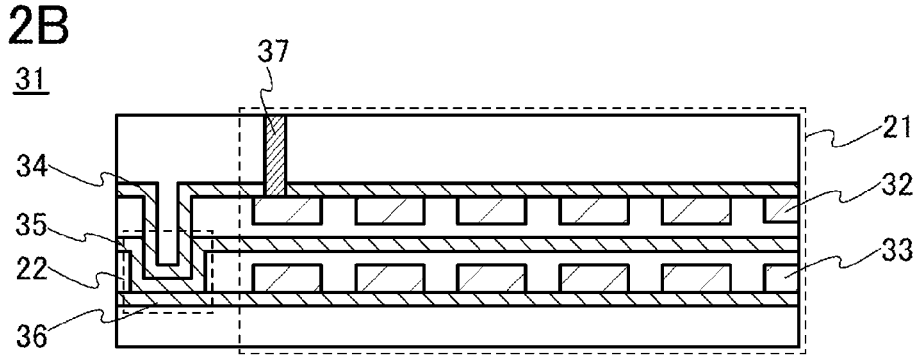
Figure 3A:
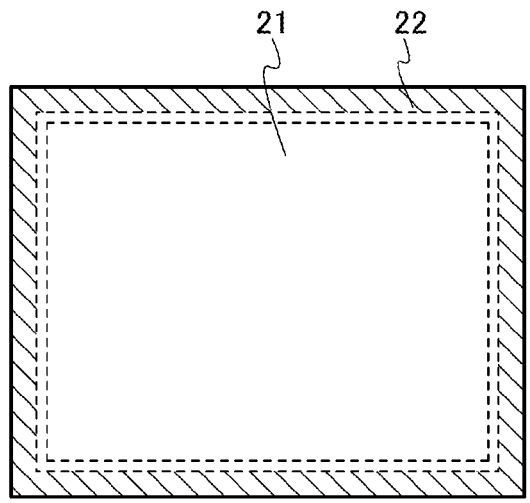
FIGS. 3A to 3C illustrate embodiments of semiconductor devices.

FIG. 1B and FIG. 3A are each a schematic top view of the element layer 11. Note that the conductive film 15 is not illustrated in FIG. 1B. FIGS. 1D and 1E, FIGS. 2A and 2B, FIGS. 3B and 3C, and FIGS. 4A and 4B are each an enlarged schematic view of a region surrounded by broken lines 31 in the element layer 11 illustrated in FIG. 1A.

Figure 1C:
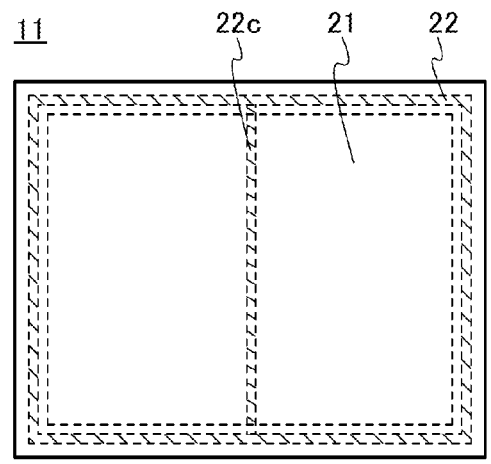
Figure 1D:
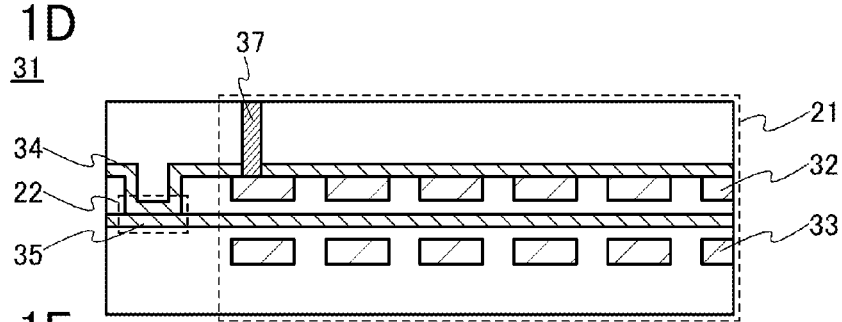

As illustrated in FIGS. 1B to 1D, the element layer 11 includes a region 21 that includes transistors 32 and 33 and a sealing region 22 that is provided between the region 21 and side surfaces of the element layer 11. The element layer 11 includes a conductive film 37 connected to the transistor 32. The conductive film 37 serves as a plug. The conductive film 37 is electrically connected to the conductive film 15 illustrated in FIG. 1A.

As illustrated in the top view of FIG. 1B, the sealing region 22 surrounds the region 21. In other words, the region 21 is located inside an area surrounded by the sealing region 22. The sealing region 22 has a closed-loop shape such as a polygonal shape, a circular shape, or an oval shape when seen from above. Alternatively, the sealing region 22 has a closed-loop shape at least on the periphery of an outer edge portion of the element layer 11 as illustrated in the top view of the element layer 11 in FIG. 1C. Furthermore, a sealing region 22c that is inside and connected to the sealing region 22 having a closed-loop shape may be provided. Note that the sealing region 22c provided inside the sealing region 22 having a closed-loop shape can have a straight line shape, a curve shape, or the like. Alternatively, a plurality of sealing regions 22c may be provided in the sealing region 22. Alternatively, a grid-like sealing region may be provided in the sealing region 22.

In the sealing regions 22 and 22c, protective films 34 and 35 are in contact with each other.

The protective films 34 and 35 each have a function of suppressing diffusion of hydrogen, water, and/or the like. Thus, the protective films 34 and 35 each serve as a hydrogen barrier film and/or a water barrier film. The protective films 34 and 35 can each be formed using a silicon nitride film, a silicon nitride oxide film, an aluminum oxide film, an aluminum oxynitride film, a gallium oxide film, a gallium oxynitride film, a yttrium oxide film, a yttrium oxynitride film, a hafnium oxide film, a hafnium oxynitride film, or the like. The protective films 34 and 35 each preferably have a thickness that is large enough to prevent hydrogen diffusion and typified by a thickness greater than or equal to 20 nm and less than or equal to 250 nm.

Note that in this specification, the protective films may each have a function other than the function of suppressing diffusion of hydrogen, water, and/or the like. In that case, the protective films can simply be called films.

The element layer 11 illustrated in FIG. 1D includes the transistors 32 between the protective films 34 and 35.

Note that the transistor 32 is a transistor in contact with the protective film 34 in FIG. 1D. The transistor 33 is a transistor provided on the opposite side of the transistor 32 with the protective film 35 therebetween.

The transistor 32 includes an oxide semiconductor film, and a channel region is formed in the oxide semiconductor film. As the oxide semiconductor film, an oxide semiconductor film containing In or Ga can be used. Typical examples include an In—Ga oxide film, an In—Zn oxide film, an In—Mg oxide film, a Zn—Mg oxide film, and an In-M-Zn oxide film (M is Al, Ti, Ga, Y, Zr, Sn, La, Ce, Mg, or Nd).

The transistor 33 is formed using a semiconductor substrate, and a channel region is formed in the semiconductor substrate. Alternatively, the transistor 33 may be a transistor in which a semiconductor film is provided over a substrate and a channel region is formed in the semiconductor film. As the semiconductor substrate, a single crystal semiconductor substrate or a polycrystalline semiconductor substrate of silicon, germanium, or the like; a compound semiconductor substrate of silicon germanium, silicon carbide, gallium arsenide, aluminum gallium arsenide, indium gallium arsenide, gallium nitride, indium phosphide, zinc oxide, gallium oxide, or the like; a silicon on insulator (SOI) substrate; or the like can be used. As the semiconductor film, a silicon film, an oxide semiconductor film, or the like can be used. The semiconductor film can have an amorphous structure, a polycrystalline structure, a single crystal structure, or any other crystal structure, as appropriate.

Hydrogen contained in the oxide semiconductor film reacts with oxygen bonded to a metal atom to be water, and in addition, an oxygen vacancy is formed in a lattice from which oxygen is released (or a portion from which oxygen is released). Entry of hydrogen into the oxygen vacancy generates an electron serving as a carrier. Furthermore, bonding of part of hydrogen to oxygen bonded to a metal atom causes generation of an electron serving as a carrier.

Thus, a transistor including an oxide semiconductor that contains hydrogen is likely to be normally on.

Thus, when the transistors 32 each including an oxide semiconductor film are surrounded by the protective films 34 and 35 as in the semiconductor device described in this embodiment, the diffusion amount of hydrogen from the outside into the transistor 32 can be reduced. As a result, changes in the electric characteristics of the transistors can be reduced and reliability of the semiconductor device can be improved.

The conductive film 37 is formed in an opening formed in the protective film 34. Thus, the conductive film 37 is preferably formed using a material that suppresses diffusion of hydrogen, water, and/or the like, in which case the diffusion amount of hydrogen, water, and/or the like from the opening formed in the protective film 34 into the transistor 32 can be reduced. The conductive film 37 that suppresses diffusion of hydrogen, water, and/or the like serves as a hydrogen barrier film and/or a water barrier film.

Examples of the conductive film that suppresses diffusion of hydrogen, water, and/or the like include a titanium film, a tantalum film, a titanium nitride film, a tantalum nitride film, and an $Ir_xTa_{1-x}$ (0<x<1) film. Note that an $Ir_xTa_{1-x}$ (0<x<1) film with an amorphous structure is preferred because of having a more excellent hydrogen, water, and/or the like barrier property than that with a crystalline structure. Note that an $Ir_xTa_{1-x}$ when 0<x<0.5 is satisfied has an amorphous structure at 650° C. or lower. Thus, when the heating temperature in a fabricating process of the semiconductor device is 650° C. or lower the hydrogen diffusion amount into the transistor 32 through the conductive film 37 in the opening formed in the protective film 34.

Figure 1E:
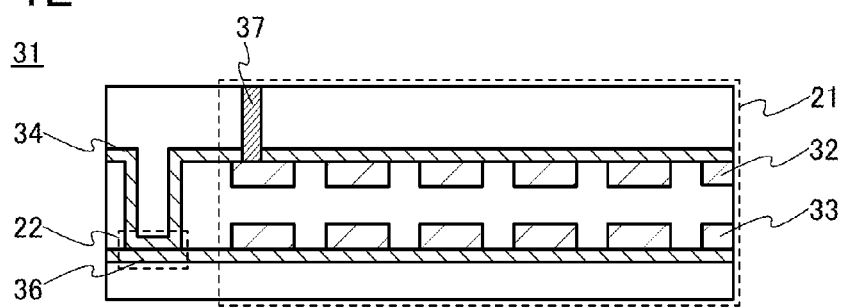

The element layer 11 included in the semiconductor device includes the transistors 32 and 33, the protective film 34 in contact with the transistors 32, and a protective film 36 as illustrated in FIG. 1E. The transistors 32 and 33 may be located between the protective films 34 and 36. In addition, the sealing region 22 in which the protective films 34 and 36 are in contact with each other is provided between the region 21 and a side surface of the element layer 11. The protective film 36 has a function of suppressing diffusion of hydrogen, water, and/or the like. Thus, the protective film 36 serves as a hydrogen barrier film and/or a water barrier film.

The transistors 32 and 33 are surrounded by the protective films 34 and 36. Thus, the hydrogen diffusion amount from the outside into the transistors 32 and 33 can be reduced. Therefore, when the transistors 32 and 33 are transistors each including an oxide semiconductor film, changes in the electric characteristics of the transistors can be reduced, improving the reliability of the semiconductor device.

Alternatively, the element layer 11 included in the semiconductor device may include the transistors 32 and 33, the protective film 34 in contact with the transistors 32, the protective film 35, and the protective film 36 as illustrated in FIG. 2A. The transistor 32 may be located between the protective films 34 and 35. The transistor 33 may be located between the protective films 35 and 36. In addition, the sealing region 22 in which the protective films 34, 35, and 36 are in contact with each other is provided between the region 21 and the side surface of the element layer 11. The sealing region 22 includes a region 22a in which the protective films 34 and 36 are in contact with each other and a region 22b in which the protective films 34 and 35 are in contact with each other.

Alternatively, the element layer 11 included in the semiconductor device may include the sealing region 22 in which the protective film 36, the protective film 35, and the protective film 34 are stacked in this order, as illustrated in FIG. 2B. Furthermore, the sealing region 22 in which the protective film 34, the protective film 35, and the protective film 36 are in contact with each other is provided between the region 21 and the side surface of the element layer 11.

The transistors 32 are surrounded by the protective films 34 and 35 in the element layer 11 illustrated in FIGS. 2A and 2B. In addition, the transistors 33 are surrounded by the protective films 35 and 36. Thus, the hydrogen diffusion amount from the outside into the transistors 32 and 33 can be reduced. Consequently, changes in the electric characteristics of the transistors can be reduced, improving the reliability of the semiconductor device.

In the element layer 11 included in the semiconductor device, the sealing region 22 may surround the region 21 including the transistors 32 and 33 and part of the sealing region 22 may extend to the side surface of the element layer 11, as illustrated in FIG. 3A. In other words, part of the sealing region 22 may be part of the side surface of the element layer 11 as illustrated in FIG. 3B.

Figure 3B:
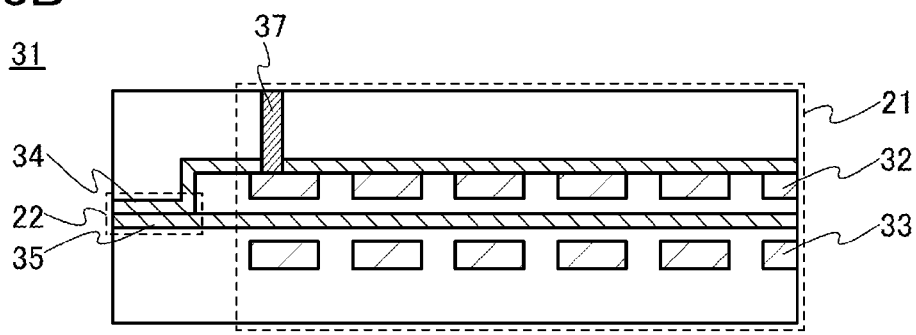

In the element layer 11 illustrated in FIG. 3B, the sealing region 22 in which the protective films 34 and 35 are in contact with each other is provided outside the region 21. Part of the sealing region 22 is part of the side surface of the element layer 11.

The transistor 32 includes an oxide semiconductor film. The transistors 32 are surrounded by the protective films 34 and 35. Thus, the hydrogen diffusion amount from the outside into the transistors 32 can be reduced. Consequently, changes in the electric characteristics of the transistors can be reduced, improving the reliability of the semiconductor device.

Figure 3C:
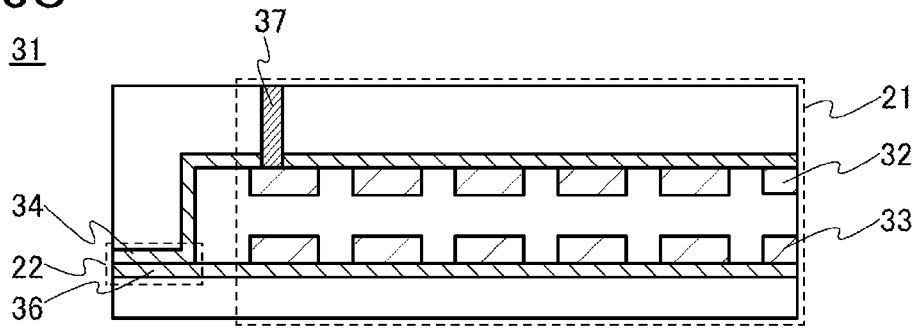

Alternatively, in the element layer 11 included in the semiconductor device, the sealing region 22 in which the protective films 34 and 36 are in contact with each other is provided outside the region 21 as illustrated in FIG. 3C. Part of the sealing region 22 is part of the side surface of the element layer 11.

The transistors 32 and 33 are surrounded by the protective films 34 and 36. Thus, the hydrogen diffusion amount from the outside into the transistors 32 and 33 can be reduced. Therefore, when the transistors 32 and 33 are transistors each including an oxide semiconductor film, changes in the electric characteristics of the transistors can be reduced, improving the reliability of the semiconductor device.

Figure 4A:
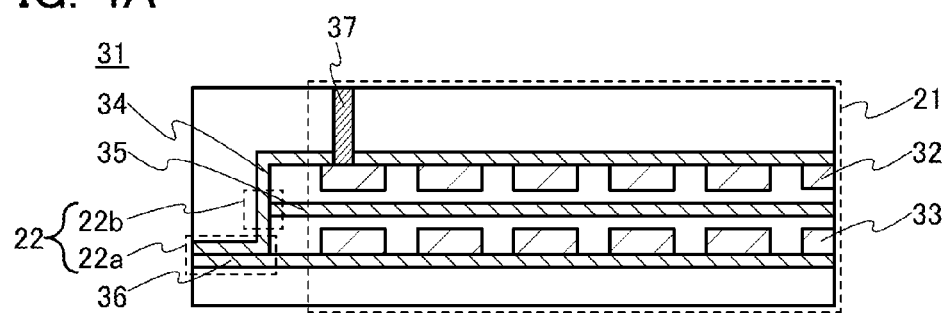
FIGS. 4A and 4B illustrate embodiments of semiconductor devices.

Alternatively, in the element layer 11 included in the semiconductor device, the sealing region 22 in which the protective films 34 and 36 are in contact with each other is provided outside the region 21 as illustrated in FIG. 4A. Part of the sealing region 22 is part of the side surface of the element layer 11. The sealing region 22 includes the region 22a in which the protective films 34 and 36 are in contact with each other and the region 22b in which the protective films 34 and 35 are in contact with each other.

Figure 4B:
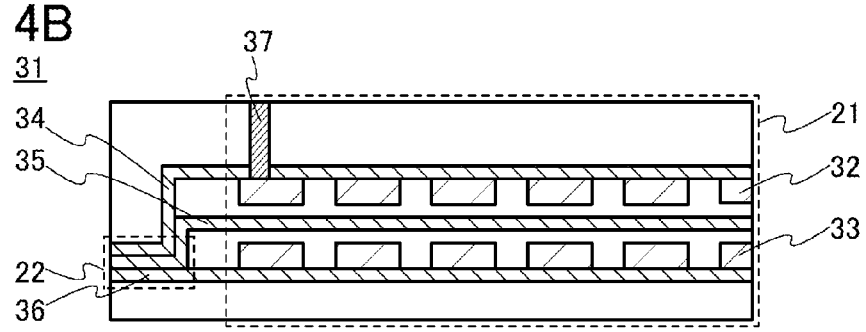

Alternatively, the element layer 11 included in the semiconductor device may include the sealing region 22 in which the protective film 36, the protective film 35, and the protective film 34 are stacked in this order, as illustrated in FIG. 4B. Furthermore, the sealing region 22 in which the protective film 34, the protective film 35, and the protective film 36 are in contact with each other is provided outside the region 21. Part of the sealing region 22 is part of the side surface of the element layer 11.

The transistors 32 are surrounded by the protective films 34 and 35 in the element layer 11 illustrated in FIGS. 4A and 4B. In addition, the transistors 33 are surrounded by the protective films 35 and 36. Thus, the hydrogen diffusion amount from the outside into the transistors 32 and 33 can be reduced. Consequently, changes in the electric characteristics of the transistors can be reduced, improving the reliability of the semiconductor device.

<Fabricating Method of Semiconductor Device>

Next, a method for fabricating a semiconductor device described in this embodiment will be described with reference to FIGS. 5A to 5H.

First, an element substrate 51 is formed. A method for forming the element substrate 51 will be described in a subsequent embodiment. Note that the rear surface of the element substrate 51 may be ground so that the element substrate 51 is reduced in thickness. Grinding the rear surface of the element substrate 51 enables the semiconductor device to have a smaller size.

Figure 5A:
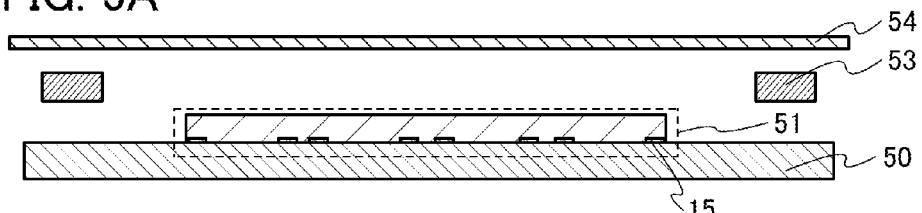
FIGS. 5A to 5H illustrate one embodiment of a method for fabricating a semiconductor device.

Next, the element substrate 51 is provided over a stage 50 of a dicing apparatus as illustrated in FIG. 5A. Here, the element substrate 51 is provided over the stage 50 such that the conductive film 15 exposed on a surface of the element substrate 51 is on the stage 50 side.

Friction caused when the element substrate 51 and a frame body 53 are mounted on the stage 50 generates static electricity. Owing to the generation of static electricity, a high voltage is applied to a semiconductor element formed in the element substrate 51, typically, the transistor, so that dielectric breakdown of the transistor occurs. Thus, the stage 50 is preferably formed using a conductive material. Furthermore, the stage 50 is preferably grounded.

Subsequently, the frame body 53 is provided over the stage 50. In addition, an adhesive sheet 54 is provided over the frame body 53. The adhesive sheet 54 includes a sheet and an adhesive resin film over the sheet. One surface of the adhesive sheet 54 thus has adhesion. The adhesive sheet 54 is provided over the frame body 53 such that the adhesive surface faces the frame body 53.

The frame body 53 is preferably a frame-like member with an opening larger than the element substrate 51. To prevent generation of static electricity, the frame body 53 and the adhesive sheet 54 each preferably have conductivity.

Figure 5B:

The element substrate 51 and the frame body 53 are fixed to the stage 50 with a vacuum chuck apparatus provided in the stage 50 as illustrated in FIG. 5B. Then, the adhesive sheet 54 is bonded to the element substrate 51 and the frame body 53.

In the step of bonding the adhesive sheet 54 to the element substrate 51 and the frame body 53, a static electricity remover, e.g., an ionizer is preferably used. Positive ions and negative ions generated by a static electricity remover are blown to the element substrate 51, the frame body 53, and the adhesive sheet 54, whereby static electricity stored in the element substrate 51, the frame body 53, and the adhesive sheet 54 can be neutralized to be electrically neutral (diselectrification).

Figure 5C:

Then, an unnecessary portion of the adhesive sheet is removed as illustrated in FIG. 5C.

To neutralize static electricity generated in the adhesive sheet by friction caused in the step of removing the adhesive sheet, it is preferred that positive ions and negative ions be blown to the adhesive sheet 54 with the use of a static electricity remover.

After that, the element substrate 51 and the frame body 53 are removed from the stage 50. In this step, positive ions and negative ions generated by a static electricity remover are blown to the element substrate 51, the frame body 53, and the adhesive sheet 54 to prevent dielectric breakdown of the semiconductor element due to static electricity. Consequently, static electricity stored in the element substrate 51, the frame body 53, and the adhesive sheet 54 can be neutralized to be electrically neutral (diselectrification). Furthermore, the pressure in the vacuum chuck apparatus is returned to atmospheric pressure, whereby it is possible to easily remove the element substrate 51 and the frame body 53 from the stage 50 while suppressing occurrence of friction.

Figure 5D:
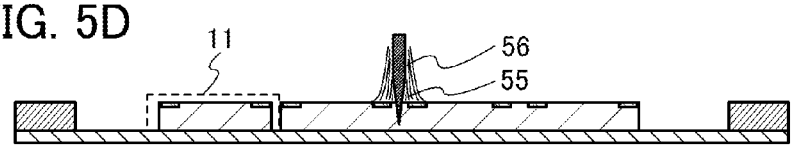

Then, as illustrated in FIG. 5D, the element substrate 51 is cut to form a plurality of element layers 11. This process is also referred to as a dicing process. The element substrate 51 is cut using a dicing wheel 56. Note that heat generation occurs and static electricity is generated by the friction between the element substrate 51 and the dicing wheel 56 in this step. For this reason, it is preferred that the element substrate 51 be cut while cutting water 55 obtained by dissolving carbon dioxide in a liquid with a low resistivity typified by pure water is applied to a portion to be cut. Note that the resistivity of the cutting water is preferably 3 MΩ·cm or less, in which case static electricity is less likely to be caused.

Although the element substrate 51 is cut using the dicing wheel here, laser light irradiation may be performed on the element substrate 51 to cut the element substrate 51.

The element substrate 51 is cut in a region other than the sealing region, whereby the element layer 11 in which the sealing region 22 is not exposed on the side surface of the element layer 11 as illustrated in FIGS. 1A to 1E and FIGS. 2A and 2B can be formed. In contrast, when the sealing region is cut, the element layer 11 in which the sealing region 22 is exposed on the side surface of the element layer 11 as illustrated in FIGS. 3A to 3C and FIGS. 4A and 4B can be formed.

Figure 5E:
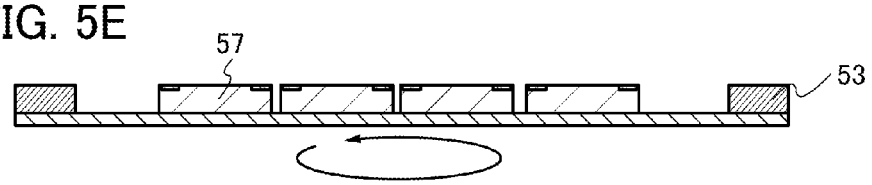

After that, the element layer 11 is dried. Here, the frame body 53 is rotated as illustrated in FIG. 5E, and the cutting water attached to the element layer 11 and chippings generated in cutting the element substrate 51 are removed. Note that when the frame body 53 is rotated and nitrogen, dry air, or the like is blown to the element layer 11, the cutting water and chippings can be efficiently removed.

To neutralize static electricity generated in the element layer 11, the frame body 53, and the adhesive sheet 54 by friction caused in the step of drying the element layer 11, it is preferred that positive ions and negative ions be blown to the element layer 11, the frame body 53, and the adhesive sheet 54 with the use of a static electricity remover.

Figure 5F:
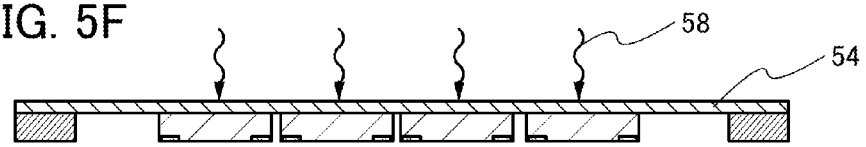
Figure 5G:
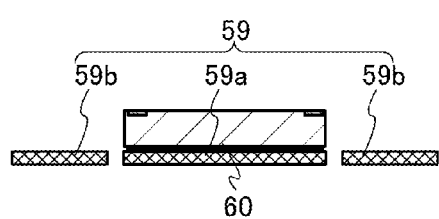

Then, the adhesion of the adhesive sheet is decreased. Here, the adhesive sheet 54 is irradiated with UV light 58 as illustrated in FIG. 5F to decrease the adhesion of the adhesive sheet. The steps illustrated in FIGS. 5A to 5F are collectively referred to as a dicing process.

Next, a lead frame 59 including a die pad 59a and an external electrode 59b is prepared. Then, a conductive paste 60 is applied to the die pad 59a of the lead frame 59. After the element layer 11 over the adhesive sheet 54 is taken out by vacuum suction, the element layer 11 is bonded to the conductive paste 60. Subsequently, heat treatment is performed at 150° C. to 300° C. inclusive, whereby the conductive paste is baked and the element layer 11 is firmly attached to the die pad 59a (see FIG. 5G). These steps are collectively referred to as a die bonding process.

Then, the conductive film 15 provided over a surface of the element layer 11 is connected to the external electrode 59b of the lead frame 59 with the use of the conductive member 16. As the conductive member 16, a wire is used here. The step of connecting the element layer 11 and the external electrode 59*b* of the lead frame 59 with the use of a wire as the conductive member 16 is referred to as a wire bonding step.

Note that the conductive member 16 may be provided in the element layer 11 with the use of a spherical solder as the conductive member 16 instead of a wire. In that case, the terminal 12 is unnecessary and the conductive member 16 serves as a terminal in the semiconductor device.

After that, the element layer 11, the conductive member 16, and part of the lead frame 59 are sealed with an organic resin layer or the like. Through this step, the element layer 11 and the conductive member 16 can be prevented from being contaminated by moisture, a contaminant, or the like. The step is referred to as a mold sealing step.

Then, the external electrode 59*b* of the lead frame 59 is plated, so that oxidation of the external electrode 59*b* is prevented and soldering for mounting the external electrode 59*b* on a printed circuit board can be more reliably performed.

Figure 5H:
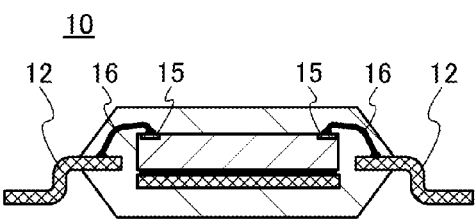

The semiconductor device is separated by cutting the lead frame 59 as illustrated in FIG. 5H. This step is referred to as a lead processing step. Then, the external electrode 59*b* is processed into a shape that facilitates mounting, so that the terminal 12 is formed. For example, the external electrode 59*b* may be bent to form an L-shaped or J-shaped terminal. This step is referred to as a forming step.

Through the above steps, the semiconductor device 10 can be fabricated.

In this embodiment, one embodiment of the present invention has been described. Other embodiments of the present invention will be described in the other embodiments. Note that one embodiment of the present invention is not limited to the above. Although the examples where any of the protective films 34, 35, and 36, the sealing region 22, and the like is provided are described as embodiments of the present invention, one embodiment of the present invention is not limited thereto. Depending on circumstances, any of the protective films 34, 35, and 36, the sealing region 22, and the like is not necessarily provided in one embodiment of the present invention.

The sealing region 22 may be partly divided instead of having a closed-loop shape.

Although the example where channels or the like of the transistors 32 and 33 include oxide semiconductor films is described as one embodiment of the present invention, one embodiment of the present invention is not limited to this example. Depending on circumstances, an oxide semiconductor is not necessarily provided in a channel or the like of a transistor in one embodiment of the present invention. For example, depending on circumstances, a material containing silicon (Si), germanium (Ge), silicon germanium (SiGe), gallium arsenide (GaAs), or the like may be used for a channel, the vicinity of the channel, a source region, a drain region, or the like.

The structures, methods, and the like described in this embodiment can be used in combination with any of the structures, methods, and the like described in the other embodiments, as appropriate. The structure described in this embodiment can be used in combination with any of the structures described in the other embodiments, as appropriate.

Embodiment 2

In this embodiment, the structures of element layers included in semiconductor devices will be described with reference to FIGS. 6A to 20. In this embodiment, an example of a semiconductor device (memory device) that can hold stored data even when not supplied with power and does not have a limit on the number of times of writing will be described with reference to drawings.

<Semiconductor Device Structure 1>

Figure 6A:
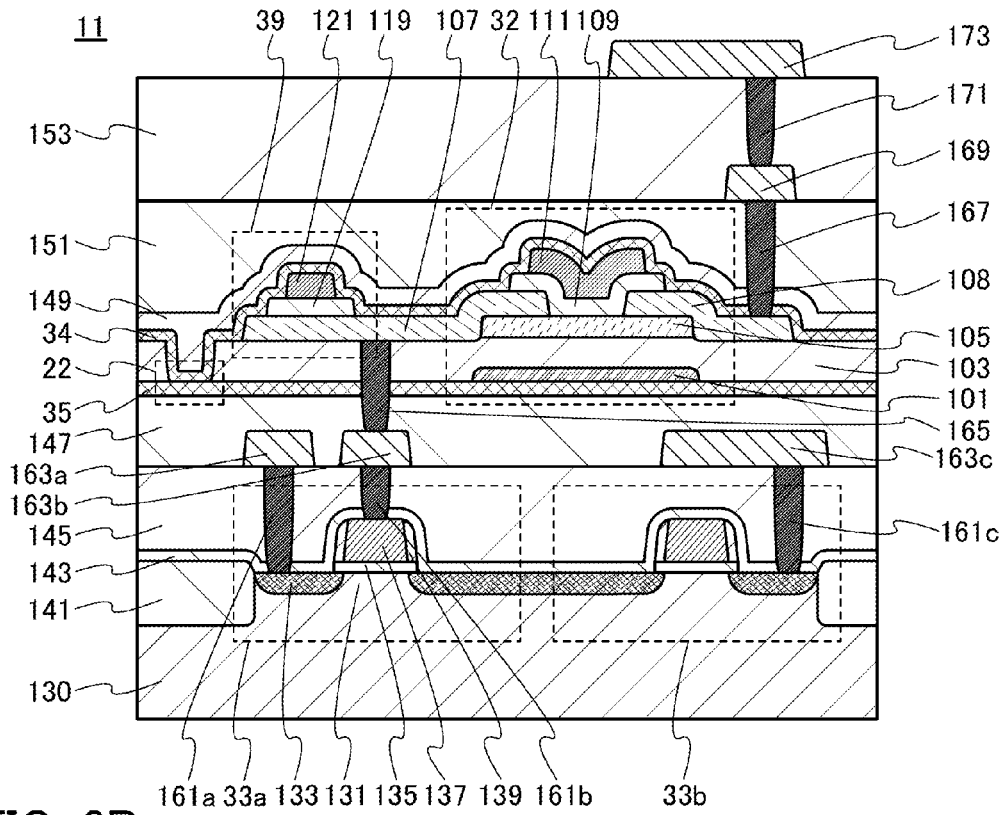
FIGS. 6A and 6B illustrate embodiments of semiconductor devices.
Figure 6B:
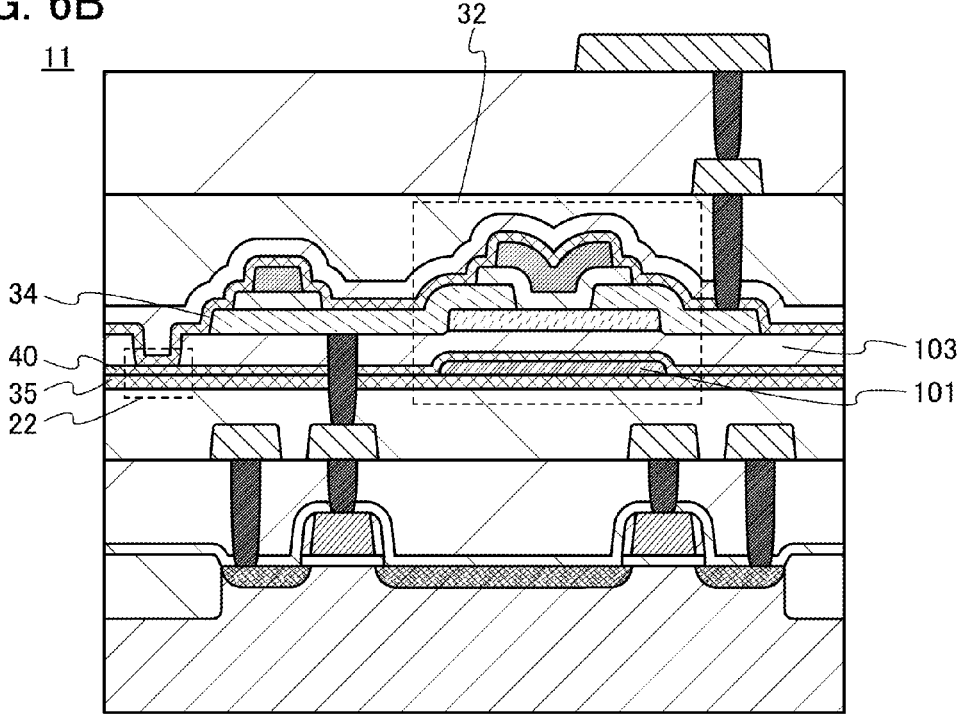

FIGS. 6A and 6B are schematic cross-sectional views illustrating the vicinity of a side surface of an element layer included in a semiconductor device.

As illustrated in FIG. 6A, the element layer 11 includes the transistor 32 and a capacitor 39 in an upper portion, and includes a transistor 33*a* and a transistor 33*b* in a lower portion. The transistor 32 and the capacitor 39 are electrically connected to the transistor 33*a* through conductive films 161*b* and 165 each serving as a plug and a conductive film 163*b* serving as a wiring.

The element layer 11 also includes the protective film 34 that is in contact with the transistor 32, and the protective film 35 that is between the transistor 32 and the transistors 33*a* and 33*b*. The protective film 34 is in contact with the transistor 32 and formed in an opening in an insulating film provided between the protective films 34 and 35. Note that the insulating film provided between the protective films 34 and 35 is, but is not limited to, the insulating film 103.

The sealing region 22 is provided between the transistor 32 and the side surface of the element layer 11. In the sealing region 22, the protective film 34 and the protective film 35 are in contact with each other in an opening in the insulating film 103. The transistor 32 included in the element layer 11 is surrounded by the protective films 34 and 35.

First, the transistor 32 included in the element layer 11 will be described.

The transistor 32 includes a conductive film 101 serving as a gate electrode; an insulating film 103 serving as a gate insulating film; an oxide semiconductor film 105; conductive films 107 and 108 serving as source and drain electrodes; an insulating film 109 serving as a gate insulating film; and a conductive film 111 serving as a gate electrode.

The conductive film 101 is provided over the protective film 35. The insulating film 103 is provided over the protective film 35 and the conductive film 101. The oxide semiconductor film 105 is provided over the insulating film 103. The conductive films 107 and 108 are in contact with at least the top surface and a side surface of the oxide semiconductor film 105 or only a side surface of the oxide semiconductor film 105. The insulating film 109 is provided over the oxide semiconductor film 105 and the conductive films 107 and 108. The conductive film 111 overlaps with the oxide semiconductor film 105 with the insulating film 109 therebetween.

The transistor 32 includes two gate electrodes. One of them has a function of controlling on/off of the transistor 32. The other has a function of controlling the threshold voltage of the transistor 32. By applying a voltage that makes the threshold voltage of the transistor 32 positive to the one gate electrode, the transistor 32 can be normally off.

The conductive film 101 has a function of controlling the threshold voltage of the transistor 32. The conductive film 101 can be formed using a metal element selected from aluminum, chromium, copper, tantalum, titanium, molybdenum, manganese, and tungsten; an alloy containing any of these metal elements as a component; an alloy containing any of these metal elements in combination; or the like. Furthermore, at least one metal element selected from manganese and zirconium may be used. The conductive film 101 may have a single-layer structure or a layered structure of two or more layers. Examples of the structure of the conductive film 101 include a single-layer structure of an aluminum film containing silicon, a single-layer structure of a copper film containing manganese, a two-layer structure in which a titanium film is stacked over an aluminum film, a two-layer structure in which a copper film is stacked over a copper-magnesium alloy film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and a three-layer structure in which a copper-magnesium alloy film, a copper film, and a copper-magnesium alloy film are stacked in this order. Alternatively, an alloy film or a nitride film that contains aluminum and one or more elements selected from titanium, tantalum, tungsten, molybdenum, chromium, neodymium, and scandium may be used.

Alternatively, the conductive film 101 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. Alternatively, the conductive film 101 can have a layered structure formed using the above light-transmitting conductive material and the above metal element.

Note that it is preferred that the element(s) contained in the conductive film 101 not be diffused into the insulating film 103. For example, when an alloy film that contains one or more elements selected from tungsten, tantalum, molybdenum, copper, titanium, and aluminum, an alloy film to which a small amount of element is added, or the like is used as the conductive film 101, it is hard for the element(s) contained in the conductive film 101 to be diffused into the insulating film 103.

As the conductive film 101, an In—Ga—Zn oxynitride film, an In—Sn oxynitride film, an In—Ga oxynitride film, an In—Zn oxynitride film, a metal oxynitride film (of SnON, InON, or the like), a metal nitride film (of InN, ZnN, or the like), or the like may be provided. For example, in the case of using an In—Ga—Zn oxynitride film, an In—Ga—Zn oxynitride film whose nitrogen concentration is at least higher than the nitrogen concentration of the oxide semiconductor film 105, specifically, an In—Ga—Zn oxynitride film whose nitrogen concentration is higher than or equal to 7 at. % is used. In the case of forming the conductive film 101 using any of the above-described metal oxynitride films or the metal nitride films, it is preferred that a protective film that prevents diffusion of metal, oxygen, or nitrogen be formed over the conductive film 101. Examples of the protective film include an alloy film containing one or more elements selected from tungsten, tantalum, molybdenum, copper, titanium, and aluminum and an alloy film to which a small amount of element is added.

The insulating film 103 can be formed to have a single-layer structure or a layered structure using, for example, any of silicon oxide, silicon oxynitride, silicon nitride oxide, silicon nitride, aluminum oxide, hafnium oxide, gallium oxide, and Ga—Zn metal oxide.

The insulating film 103 is preferably a film with a small number of defects or a small number of impurities in order to reduce a shift in the electric characteristics of the transistor such as the threshold voltage.

An oxide insulating film that releases oxygen by being heated is preferably used as the insulating film 103, in which case oxygen contained in the insulating film 103 can be moved to the oxide semiconductor film 105 by heat treatment. Consequently, oxygen vacancies in the oxide semiconductor film 105 can be reduced, so that the transistor 32 can have high reliability.

The use of a protective film as the insulating film 103 can prevent hydrogen entry from the outside to into the oxide semiconductor film 105.

The insulating film 103 may be formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, yttrium oxide, or aluminum oxide, in which case a gate leakage current of the transistor can be reduced.

The thickness of the insulating film 103 is greater than or equal to 5 nm and less than or equal to 400 nm, greater than or equal to 5 nm and less than or equal to 300 nm, or greater than or equal to 10 nm and less than or equal to 50 nm. By reducing the thickness of the insulating film 103, the voltage applied to the conductive film 101 can be lowered, so that power consumption of the semiconductor device can be reduced.

As the oxide semiconductor film 105, an oxide semiconductor film containing In or Ga can be used. Typical examples include an In—Ga oxide film, an In—Zn oxide film, an In—Mg oxide film, a Zn—Mg oxide film, and an In-M-Zn oxide film (M is Al, Ti, Ga, Y, Zr, Sn, La, Ce, Mg, or Nd).

In the case of using an In-M-Zn oxide film as the oxide semiconductor film 105, when Zn and O are eliminated from consideration, the proportion of In and the proportion of M are preferably greater than or equal to 25 at. % and less than 75 at. %, respectively, more preferably greater than or equal to 34 at. % and less than 66 at. %, respectively.

The indium and gallium contents in the oxide semiconductor film 105 can be compared with each other by time-of-flight secondary ion mass spectrometry (TOF-SIMS), X-ray photoelectron spectrometry (XPS), or inductively coupled plasma mass spectrometry (ICP-MS).

Since the oxide semiconductor film 105 has an energy gap of 2 eV or more, preferably 2.5 eV or more, more preferably 3 eV or more, the off-state current of the transistor 32 can be low.

The thickness of the oxide semiconductor film 105 is greater than or equal to 3 nm and less than or equal to 200 nm, preferably greater than or equal to 3 nm and less than or equal to 100 nm, more preferably greater than or equal to 3 nm and less than or equal to 50 nm.

Hydrogen contained in the oxide semiconductor film 105 reacts with oxygen bonded to a metal atom to be water, and in addition, an oxygen vacancy is formed in a lattice from which oxygen is released (or a portion from which oxygen is released). Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor including an oxide semiconductor that contains hydrogen is likely to be normally on.

Accordingly, hydrogen in the oxide semiconductor film 105 is preferably reduced as much as possible as well as the oxygen vacancies in the oxide semiconductor film 105. Specifically, in the oxide semiconductor film 105, the hydrogen concentration measured by secondary ion mass spectrometry (SIMS) is set to lower than or equal to $5 \times 10^{19}$ atoms/cm$^3$, lower than or equal to $1 \times 10^{19}$ atoms/cm$^3$, lower than or equal to $5 \times 10^{18}$ atoms/cm$^3$, lower than or equal to $1\times10^{18}$ atoms/cm$^3$, lower than or equal to $5\times10^{17}$ atoms/cm$^3$, or lower than or equal to $1\times10^{16}$ atoms/cm$^3$. In that case, the transistor 32 has a positive threshold voltage (normally-off characteristics).

Note that the impurity concentration in the oxide semiconductor film 105 can be measured by secondary ion mass spectrometry (SIMS).

When silicon or carbon which is one of elements belonging to Group 14 is contained in the oxide semiconductor film 105, oxygen vacancies are increased and an n-type region is formed. Thus, the concentration of silicon or carbon (the concentration is measured by SIMS) in the oxide semiconductor film 105 is lower than or equal to $2\times10^{18}$ atoms/cm$^3$, preferably lower than or equal to $2\times10^{17}$ atoms/cm$^3$. In that case, the transistor 32 has a positive threshold voltage (normally-off characteristics).

Furthermore, the concentration of alkali metals or alkaline earth metals in the oxide semiconductor film 105, which is measured by SIMS, is lower than or equal to $1\times10^{18}$ atoms/cm$^3$, preferably lower than or equal to $2\times10^{16}$ atoms/cm$^3$. Alkali metal and alkaline earth metal might generate carriers when bonded to an oxide semiconductor, in which case the off-state current of the transistor might be increased. Therefore, it is preferred that the concentration of alkali metal or alkaline earth metal of the oxide semiconductor film 105 be reduced. In that case, the transistor 32 has a positive threshold voltage (normally-off characteristics).

Furthermore, when nitrogen is contained in the oxide semiconductor film 105, an n-type region is formed by generation of electrons serving as carriers and an increase of carrier density. Thus, a transistor including an oxide semiconductor that contains nitrogen is likely to be normally on. For this reason, nitrogen in the oxide semiconductor film is preferably reduced as much as possible; the concentration of nitrogen measured by SIMS is preferably set to, for example, lower than or equal to $5\times10^{18}$ atoms/cm$^3$.

Reducing impurities in the oxide semiconductor film 105 can decrease the carrier density in the oxide semiconductor film. The oxide semiconductor film 105 preferably has a carrier density of $1\times10^{17}$/cm$^3$ or less, more preferably $1\times10^{15}$/cm$^3$ or less, still more preferably $1\times10^{13}$/cm$^3$ or less, yet still more preferably $1\times10^{11}$/cm$^3$ or less.

Note that it is preferable to use, as the oxide semiconductor film 105, an oxide semiconductor film in which the impurity concentration is low and the density of defect states is low, in which case the transistor can have more excellent electric characteristics. Here, the state in which the impurity concentration is low and the density of defect states is low (the number of oxygen vacancies is small) is referred to as "highly purified intrinsic" or "substantially highly purified intrinsic". A highly purified intrinsic or substantially highly purified intrinsic oxide semiconductor has few carrier generation sources and thus has a low carrier density in some cases. Therefore, a transistor including the oxide semiconductor film in which a channel region is formed rarely has a negative threshold voltage (is rarely normally-on). A highly purified intrinsic or substantially highly purified intrinsic oxide semiconductor film has a low density of defect states and accordingly has few carrier traps in some cases. Furthermore, a highly purified intrinsic or substantially highly purified intrinsic oxide semiconductor film has an extremely low off-state current; the off-state current can be less than or equal to the measurement limit of a semiconductor parameter analyzer, i.e., less than or equal to $1\times10^{-13}$ A, at a voltage (drain voltage) between a source electrode and a drain electrode of from 1 V to 10 V. Thus, the transistor whose channel region is formed in the oxide semiconductor film has a small variation in electric characteristics and high reliability in some cases.

A structure of the oxide semiconductor film will be described below.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film will be described.

The CAAC-OS film is one of oxide semiconductor films having a plurality of c-axis aligned crystal parts.

With a transmission electron microscope (TEM), a combined analysis image (also referred to as a high-resolution TEM image) of a bright-field image and a diffraction pattern of the CAAC-OS film is observed. Consequently, a plurality of crystal parts are observed clearly. However, in the high-resolution TEM image, a boundary between crystal parts, that is, a grain boundary is not clearly observed. Thus, in the CAAC-OS film, a reduction in electron mobility due to the grain boundary is less likely to occur.

In the high-resolution cross-sectional TEM image of the CAAC-OS film observed in the direction substantially parallel to the sample surface, metal atoms are arranged in a layered manner in the crystal parts. Each metal atom layer reflects unevenness of a surface over which the CAAC-OS film is formed (hereinafter, a surface over which the CAAC-OS film is formed is referred to as a formation surface) or the top surface of the CAAC-OS film, and is arranged parallel to the formation surface or the top surface of the CAAC-OS film.

On the other hand, in the plan high-resolution TEM image of the CAAC-OS film observed in the direction substantially perpendicular to the sample surface, metal atoms are arranged in a triangular or hexagonal arrangement in the crystal parts. However, there is no regularity of arrangement of metal atoms between different crystal parts.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in the direction substantially perpendicular to the formation surface or the top surface of the CAAC-OS film.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferred that in the CAAC-OS film, a peak of 2θ appear at around 31° and a peak of 2θ not appear at around 36°.

The CAAC-OS film is an oxide semiconductor film having a low impurity concentration. The impurity is an element other than the main components of the oxide semiconductor film, such as hydrogen, carbon, silicon, and a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, heavy metals such as iron and nickel, argon, carbon dioxide, and the like each have a large atomic radius (molecular radius), and thus disturb the atomic arrangement of the oxide semiconductor film and causes a decrease in crystallinity when any of them is contained in the oxide semiconductor film. Note that the impurity contained in the oxide semiconductor film might serve as a carrier trap or a carrier generation source.

Further, the CAAC-OS film is an oxide semiconductor film having a low density of defect states. For example, oxygen vacancies in the oxide semiconductor film serve as carrier traps or serve as carrier generation sources in some cases when hydrogen is captured therein.

The state in which the impurity concentration is low and the density of defect states is low (the number of oxygen vacancies is small) is referred to as a highly purified intrinsic state or a substantially highly purified intrinsic state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has small variations in electric characteristics and high reliability. Electric charge trapped by the carrier traps in the oxide semiconductor film takes a long time to be released, and might behave like fixed electric charge. Thus, a transistor including an oxide semiconductor film having a high impurity concentration and a high density of defect states has unstable electric characteristics in some cases.

In a transistor using the CAAC-OS film, a change in electric characteristics due to irradiation with visible light or ultraviolet light is small.

Next, a microcrystalline oxide semiconductor film will be described.

A microcrystalline oxide semiconductor film includes a region where a crystal part is observed in a high resolution TEM image and a region where a crystal part is not clearly observed in a high resolution TEM image. In most cases, the size of a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm or a size greater than or equal to 1 nm and less than or equal to 3 nm is specifically referred to as nanocrystal (nc). An oxide semiconductor film including a nanocrystal is referred to as a nanocrystalline oxide semiconductor (nc-OS) film. In a high resolution TEM image, a crystal grain boundary cannot be found clearly in the nc-OS film in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Further, there is no regularity of crystal orientation between different crystal parts in the nc-OS film; thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than a crystal part, a peak which shows a crystal plane does not appear. Further, a halo pattern is shown in a selected-area electron diffraction pattern of the nc-OS film which is obtained by using an electron beam having a probe diameter (e.g., larger than or equal to 50 nm) larger than the diameter of a crystal part. In contrast, spots are shown in a nanobeam electron diffraction pattern of the nc-OS film which is obtained by using an electron beam having a probe diameter close to, or smaller than or equal to the diameter of a crystal part. Further, in a nanobeam electron diffraction pattern of the nc-OS film, regions with high luminance in a circular (ring) pattern are shown in some cases. Also in a nanobeam electron diffraction pattern of the nc-OS film, a plurality of spots are shown in a ring-like region in some cases.

The nc-OS film is an oxide semiconductor film that has higher regularity than an amorphous oxide semiconductor film. Therefore, the nc-OS film has a lower density of defect states than an amorphous oxide semiconductor film. Note that there is no regularity of crystal orientation between different crystal parts in the nc-OS film; hence, the nc-OS film has a higher density of defect states than the CAAC-OS film.

Next, an amorphous oxide semiconductor film will be described.

The amorphous oxide semiconductor film has disordered atomic arrangement and no crystal part. For example, the amorphous oxide semiconductor film does not have a specific state as in quartz.

In the high-resolution TEM image of the amorphous oxide semiconductor film, crystal parts cannot be found.

When the amorphous oxide semiconductor film is subjected to structural analysis by an out-of-plane method with an XRD apparatus, a peak that shows a crystal plane does not appear. A halo pattern is shown in an electron diffraction pattern of the amorphous oxide semiconductor film. Furthermore, a halo pattern is shown but a spot is not shown in a nanobeam electron diffraction pattern of the amorphous oxide semiconductor film.

Note that an oxide semiconductor film may have a structure having physical properties between the nc-OS film and the amorphous oxide semiconductor film. The oxide semiconductor film having such a structure is specifically referred to as an amorphous-like oxide semiconductor (amorphous-like OS) film.

In a high-resolution TEM image of the amorphous-like OS film, a void may be seen. Furthermore, in the high-resolution TEM image, there are a region where a crystal part is clearly observed and a region where a crystal part is not observed. In the amorphous-like OS film, crystallization by a slight amount of electron beam used for TEM observation occurs and growth of the crystal part is found in some cases. In contrast, crystallization by a slight amount of electron beam used for TEM observation is less observed in the nc-OS film having good quality.

Note that the crystal part size in the amorphous-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers of three In—O layers and six Ga—Zn—O layers are layered in the c-axis direction. Accordingly, the spacing between these adjacent layers is equivalent to the lattice spacing on the (009) plane (also referred to as d value). The value is calculated to be 0.29 nm from crystal structure analysis. Thus, attention is focused on lattice fringes in the high-resolution TEM image.

Each of lattice fringes in which the lattice spacing therebetween is greater than or equal to 0.28 nm and less than or equal to 0.30 nm corresponds to the a-b plane of the InGaZnO$_4$ crystal.

Note that an oxide semiconductor film may be a layered film including two or more of an amorphous oxide semiconductor film, an amorphous-like OS film, a microcrystalline oxide semiconductor film, and a CAAC-OS film, for example.

The conductive films 107 and 108 are each formed to have a single-layer structure or a layered structure including, as a conductive material, any of metals such as aluminum, titanium, chromium, nickel, copper, yttrium, zirconium, molybdenum, silver, tantalum, manganese, and tungsten and an alloy containing any of these metals as a main component. For example, a single-layer structure of an aluminum film containing silicon, a single-layer structure of a copper film containing manganese, a two-layer structure in which a titanium film is stacked over an aluminum film, a two-layer structure in which a titanium film is stacked over a tungsten film, a two-layer structure in which a copper film is stacked over a copper-magnesium alloy film, a two-layer structure in which a copper film is stacked over a copper-magnesium-aluminum alloy film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, a three-layer structure in which a copper-magnesium alloy film, a copper film, and a copper-magnesium alloy film are stacked in this order, and the like can be given. Note that a transparent conductive material containing indium oxide, tin oxide, or zinc oxide may be used.

Note that in the oxide semiconductor film 105, a channel formation region refers to a region that overlaps with the conductive films 101 and 111 and is located between the conductive films 107 and 108. Furthermore, a channel region refers to a region through which a current mainly flows in the channel formation region. Here, a channel region is part of the oxide semiconductor film 105, which is positioned between the conductive films 107 and 108. A channel length refers to the distance between the conductive films 107 and 108.

For the conductive films 107 and 108, it is preferred that a conductive material that is easily bonded to oxygen, such as tungsten, titanium, aluminum, copper, molybdenum, chromium, or tantalum, or an alloy thereof, be used. Tungsten or titanium with a relatively high melting point is preferably used, which allows subsequent process temperatures to be relatively high. Note that the conductive material that is easily bonded to oxygen includes, in its category, a material into which oxygen is easily diffused. As a result, oxygen contained in the oxide semiconductor film 105 is bonded to the conductive material contained in the conductive films 107 and 108, so that an oxygen vacancy region is formed in the oxide semiconductor film 105. Furthermore, in some cases, part of constituent elements of the conductive material that is contained in the conductive films 107 and 108 is mixed into the oxide semiconductor film 105. In that case, n-type regions (low resistance regions) are formed in regions in contact with the conductive films 107 and 108 at least in the oxide semiconductor film 105. The n-type regions (low resistance regions) function as a source region and a drain region.

A region having a high oxygen concentration may be formed in part of the conductive films 107 and 108 in contact with the low resistance regions. Constituent elements of the oxide semiconductor film 105 enter the conductive films 107 and 108 in contact with the low resistance regions in some cases. In other words, in the vicinities of the interfaces between the oxide semiconductor film 105 and the conductive films 107 and 108, regions that can be called mixed regions or mixed layers of these two layers are formed in some cases.

Since the n-type regions (low resistance regions) have high conductivity, contact resistance between the oxide semiconductor film 105 and the conductive films 107 and 108 can be reduced, and thus, the on-state current of the transistor can be increased.

The insulating film 109 can be formed using any of the materials for the insulating film 103 as appropriate.

The conductive film 111 can be formed using any of the materials for the conductive film 101.

Next, the capacitor 39 will be described.

The capacitor 39 includes the conductive film 107, the insulating film 119, and a conductive film 121.

The conductive film 107 serves as a source or drain electrode of the transistor 32. Thus, the capacitor 39 is electrically connected to the source or drain electrode of the transistor 32.

The insulating film 119 is formed at the same time as the insulating film 109 serving as a gate insulating film of the transistor 32.

The conductive film 121 is formed at the same time as the conductive film 111 serving as a gate electrode of the transistor 32.

The capacitor 39 is formed at the same time as the transistor 32, which can reduce the number of fabricating steps.

Next, the transistors 33*a* and 33*b* will be described. Specifically, only the transistor 33*a* will be described because the transistors 33*a* and 33*b* have the same structure.

In the transistor 33*a*, a channel region is formed in the substrate 130. Furthermore, the transistor 33*a* includes a channel region 131, a p-type impurity region 133, an insulating film 135 serving as a gate insulating film, and a conductive film 137 serving as a gate electrode. Side surfaces of the conductive film 137 are provided with side wall insulating films 139. The p-type impurity region 133 serves as a lightly doped drain (LDD) region, an extension region, and a source or drain region. In the p-type impurity region 133, a region not overlapping with the side wall insulating film 139 has a higher impurity concentration than a region overlapping with the side wall insulating film 139.

Any of the semiconductor substrates that can be used to form the transistor 33 described in Embodiment 1 can be used as the substrate 130, as appropriate. Here, a p-type single crystal silicon substrate is used as the substrate 130.

Note that the p-type impurity region 133, the insulating film 135, the conductive film 137, and the side wall insulating film 139 that are included in the transistor 33*a* can be formed using any of known materials for an insulating film and a conductive film in a metal-oxide-semiconductor field-effect transistor (MOSFET) as appropriate.

Next, the insulating films and the conductive films located between the transistor 33*a* and the transistor 33*b* and the transistor 32 and the capacitor 39 will be described.

An insulating film 141 serving as an element isolation region is formed over the substrate 130. The insulating film 141 isolates the transistors 33*a* and 33*b* from other transistors formed over the substrate 130. An insulating film 143 is formed over the p-type impurity region 133, the conductive film 137, the side wall insulating film 139, and the insulating film 141, and an insulating film 145 is formed over the insulating film 143.

Conductive films 161a, 161b, and 161c each serving as a plug are formed in openings in the insulating films 143 and 145. The conductive film 161a is connected to the p-type impurity region 133 in the transistor 33a. The conductive film 161b is connected to the conductive film 137 in the transistor 33a. The conductive film 161c is connected to a p-type impurity region in the transistor 33b.

Conductive films 163a, 163b, and 163c each serving as a wiring are formed over the insulating film 145 and the conductive films 161a, 161b, and 161c. The conductive film 163a is connected to the conductive film 161a. The conductive film 163b is connected to the conductive film 161b. The conductive film 163c is connected to the conductive film 161c.

An insulating film 147 is formed over the insulating film 145 and the conductive films 163a, 163b, and 163c. The protective film 35 is formed over the insulating film 147. The transistor 32 is formed over the protective film 35.

Specifically, the conductive film 101 and the insulating film 103 that are included in the transistor 32 are formed over the protective film 35.

A conductive film 165 serving as a plug is formed in an opening in the insulating films 103 and 147 and the protective film 35. The conductive film 165 is connected to the conductive film 163b and the conductive film 107 in the transistor 32.

An insulating film 149 is formed over the protective film 34 that is formed over the transistor 32 and the capacitor 39. An insulating film 151 is formed over the insulating film 149.

A conductive film 167 serving as a plug is formed in an opening in the insulating film 149, the insulating film 151, and the insulating film 34. The conductive film 167 is connected to the conductive film 108 in the transistor 32.

A conductive film 169 serving as a wiring is formed over the insulating film 151 and the conductive film 167. The conductive film 169 is connected to the conductive film 167.

An insulating film 153 is formed over the insulating film 151 and the conductive film 169.

A conductive film 171 serving as a plug is formed in an opening in the insulating film 153. The conductive film 171 is connected to the conductive film 169.

A conductive film 173 serving as an electrode pad is formed over the insulating film 153 and the conductive film 171. The conductive film 173 is connected to the conductive film 171.

The insulating film 143 is preferably an insulating film that contains hydrogen and releases hydrogen by heating. Specifically, the number of hydrogen molecules released from the insulating film is preferably greater than or equal to $5.0 \times 10^{23}$ molecules/cm$^3$ when measured by thermal desorption spectroscopy (hereinafter referred to as TDS) performed at a film surface temperature of 100° C. to 700° C. inclusive or 100° C. to 500° C. inclusive. Furthermore, the hydrogen concentration of the insulating film is preferably higher than or equal to 20 at % and lower than or equal to 25 at % when measured by Rutherford backscattering spectrometry. Examples of the insulating film include a silicon nitride film and a silicon nitride oxide film.

Here, the transistors 33a and 33b are formed using a p-type single crystal silicon substrate. To achieve excellent electric characteristics of the transistor 33a and 33b, hydrogenation treatment is preferably performed in the forming process of the transistor 33a and 33b so that least defects (dangling bonds) included in the single crystal silicon substrate including the channel region are repaired (terminated with hydrogen). When an insulating film that releases hydrogen by heating is formed as the insulating film 143, hydrogenation treatment can be performed on the single crystal silicon substrate with the use of hydrogen released from the insulating film 143.

Hydrogen in the transistor 32 including an oxide semiconductor film, however, might decrease the reliability of the transistor. Therefore, the protective film 35 is preferably provided between the transistor 32 and the transistors 33a and 33b. In that case, hydrogen contained in the insulating film 143 can be prevented from being diffused into the transistor 32 in heat treatment, leading to suppression of a decrease in the reliability of the transistor 32 and improvement of the electric characteristics of the transistors 33a and 33b. The transistor 32 includes the sealing region 22, in which the protective film 34 and the protective film 35 are in contact with each other, in the vicinity of an end portion of the element layer 11. The transistor 32 is surrounded by the protective films 34 and 35. This can reduce the amount of hydrogen diffusion from the insulating film 143 and the outside into the transistor 32, preventing a decrease in the reliability of transistor 32.

The insulating films 145, 147, 149, 151, and 153 can each be formed using a heat-resistant organic material such as polyimide, acrylic, a benzocyclobutene-based resin, polyamide, or epoxy. Other than the above organic materials, silicon oxide to which carbon is added (SiOC), silicon oxide to which fluorine is added (SiOF), tetraethylorthosilicate (TEOS), which is silicon oxide made from Si(OC$_2$H$_5$)$_4$, a low-dielectric constant material (low-k material), a siloxane-based resin, phosphosilicate glass (PSG), borophosphosilicate glass (BPSG), or the like can be used.

Note that the insulating films 145, 147, 149, 151, and 153 may each be formed by stacking a plurality of insulating films formed using any of these materials.

Note that the siloxane-based resin corresponds to a resin including an Si—O—Si bond formed using a siloxane-based material as a starting material. The siloxane-based resin may contain as a substituent an organic group (e.g., an alkyl group or an aryl group) or a fluoro group. The organic group may contain a fluoro group.

The insulating films 145, 147, 149, 151, and 153 can be formed using a material similar to the material for the insulating film 103.

The conductive films 161a, 161b, 161c, 165, 167, and 171 serving as plugs are each formed to have a single-layer structure or a layered structure using, as a conductive material, any of metals such as aluminum, titanium, chromium, nickel, copper, yttrium, zirconium, molybdenum, silver, tantalum, and tungsten and an alloy containing any of these metals as a main component. For example, a single-layer structure of an aluminum film containing silicon, a two-layer structure in which a titanium film is stacked over an aluminum film, a two-layer structure in which a titanium film is stacked over a tungsten film, a two-layer structure in which a copper film is stacked over a copper-magnesium-aluminum alloy film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given.

The conductive films 161a, 161b, 161c, 165, 167, and 171 each preferably include a conductive film that suppresses diffusion of hydrogen, water, and the like. For example, the conductive films 161a, 161b, 161c, 165, 167, and 171 each preferably have a layered structure of a conductive film that suppresses diffusion of hydrogen, water, and the like and a conductive film. Examples of the conductive film that suppresses diffusion of hydrogen, water, and/or the like include a titanium film, a tantalum film, a titanium nitride film, a tantalum nitride film, and an $Ir_xTa_{1-x}$ (0<x<1) film.

The conductive films that suppress diffusion of water and the like are in contact with the protective films 34 and 35 in openings in the protective films 34 and 35, whereby hydrogen is not easily diffused from the openings in the protective film 34 and 35 into the transistor 32, which can prevent a decrease in the reliability of the transistor 32.

The conductive films 163a, 163b, 163c, and 169 each serving as a wiring are preferably formed using a low-resistance conductive material such as copper or aluminum. The use of a low-resistance conductive material can reduce a wiring delay of a signal that is transmitted through the conductive films 163a, 163b, 163c, and 169. In the case where copper is used for the conductive films 163a, 163b, 163c, and 169, the conductive films each preferably include a conductive film that suppress diffusion of water and the like to prevent copper from being diffused into channel regions in the transistors 32, 33a, and 33b. Examples of the conductive film that suppress diffusion of water and the like include, but are not limited to, a film using tantalum nitride, a stack of tantalum nitride and tantalum, titanium, a stack of titanium nitride and titanium, or the like.

The conductive film 173 serving as an electrode can be formed using aluminum, an alloy containing aluminum, gold, an alloy containing gold, copper, an alloy containing copper, or the like.

Here, a semiconductor material of region in which a channel region of the transistor 32 is formed and a semiconductor material of regions in which channel regions of the transistors 33a and 33b are formed preferably have different band gaps. For example, in the case where an oxide semiconductor is used as the semiconductor material of the region in which the channel region of the transistor 32 is formed, it is preferred that a semiconductor material other than an oxide semiconductor be used as the semiconductor material of the regions in which the channel regions of the transistors 33a and 33b are formed. A transistor including a semiconductor material other than an oxide semiconductor, such as crystalline silicon, can operate at high speed more easily than a transistor including an oxide semiconductor. In contrast, a transistor including an oxide semiconductor enables charge to be held for a long time owing to its electric characteristics, that is, the low off-state current.

For example, the transistors 33a and 33b in which regions where the channel regions are formed using a semiconductor substrates or a crystalline silicon film can operate at higher speed than the transistor 32 including an oxide semiconductor as a semiconductor material of a region where a channel region is formed. Thus, when the transistors 33a and 33b are used as reading transistors, data can be read at high speed.

Although the transistors 32 are described as n-channel transistors here, it is needless to say that p-channel transistors can be used. Although the transistors 33a and 33b are described as p-channel transistors here, it is needless to say that n-channel transistors can be used. Note that unless otherwise specified, the specific structure of the semiconductor device, such as a material used for the semiconductor device and the structure of the semiconductor device, needs not to be limited to that described here. For example, the structures of the insulating film, the conductive film serving as a wiring, and the conductive film serving as a plug that are provided between the transistor 32 and the transistors 33a and 33b can be changed as appropriate. Furthermore, the structures of the insulating film, the conductive film serving as a wiring, and the conductive film serving as a plug that are provided between the transistor 33 and the conductive film serving as an electrode pad can be changed as appropriate.

The transistor 32 is a transistor using an oxide semiconductor as a semiconductor material in a region in which a channel region is formed. Since the off-state current of the transistor 32 is low, stored data can be retained for a long period. That is to say, a memory device in which refresh operation is unnecessary or the frequency of refresh operation is extremely low can be provided, so that power consumption can be sufficiently reduced.

The transistor 32 and the capacitor 39 can be formed over the substrate 130 over which the transistors 33a and 33b are formed, as illustrated in FIG. 6A. That is to say, semiconductor elements can be three-dimensionally stacked, which can increase the integration degree of the semiconductor device.

Note that a protective film 40 that covers the protective film 35 and the conductive film 101 may be provided as illustrated in FIG. 6B. The protective film 34 and the protective film 40 are in contact with each other in an opening in the insulating film 103. In addition, the protective film 35 and the protective film 40 are in contact with each other.

The protective film 40 has a function of suppressing diffusion of hydrogen, water, and/or the like. Thus, the protective film 40 serves as a hydrogen barrier film and/or a water barrier film. When the protective film 40 is formed using an aluminum oxide film, an aluminum oxynitride film, a gallium oxide film, a gallium oxynitride film, a yttrium oxide film, a yttrium oxynitride film, a hafnium oxide film, a hafnium oxynitride film, or the like, oxygen contained in the insulating film 103 can be prevented from reacting with the conductive film 101. Thus, in the case where the insulating film 103 is formed using an oxide insulating film containing excess oxygen, oxygen contained in the insulating film 103 can be transferred to the oxide semiconductor film 105, reducing oxygen vacancies in the oxide semiconductor film 105.

Figure 7:
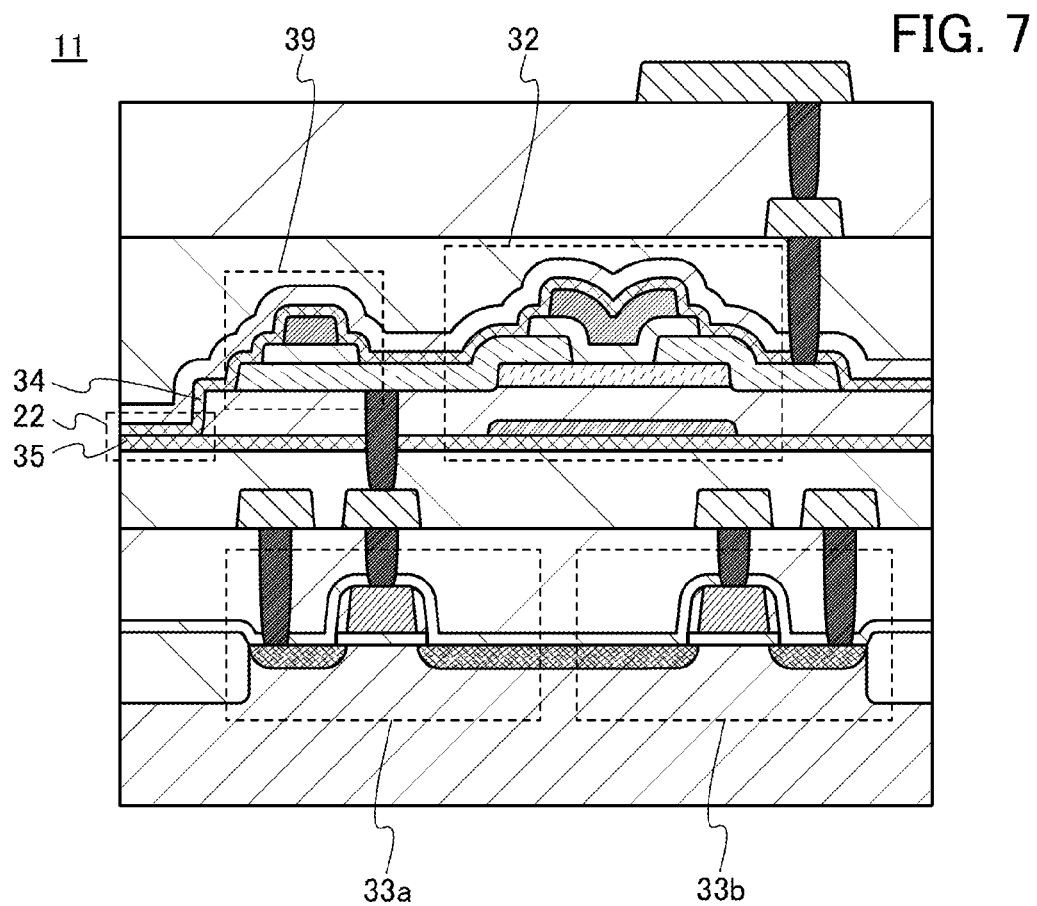
FIG. 7 illustrates one embodiment of a semiconductor device.

The edge of the sealing region 22 in which the protective film 34 and the protective film 35 are in contact with each other may be part of the side surface of the element layer 11 as illustrated in FIG. 7.

In the element layers in the semiconductor devices illustrated in FIGS. 6A and 6B and FIG. 7, the transistor 32 is surrounded by the protective film 34 and the protective film 35. Thus, the hydrogen diffusion amount from the outside into the transistor 32 can be reduced. Therefore, when the transistor 32 is a transistor including an oxide semiconductor film, changes in the electric characteristics of the transistor can be reduced, improving the reliability of the semiconductor device.

<Circuit Diagram of Memory Cell>

Figure 8A:
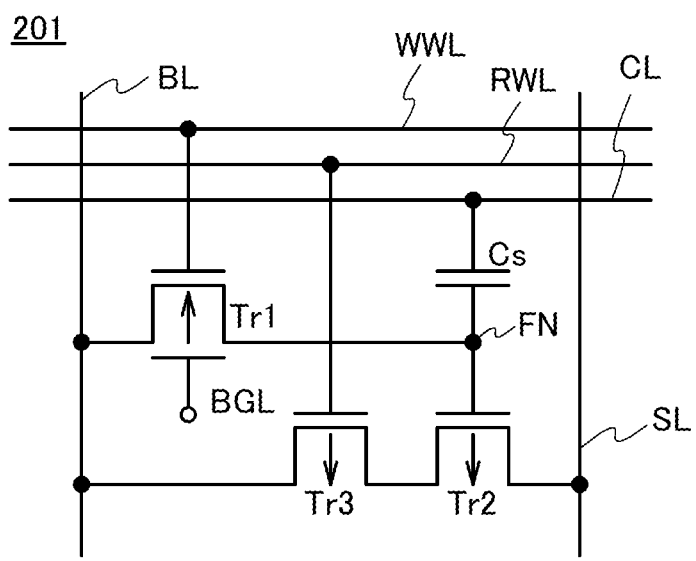
FIGS. 8A and 8B are circuit diagrams illustrating embodiments of semiconductor devices.

FIG. 8A is a circuit diagram of a memory cell 201 included in a semiconductor device described in this embodiment. The memory cell 201 includes a transistor Tr1, a transistor Tr2, a capacitor Cs, and a transistor Tr3.

The transistor Tr1 includes an oxide semiconductor film, and a channel region is formed in the oxide semiconductor film. Thus, the transistor Tr1 has an extremely low off-state current (extremely high off-state resistance). The transistor Tr1 is turned on when data is written, and accordingly is also referred to as a write transistor. The transistor Tr1 is either an n-channel transistor or a p-channel transistor. In the following description, the transistor Tr1 is an n-channel transistor.

The transistor Tr1 has a dual-gate structure, and one gate is electrically connected to a wiring WWL. The wiring WWL can serve as a write word line. The other gate is electrically connected to a wiring BGL. Note that the other gate may be always kept at a constant potential.

One of a source and a drain of the transistor Tr1 is electrically connected to a wiring BL. The wiring BL can serve as a bit line.

The other of the source and the drain of the transistor Tr1 is electrically connected to one electrode of the capacitor Cs. The other electrode of the capacitor Cs is electrically connected to a wiring CL. The other of the source and the drain of the transistor Tr1 is also electrically connected to a gate of the transistor Tr2.

When the potential of the wiring CL is changed, the potential of the gate of the transistor Tr2 (a node FN) is changed. The wiring CL is also referred to as a capacitor line.

The transistor Tr2 is a p-channel transistor. Any of various materials such as an oxide semiconductor and silicon can be used for a region in which a channel region of the transistor Tr2 is formed. One of a source and a drain of the transistor Tr2 is connected to one of a source and a drain of the transistor Tr3. The other of the source and the drain of the transistor Tr2 is electrically connected to a wiring SL.

The transistor Tr3 is a p-channel transistor. Any of various materials such as an oxide semiconductor and silicon can be used for a region in which a channel region of the transistor Tr3 is formed. The other of the source and the drain of the transistor Tr3 is electrically connected to the wiring BL. A gate of the transistor Tr3 is electrically connected to a wiring RWL. The transistor Tr3 is a transistor for electrically connecting the transistor Tr2 and the wiring BL when data is read, and is also referred to as a selection transistor.

The wiring SL can serve as a source line or a power supply line. Although the wiring SL is preferably retained at a constant potential, the potential may be changed when power is stopped or supplied.

In the memory cell 201 illustrated in FIG. 8A, data is retained as the potential of the node FN. If the transistor Tr1 has sufficiently high off-state resistance, data can be retained for a very long period. Theoretically, a data retention period is determined depending on total capacitance between the node FN and each of other nodes (including the capacitance of the capacitor Cs) and total resistance between the node FN and each of other nodes (including the off-state resistance of the transistor Tr1).

For example, when the capacitance is 30 fF and the resistance is $1 \times 10^{22} \Omega$, the time constant is 9.5 years. Accordingly, after ten years, the difference between the potential of the node FN and a reference potential becomes lowered to approximately 35% of the difference between the initial potential and the reference potential. A reading method by which data reading is correctly performed even in such a case where the potential is lowered is required.

Note that a transistor including an oxide semiconductor film has frequency characteristics equivalent to those of an n-channel transistor including a channel region in a semiconductor substrate. Thus, the memory cell 201 formed using the transistor Tr1 including an oxide semiconductor film and the p-channel transistors Tr2 and Tr3 whose channel regions are in a semiconductor substrate can operate at high speed. In addition, since the transistor Tr1 including the oxide semiconductor film can be stacked over the transistors Tr2 and Tr3, the transistors can be three-dimensionally positioned, leading to the fabrication of a highly integrated or small semiconductor device.

Figure 9:
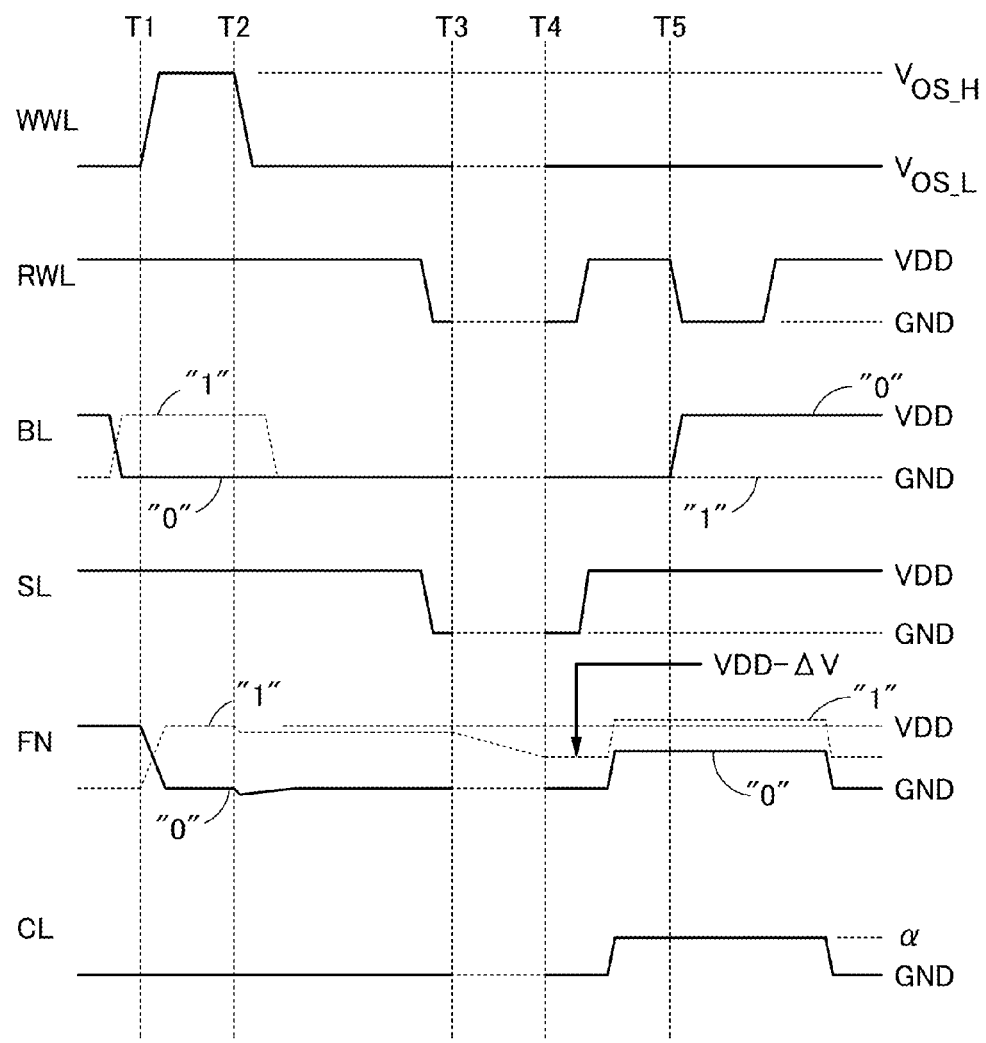
FIG. 9 shows a data write operation and a data read operation of a memory cell.

Operation for writing data to the memory cell 201 and operation for reading data from the memory cell 201 will be described below with reference to FIG. 9. The threshold values of the transistors Tr2 and Tr3 are each lower than 0 and higher than −VDD.

<Write Operation>

Data writing is performed by setting the potential of the wiring BL, which is a bit line, to the potential corresponding to the data when the transistor Tr1 is on. This method is basically the same as the method for data writing to DRAM. The transistor Tr1 is different from the transistors Tr2 and Tr3 in the threshold value or the like; thus, here, when the transistor Tr1 is turned on, the potential of its gate (the potential of the wiring WWL) is set to $V_{OS\_H}$, and when the transistor Tr1 is turned off, the potential of its gate is set to $V_{OS\_L}$. Note that $V_{OS\_L}$ may be equal to GND (<VDD).

Here, when data "0" is written, the potential of the wiring BL is set to GND, and when data "1" is written, the potential of the wiring BL is set to VDD. At Time T1 in FIG. 9, the potential of the wiring WWL starts to increase, so that the transistor Tr1 is turned on. As a result, the potential of the node FN becomes a potential corresponding to data. For example, when data "0" is written, the potential of the node FN becomes GND, and when data "1" is written, the potential of the node FN becomes VDD. At Time T2, the potential of the wiring WWL starts to decrease, so that the transistor Tr1 is turned off, and writing is finished. When the transistor Tr1 is turned off, the potential of the node FN is slightly decreased by capacitance between the gate of the transistor Tr1 (and the wiring WWL) and the node FN.

In writing, it is preferred that a current not flow between the wirings BL and SL. For example, the wirings BL and SL may have no potential difference. That is, as in the case of the wiring BL, the potential of the wiring SL may be changed in accordance with data.

In a more effective method, the potential of the wiring RWL is set to a potential at which the transistor Tr3 is turned off. The potentials of the wirings BL and SL are each higher than or equal to GND and lower than or equal to VDD. Accordingly, when the potential of the wiring RWL is set to VDD, the transistor Tr3 is turned off. The potential of the wiring SL remains VDD except in a standby period in this embodiment, but may be another potential.

<Retention Operation>

When data is retained, the transistor Tr1 is turned off. In FIG. 9, a period in which data is retained while power supply is stopped (standby period) is from Time T3 to Time T4. In the standby period, all the wirings have equal potentials (here, GND). In the case where the potential of the node FN is higher than GND at this time, the potential of the node FN gradually decreases.

In the case where data "0" has been written, the potential of the node FN is close to GND; thus, its change does not become a significant problem. In contrast, in the case where data "1" has been written, the potential of the node FN is close to VDD at first, but decreases over time. The potential decrease is ΔV. Under the above conditions, the potential decreases by approximately 10% in the case where the retention period is approximately one year, but decreases to 35% of the initial potential after ten years as described above. In other words, ΔV=0.65×VDD is satisfied. Here, when the potential decrease of the node FN is the largest in the period in which data retention is ensured, the potential of the node FN becomes VDD−$\Delta V_{MAX}$.

<Read Operation>

Data read operation is performed by setting the potentials of the wirings BL and SL to different potentials, turning on the transistor Tr3, and determining whether a current flows between the source and the drain of the transistor Tr2. Depending on the potential of the node FN, the conduction state of the transistor Tr2 varies, so that written data can be determined.

Specifically, the potential of the wiring RWL is set to an appropriate value (here, VDD), the transistor Tr3 is turned off, and the potential of the wiring SL is set to VDD. After being precharged to an appropriate potential (here, GND), the wiring BL is brought into a floating state. After the potential of the wiring CL is set to an appropriate value (here, α; note that GND<α<VDD), the potential of the wiring RWL is set to an appropriate value (here, GND) at Time T5 to turn on the transistor Tr3.

In the case where data "0" has been written, the potential of the node FN is close to GND right before this time but becomes almost α because of capacitive coupling through the capacitor Cs when the potential of the wiring CL increases from GND to a. In the case where data "1" has been written, the potential of the node FN becomes almost VDD−ΔV+α−GND.

In order that data may be read correctly, in the case where data "0" has been written, it is required that the transistor Tr2 be on and the potential of the wiring BL increase from GND to VDD; in the case where data "1" has been written, it is required that the transistor Tr2 be off and the potential of the wiring BL remain GND.

To fulfill the requirements, it is needed to satisfy the following two inequalities when the threshold value of the transistor Tr2 is Vth: α<VDD+Vth and VDD−ΔV+α−GND≥VDD+Vth. That is, GND+ΔV+Vth≤GND+$\Delta V_{MAX}$+Vth≤α<VDD+Vth is satisfied.

For example, 0.7 [V]≤α<1.3 [V] is satisfied when VDD=+1.8 [V], GND=0 [V], Vth=−0.5 [V], and $\Delta V_{MAX}$=1.2 [V]. Alternatively, 0.2 [V]≤α<0.5 [V] is satisfied when VDD=+0.9 [V], GND=0 [V], Vth=−0.4 [V], and $\Delta V_{MAX}$=0.6 [V].

Note that α can be a given value in the required range, and α may be the average of VDD and GND (also referred to as VDD/2) or the sum of GND and the difference between VDD and GND that is divided by N (also referred to as VDD/N; note that N=3, 4, 5, . . . ). In the former case, VDD/2 is 0.9 [V]. In the latter case, VDD/3 is 0.3 [V]. Both values are in the required range.

As described above, in the case where the potential of the node FN decreases from the initial potential by greater than or equal to 60% (in the case where the potential of the node FN decreases to less than or equal to 40% of the initial potential) in the standby period, the potential of the node FN is preferably increased by increasing the potential of the wiring CL as appropriate in reading.

Note that although the written potential is initially VDD in the case of data "1", the potential output to the wiring CL is GND. It needs to be noted that inverted data is output like this.

Figure 8B:
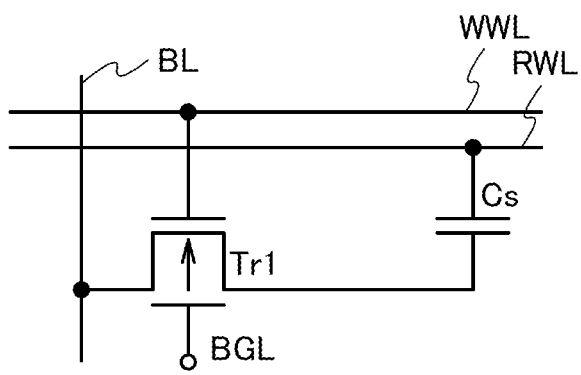

The semiconductor device described in this embodiment can be fabricated using a circuit diagram illustrated in FIG. 8B instead of the circuit diagram illustrated in FIG. 8A. The circuit diagram in FIG. 8B is different from that in FIG. 8A in that the transistors Tr2 and Tr3 are not provided and the one electrode of the capacitor Cs is electrically connected to the wiring RWL.

When including a transistor whose channel region is formed using an oxide semiconductor and that has an extremely low off-state current, the semiconductor device described in this embodiment can retain stored data for an extremely long time. In other words, power consumption can be sufficiently reduced because refresh operation becomes unnecessary or the frequency of refresh operation can be extremely low. Moreover, stored data can be held for a long period even when power is not supplied (note that a potential is preferably fixed).

Furthermore, in the semiconductor device described in this embodiment, a high voltage is not needed for writing data and there is no problem of deterioration of elements. For example, unlike in a conventional nonvolatile memory, it is not necessary to inject and extract electrons into and from a floating gate, and thus a problem such as deterioration of a gate insulating film does not arise at all. In other words, the semiconductor device of one embodiment of the present invention does not have a limit on the number of times of writing, which is a problem in a conventional nonvolatile memory, and reliability thereof is drastically improved. Furthermore, data is written depending on the on/off state of the transistor, whereby high-speed operation can be easily achieved.

As described above, a miniaturized and highly integrated semiconductor device having favorable electric characteristics can be provided.

<Semiconductor Device Structure 2>

Figure 10:
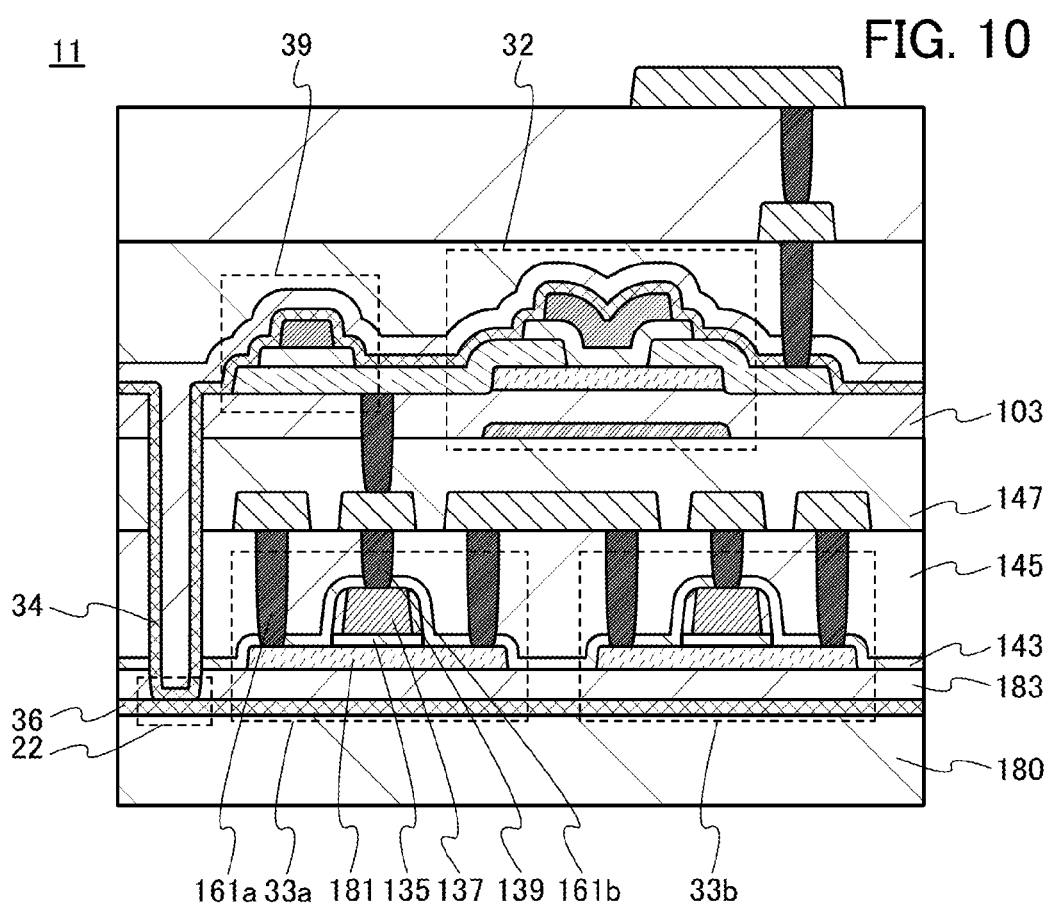
FIG. 10 illustrates one embodiment of a semiconductor device.
Figure 11:
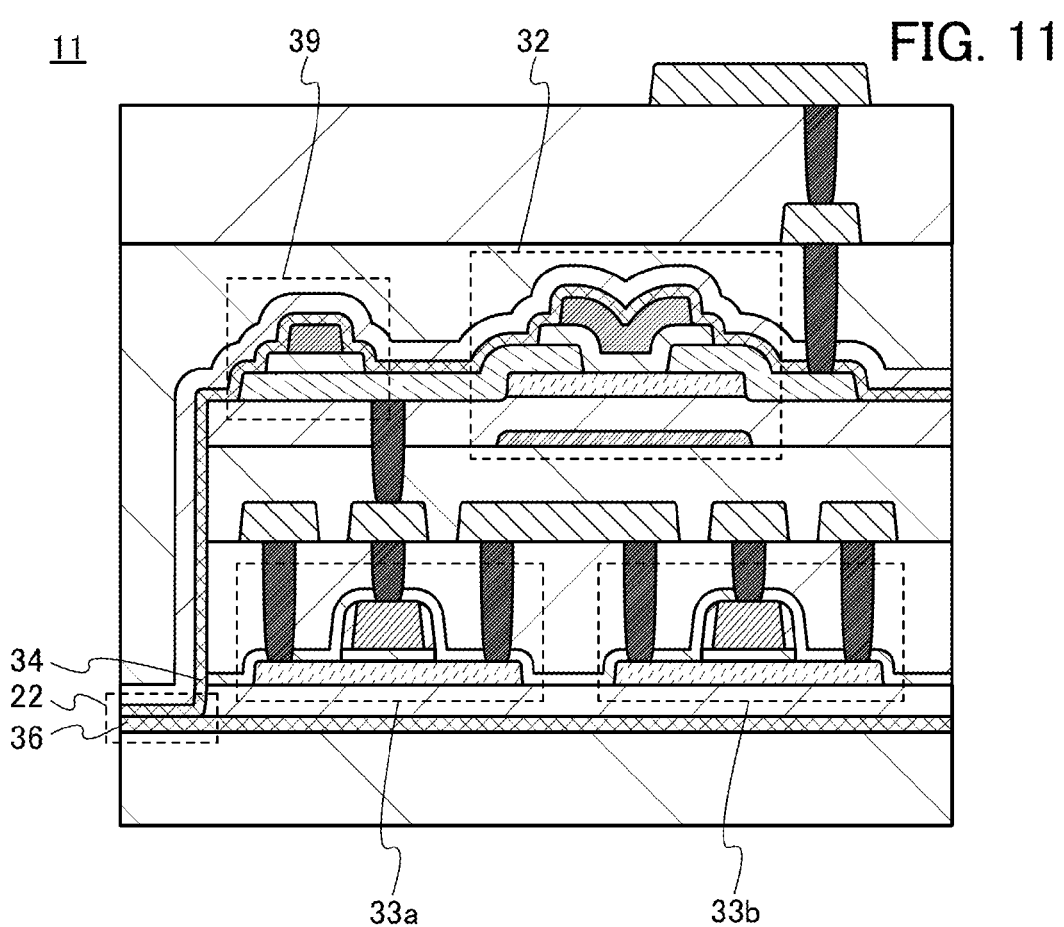
FIG. 11 illustrates one embodiment of a semiconductor device.

The structure of a semiconductor device that is different from those in FIGS. 6A and 6B and FIG. 7 will be described with reference to FIGS. 10 and 11. FIGS. 10 and 11 are schematic cross-sectional views of the element layer 11 included in the semiconductor device. In the element layer 11 illustrated in FIGS. 10 and 11, the transistors 33a and 33b are formed over the substrate 180. Furthermore, in the element layer 11 illustrated in FIGS. 10 and 11, the protective film 36 between the substrate 180 and the transistors 33a and 33b is in contact with the protective film 34 over the transistor 32, in the vicinity of an end portion of the element layer 11.

The element layer 11 illustrated in FIG. 10 includes the protective film 36 over the substrate 180, an insulating film 183 over the protective film 36, and the transistors 33a and 33b over the insulating film 183. Furthermore, the element layer 11 includes the transistor 32 and the capacitor 39 over the transistors 33a and 33b. Furthermore, the element layer 11 includes the protective film 34 that is in contact with the transistor 32 and formed in an opening in insulating films provided between the protective films 34 and 36. Although the insulating films provided between the protective films 34 and 36 are the insulating films 183, 143, 145, 147, and 103 here, they are not limited thereto.

Furthermore, the sealing region 22 is provided between a side surface of the element layer 11 and the transistors 32, 33a, and 33b. In the sealing region 22, the protective film 34 and the protective film 36 are in contact with each other in an opening in the insulating films 183, 143, 145, 147, and 103. The transistor 32, 33a, and 33b included in the element layer 11 are surrounded by the protective films 34 and 36.

Any of various substrates can be used as the substrate 180, and the substrate 180 is not limited to a specific substrate. As the substrate 180, a semiconductor substrate, an SOI substrate, a glass substrate, a quartz substrate, a plastic substrate, a metal substrate, a stainless steel substrate, a substrate containing stainless steel foil, a tungsten substrate, a substrate containing tungsten foil, a flexible substrate, an attachment film, paper containing a fibrous material, a base film, or the like can be used, for example. Examples of a glass substrate include a barium borosilicate glass substrate, an aluminoborosilicate glass substrate, and a soda lime glass substrate. Examples of a flexible substrate, an attachment film, a base film, and the like are as follows: plastics typified by polyethylene terephthalate (PET), polyethylene naphthalate (PEN), and polyether sulfone (PES); a synthetic resin such as acrylic; polypropylene; polyester; polyvinyl fluoride; polyvinyl chloride; polyamide; polyimide; aramid; epoxy; an inorganic vapor deposition film; and paper. Particularly when a transistor is formed using a single crystal semiconductor substrate, a polycrystalline semiconductor substrate, an SOI substrate, or the like, the transistor can have excellent current supply capability, a small size, and few variations in characteristics, size, shape, or the like. By forming a circuit with the use of such a transistor, power consumption of the circuit can be reduced or the circuit can be highly integrated.

Alternatively, a flexible substrate may be used as the substrate 180, and the transistor may be provided directly on the flexible substrate. Still alternatively, a separation layer may be provided between the substrate 180 and the transistor. The separation layer can be used when part or the whole of a semiconductor device formed over the separation layer is separated from the substrate 180 and transferred to another substrate. In such a case, the transistor can be transferred to a substrate having low heat resistance or a flexible substrate. For the above separation layer, a stack including inorganic films, which are a tungsten film and a silicon oxide film, or an organic resin film of polyimide or the like formed over a substrate can be used, for example.

Examples of a substrate to which the transistor is transferred include, in addition to the above-described substrates over which the transistor can be formed, a paper substrate, a cellophane substrate, an aramid film substrate, a polyimide film substrate, a stone substrate, a wood substrate, a cloth substrate (containing a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, and a rubber substrate. When using such a substrate, a transistor with excellent properties or a transistor with low power consumption can be formed, a device with high durability can be formed, heat resistance can be provided, or reduction in weight or thickness can be achieved.

The protective film 36 can be formed using a material similar to those for the protective films 34 and 35 as appropriate.

The insulating film 183 serves as a base film of a semiconductor film included in the transistors 33a and 33b. Thus, the insulating film 183 is preferably formed using a material having an excellent interface property with the semiconductor film. As the insulating film 183, an oxide insulating film, a nitride insulating film, or the like can be used as appropriate. Examples of the oxide insulating film include a silicon oxide film and a silicon oxynitride film. Examples of the nitride insulating film include a silicon nitride film and a silicon nitride oxide film. Note that in the case where the property of an interface between the protective film 36 and the semiconductor film included in the transistors 33a and 33b is excellent, the insulating film 183 is not necessarily provided.

Next, the transistors 33a and 33b will be described. Specifically, only the transistor 33a will be described because the transistors 33a and 33b have the same structure.

The transistor 33a includes a semiconductor film 181; the insulating film 135 that is over the semiconductor film 181 and serves as a gate insulating film; and the conductive film 137 that is over the insulating film 135 and serves as a gate electrode. Note that the transistor 33a may also include the side wall insulating films 139 in contact with side surfaces of the conductive film 137.

The semiconductor film 181 can be formed using a silicon film such as an amorphous silicon film, a microcrystalline silicon film, a polycrystalline silicon film, or a single crystal silicon film. Note that adding an impurity such as phosphorus or boron to the semiconductor film 181 using, as a mask, the conductive film 137 serving as a gate electrode can form source and drain regions in the semiconductor film 181.

Alternatively, the semiconductor film 181 can be formed using an oxide semiconductor film included in the transistor 32. In the case where an oxide semiconductor film is used as the semiconductor film 181, the use of an insulating film that contains hydrogen and releases hydrogen by heating as the insulating film 143 allows hydrogen contained in the insulating film 143 to be transferred to the semiconductor film 181. As a result, the resistivity of the semiconductor film 181 in contact with the insulating film 143 decreases, which is preferable.

The edge of the sealing region 22 in which the protective film 34 and the protective film 36 are in contact with each other may be part of the side surface of the element layer 11 as illustrated in FIG. 11.

The transistors 32 and 33 are surrounded by the protective films 34 and 36 in the element layers in the semiconductor devices illustrated in FIGS. 10 and 11. Thus, the hydrogen diffusion amount from the outside into the transistors 32 and 33 can be reduced. Therefore, when the transistors 32 and 33 are transistors each including an oxide semiconductor film, changes in the electric characteristics of the transistors can be reduced, improving the reliability of the semiconductor device.

<Semiconductor Device Structure 3>

The structure of a semiconductor device that is different from those in FIGS. 6A to 11 will be described with reference to FIGS. 12A and 12B and FIGS. 13A and 13B. FIGS. 12A to 13B are schematic cross-sectional views of the element layer 11 included in the semiconductor device. The element layer 11 illustrated in FIGS. 12A and 12B and FIGS. 13A and 13B includes the protective film 34, the protective film 35, and the protective film 36. At least two of the protective film 34, the protective film 35, and the protective film 36 are in contact with each other in the vicinity of an end portion of the element layer 11.

Figure 12A:
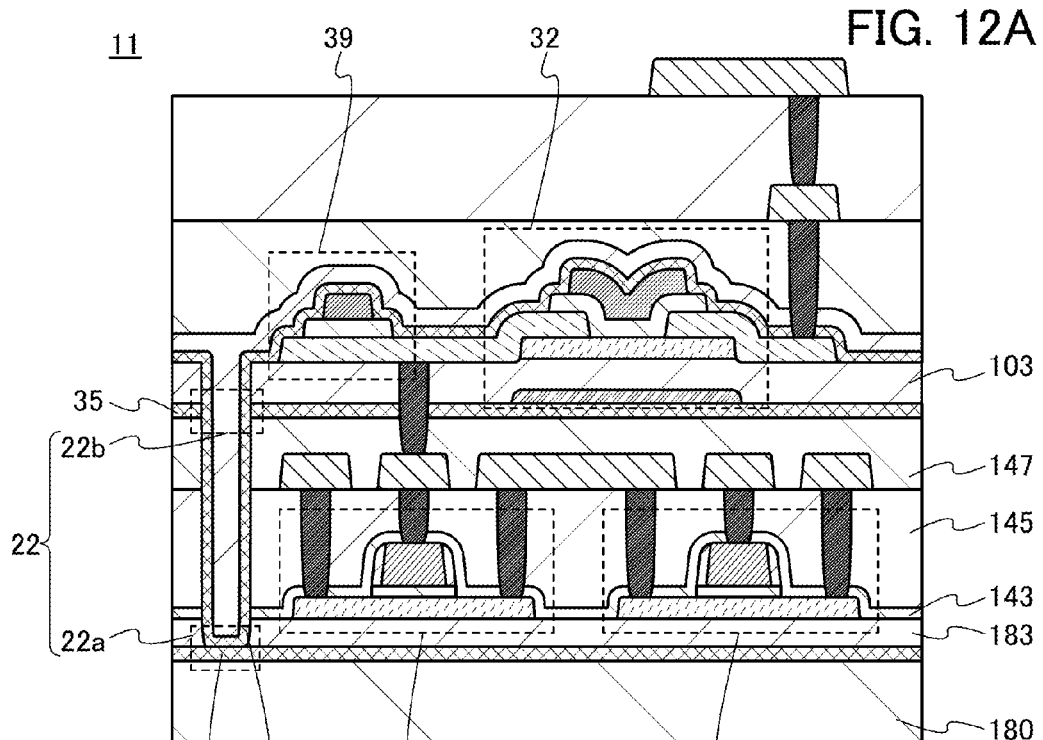
FIGS. 12A and 12B illustrate embodiments of semiconductor devices.

The element layer 11 illustrated in FIG. 12A includes the protective film 36 over the substrate 180, the insulating film 183 over the protective film 36, and the transistors 33a and 33b over the insulating film 183. Furthermore, the element layer 11 includes the transistor 32 and the capacitor 39 over the transistors 33a and 33b. Furthermore, the element layer 11 includes the protective film 35 between the transistor 32 and the transistors 33a and 33b. Furthermore, the element layer 11 includes the protective film 34 that is in contact with the transistor 32 and formed in an opening in insulating films provided between the protective films 34 and 36. Although the insulating films provided between the protective films 34 and 36 are the insulating films 183, 143, 145, 147, and 103 and the protective film 35 here, they are not limited thereto.

Furthermore, the sealing region 22 is provided between a side surface of the element layer 11 and the transistors 32, 33a, and 33b. The sealing region 22 includes the region 22a in which the protective films 34 and 36 are in contact with each other and the region 22b in which the protective films 34 and 35 are in contact with each other. In the region 22a, the protective film 34 and the protective film 36 are in contact with each other in an opening in the insulating films 183, 143, 145, 147, and 103 and the protective film 35. In the region 22b, the protective film 34 and the protective film 35 are in contact with each other in an opening in the protective film 35. The transistor 32 included in the element layer 11 is surrounded by the protective films 34 and 35. The transistors 33a and 33b are surrounded by the protective films 35 and 36.

Figure 12B:
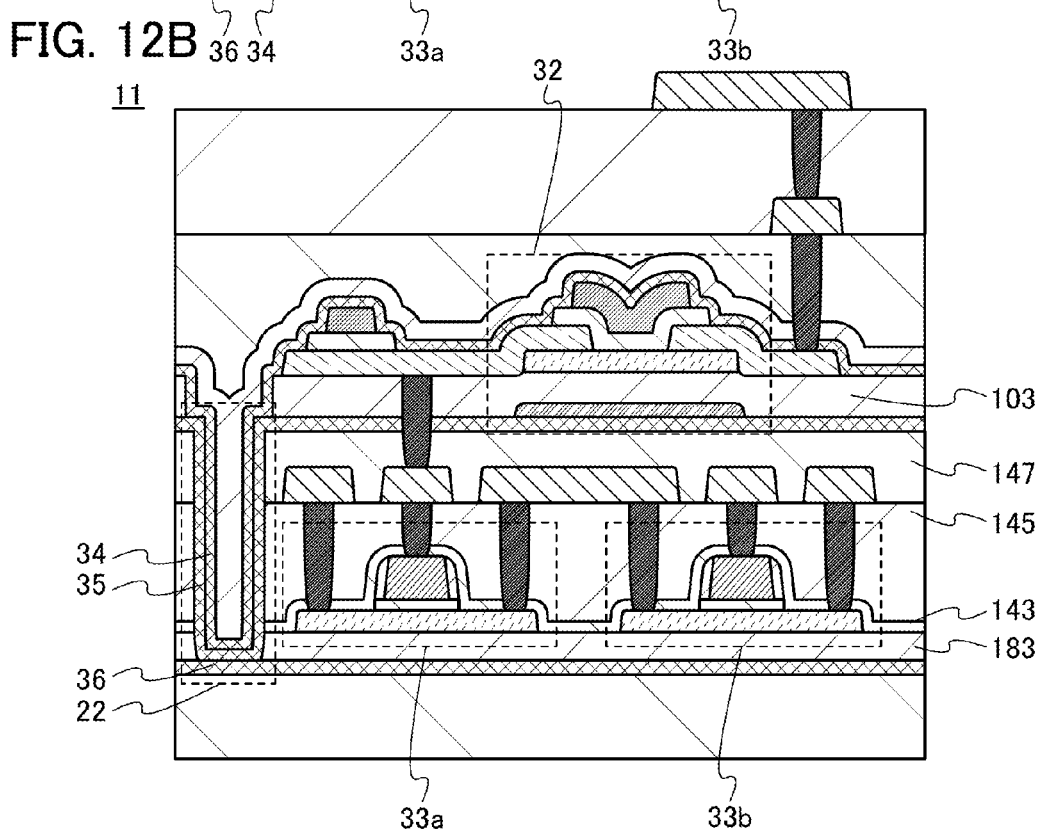

The element layer 11 illustrated in FIG. 12B includes the protective film 36 over the substrate 180, the insulating film 183 over the protective film 36, and the transistors 33a and 33b over the insulating film 183. Furthermore, the element layer 11 includes the transistor 32 and the capacitor 39 over the transistors 33a and 33b. Furthermore, the element layer 11 includes the protective film 35 between the transistor 32 and the transistors 33a and 33b. Furthermore, the element layer 11 includes the protective film 34 that is in contact with the transistor 32 and formed in an opening in insulating films provided between the protective films 34 and 36.

In the element layer 11 illustrated in FIG. 12B, the protective film 35 is formed in an opening in insulating films provided between the protective films 35 and 36. Although the insulating films provided between the protective films 35 and 36 are the insulating films 183, 143, 145, and 147 here, they are not limited thereto.

The protective film 34 is in contact with the protective film 35 in the opening in the insulating films provided between the protective films 35 and 36, and is formed in an opening in an insulating film between the protective films 34 and 35, that is, the insulating film 103, here.

Furthermore, the sealing region 22 is provided between a side surface of the element layer 11 and the transistors 32, 33a, and 33b. In the sealing region 22, the protective film 34, the protective film 35, and the protective film 36 are in contact with each other in an opening in the insulating films 183, 143, 145, 147, and 103.

Figure 13A:
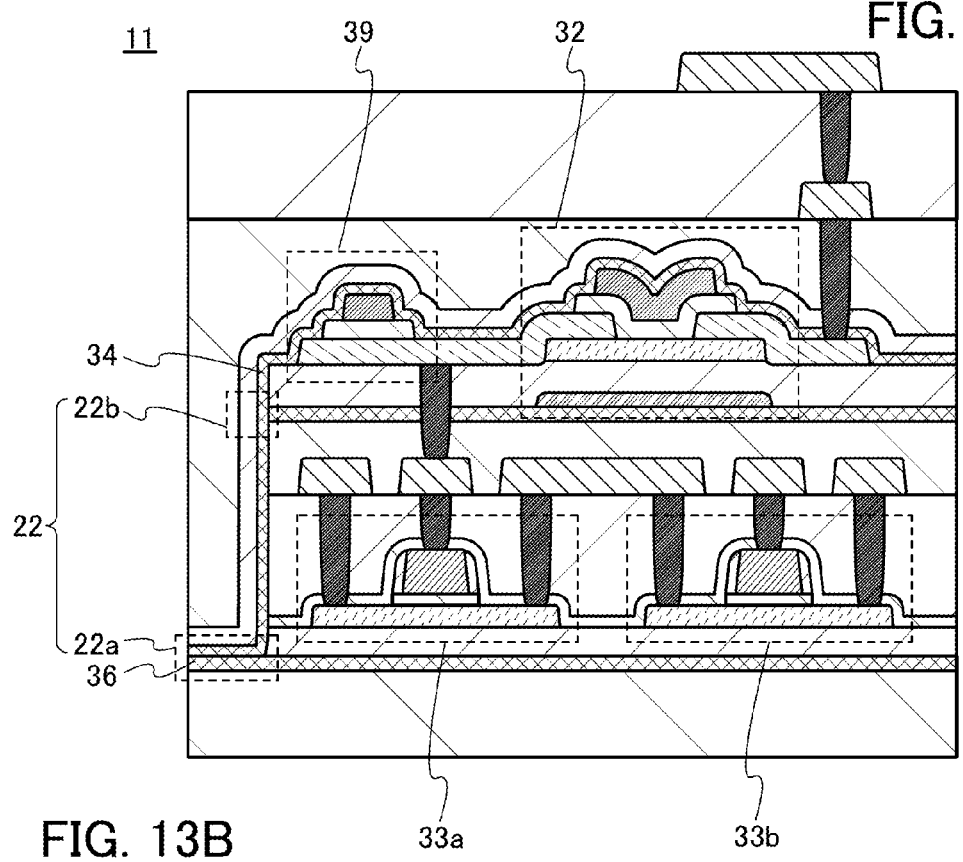
FIGS. 13A and 13B illustrate embodiments of semiconductor devices.

The edge of the sealing region 22 including regions 22a and 22b may be part of the side surface of the element layer 11 as illustrated in FIG. 13A. In the region 22a, the protective films 34 and 36 are in contact with each other. In the region 22b, the protective films 34 and 35 are in contact with each other.

Figure 13B:
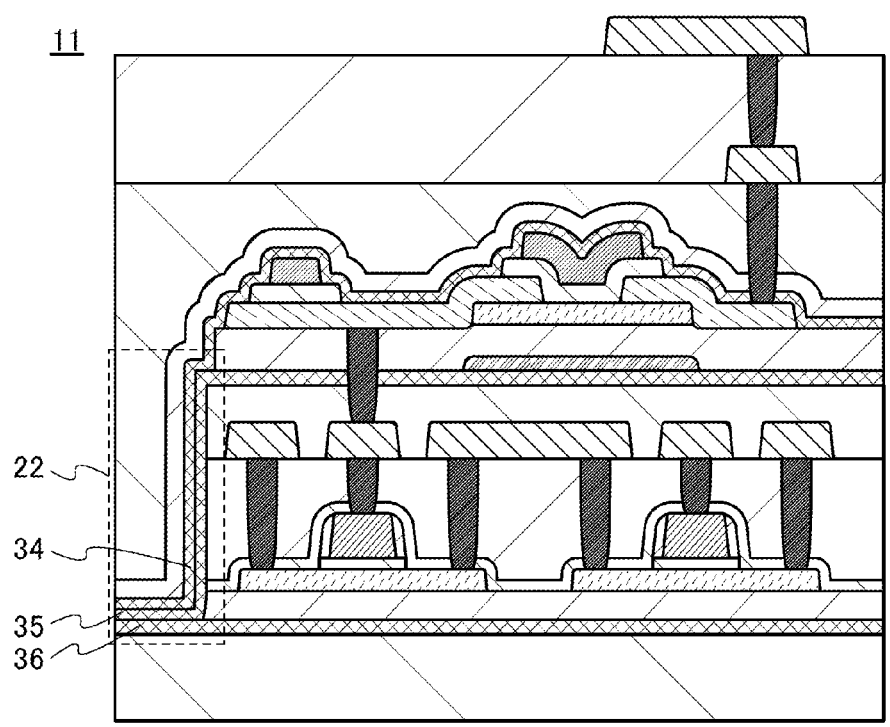

The edge of the sealing region 22 in which the protective film 34, the protective film 35, and the protective film 36 are in contact with each other may be part of the side surface of the element layer 11 as illustrated in FIG. 13B.

In the element layers in the semiconductor devices illustrated in FIGS. 12A and 12B and FIGS. 13A and 13B, the transistor 32 is surrounded by the protective film 34 and the protective film 35, and the transistors 33a and 33b are surrounded by the protective films 35 and 36. Thus, the hydrogen diffusion amount from the outside into the transistors 32, 33a, and 33b can be reduced. Therefore, when the transistors 32, 33a, and 33b are transistors each including an oxide semiconductor film, changes in the electric characteristics of the transistors can be reduced, improving the reliability of the semiconductor device.

<Semiconductor Device Structure 4>

Figure 15:
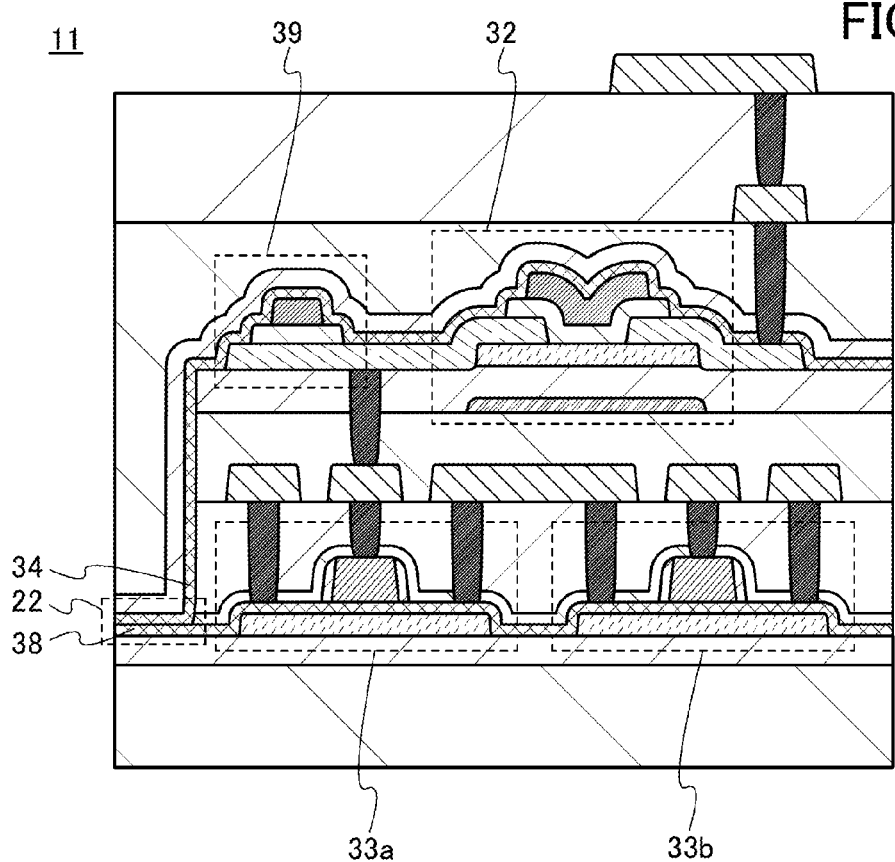
FIG. 15 illustrates one embodiment of a semiconductor device.

The structure of a semiconductor device that is different from those in FIGS. 6A to 13B will be described with reference to FIGS. 14 and 15. FIGS. 14 and 15 are schematic cross-sectional views of the element layer 11 included in the semiconductor device. In the element layer 11 illustrated in FIGS. 14 and 15, the transistors 33a and 33b are formed over the substrate 180. Furthermore, in the element layer 11 illustrated in FIGS. 14 and 15, the protective films 34 and 38 are in contact with each other in the vicinity of an end portion of the element layer 11. Note that the protective film 38 serves as a gate insulating film of the transistors 33a and 33b. The protective film 38 has a function of suppressing diffusion of hydrogen, water, and/or the like. Thus, the protective film 38 serves as a hydrogen barrier film and/or a water barrier film.

The element layer 11 illustrated in FIG. 14 includes the insulating film 183 over the substrate 180, and the transistors 33a and 33b over the insulating film 183. The transistors 33a and 33b each include the semiconductor film 181; the protective film 38 serving as a gate insulating film; and the conductive film 137 serving as a gate electrode. Note that the transistors 33a and 33b may also include the side wall insulating films 139 in contact with side surfaces of the conductive film 137. Furthermore, the element layer 11 includes the transistor 32 and the capacitor 39 over the transistors 33a and 33b. Furthermore, the element layer 11 includes the protective film 34 that is in contact with the transistor 32 and formed in an opening in insulating films provided between the protective films 34 and 38. Although the insulating films provided between the protective films 34 and 38 are the insulating films 143, 145, 147, and 103 here, they are not limited thereto.

Furthermore, the sealing region 22 is provided between a side surface of the element layer 11 and the transistors 32, 33a, and 33b. In the sealing region 22, the protective film 34 and the protective film 38 are in contact with each other in an opening in the insulating films 143, 145, 147, and 103.

The edge of the sealing region 22 in which the protective films 34 and 38 are in contact with each other may be part of the side surface of the element layer 11 as illustrated in FIG. 15.

In the element layers in the semiconductor devices illustrated in FIGS. 14 and 15, the transistor 32 is surrounded by the protective film 34 and the protective film 38. Thus, the hydrogen diffusion amount from the outside into the transistor 32 can be reduced. Therefore, when the transistor 32 is a transistor including an oxide semiconductor film, changes in the electric characteristics of the transistor can be reduced, improving the reliability of the semiconductor device.

<Semiconductor Device Structure 5>

The structure of a semiconductor device that is different from those in FIGS. 6A to 15 will be described with reference to FIGS. 16A and 16B and FIGS. 17A and 17B. FIGS. 16A to 17B are schematic cross-sectional views of the element layer 11 included in the semiconductor device. The element layer 11 illustrated in FIGS. 16A to 17B includes the protective film 34, the protective film 35, and the protective film 38. At least two of the protective film 34, the protective film 35, and the protective film 38 are in contact with each other in the vicinity of an end portion of the element layer 11.

Figure 16A:
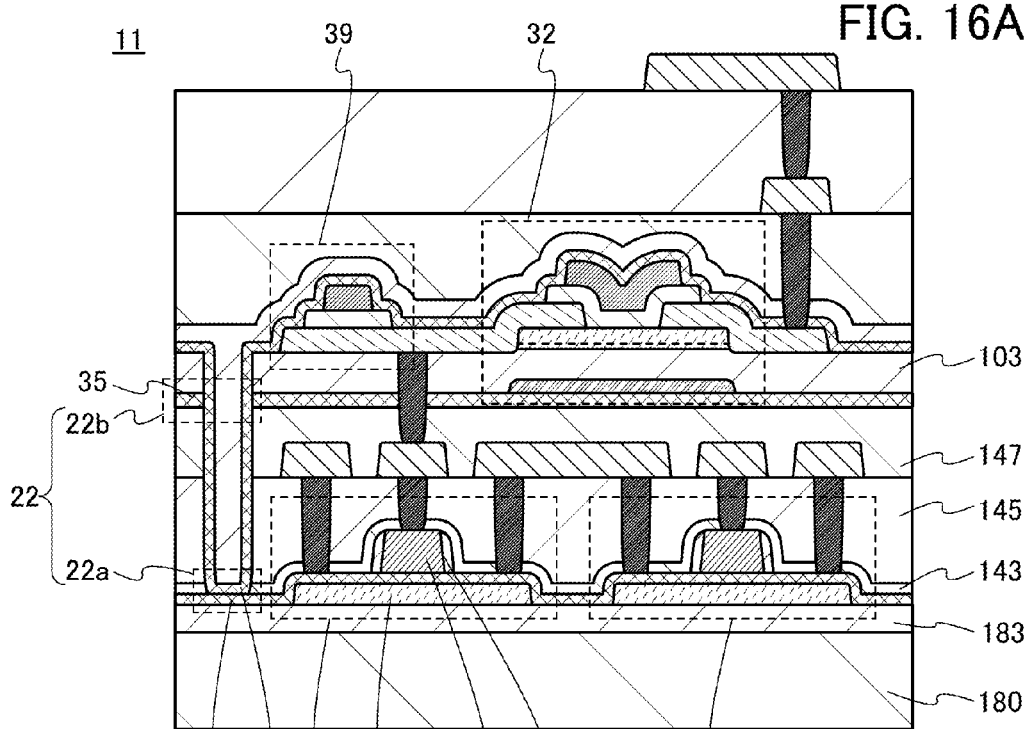
FIGS. 16A and 16B illustrate embodiments of semiconductor devices.

The element layer 11 illustrated in FIG. 16A includes the insulating film 183 over the substrate 180, and the transistors 33a and 33b over the insulating film 183. The transistors 33a and 33b have structures similar to those of the transistor 33a and 33b illustrated in FIG. 14 and includes the protective film 38 serving as a gate insulating film. Furthermore, the element layer 11 includes the transistor 32 and the capacitor 39 over the transistors 33a and 33b. Furthermore, the element layer 11 includes the protective film 35 between the transistor 32 and the transistors 33a and 33b. Furthermore, the element layer 11 includes the protective film 34 that is in contact with the transistor 32 and formed in an opening in insulating films provided between the protective films 34 and 38. Although the insulating films provided between the protective films 34 and 38 are the insulating films 143, 145, 147, and 103 and the protective film 35 here, they are not limited thereto.

Furthermore, the sealing region 22 is provided between a side surface of the element layer 11 and the transistors 32, 33a, and 33b. The sealing region 22 includes the region 22a in which the protective films 34 and 38 are in contact with each other and the region 22b in which the protective films 34 and 35 are in contact with each other. In the region 22a, the protective film 34 and the protective film 38 are in contact with each other in an opening in the insulating films 143, 145, 147, and 103 and the protective film 35. In the sealing region 22b, the protective film 34 and the protective film 35 are in contact with each other in an opening in the protective film 35.

Figure 16B:
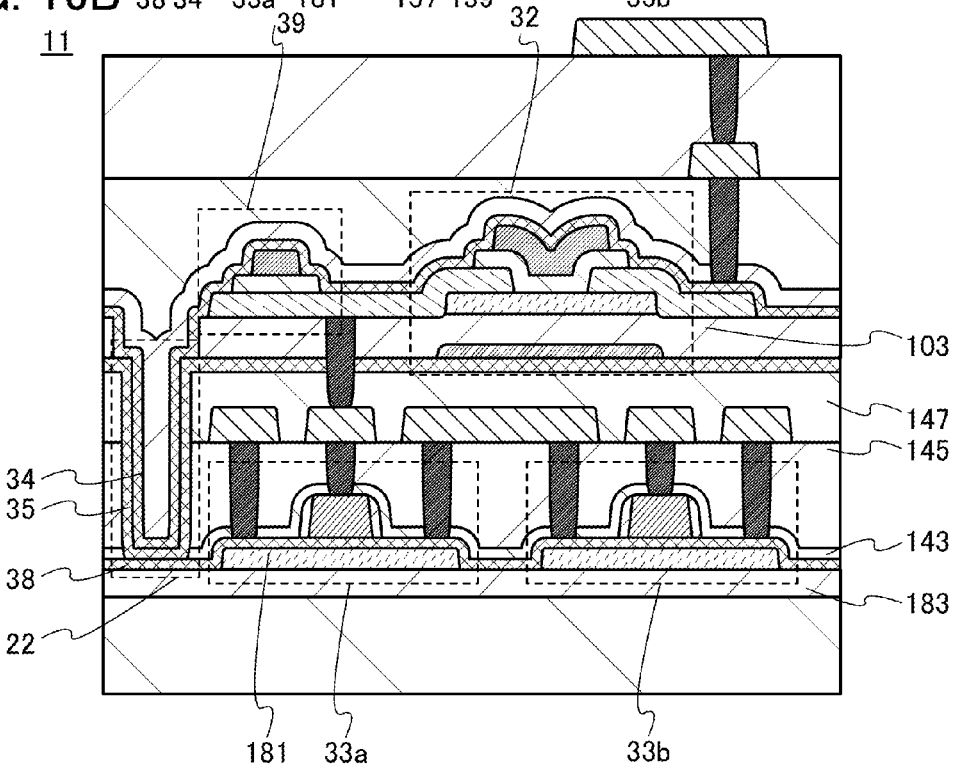

The element layer 11 illustrated in FIG. 16B includes the insulating film 183 over the substrate 180, and the transistors 33a and 33b over the insulating film 183. Furthermore, the element layer 11 includes the transistor 32 and the capacitor 39 over the transistors 33a and 33b. The transistors 33a and 33b have structures similar to those of the transistor 33a and 33b illustrated in FIG. 14 and includes the protective film 38 serving as a gate insulating film. Furthermore, the element layer 11 includes the protective film 35 between the transistor 32 and the transistors 33a and 33b. Furthermore, the element layer 11 includes the protective film 34 that is in contact with the transistor 32 and formed in an opening in insulating films provided between the protective films 34 and 38.

In the element layer 11 illustrated in FIG. 16B, the protective film 35 is formed in an opening in insulating films provided between the protective films 35 and 38. Although the insulating films provided between the protective films 35 and 38 are the insulating films 143, 145, and 147 here, they are not limited thereto.

The protective film 34 is in contact with the protective film 35 in the opening in the insulating films provided between the protective films 35 and 38, and is formed in an opening in an insulating film between the protective films 34 and 35, that is, the insulating film 103, here.

Furthermore, the sealing region 22 is provided between a side surface of the element layer 11 and the transistors 32, 33a, and 33b. In the sealing region 22, the protective film 34, the protective film 35, and the protective film 38 are in contact with each other in an opening in the insulating films 143, 145, 147, and 103.

Figure 17A:
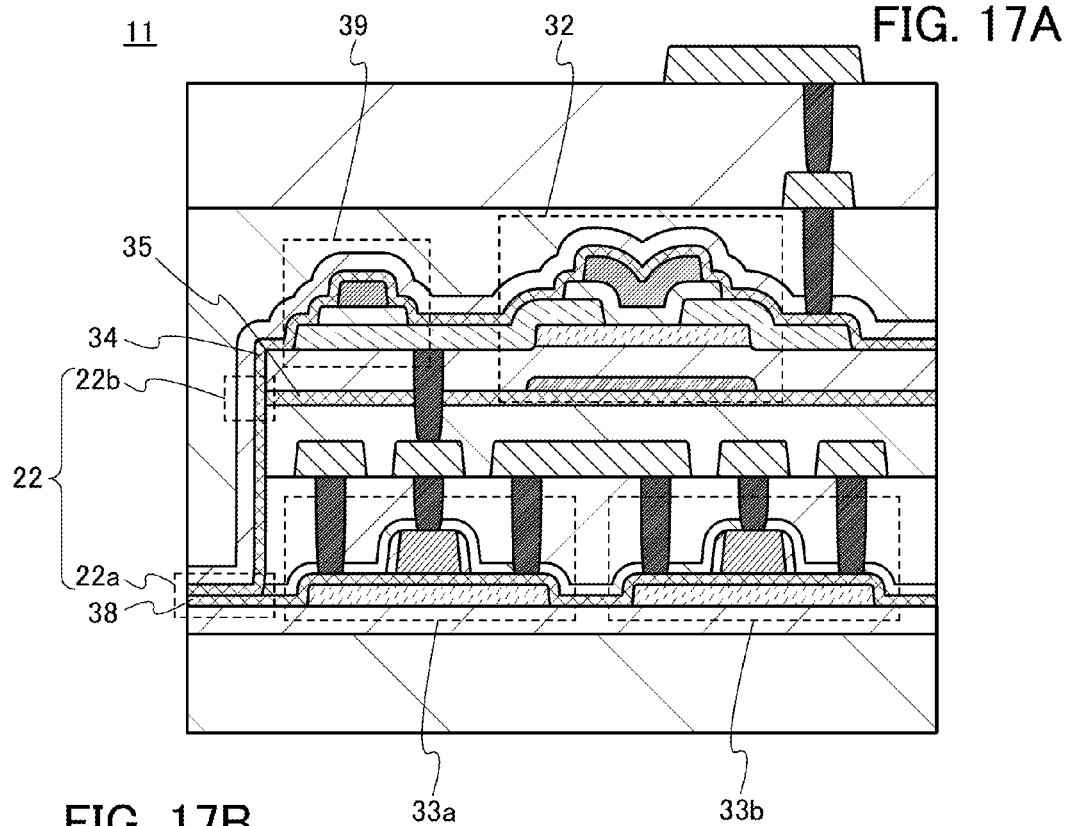
FIGS. 17A and 17B illustrate embodiments of semiconductor devices.

The edge of the sealing region 22 including regions 22a and 22b may be part of the side surface of the element layer 11 as illustrated in FIG. 17A. In the region 22a, the protective films 34 and 38 are in contact with each other. In the region 22b, the protective films 34 and 35 are in contact with each other.

Figure 17B:
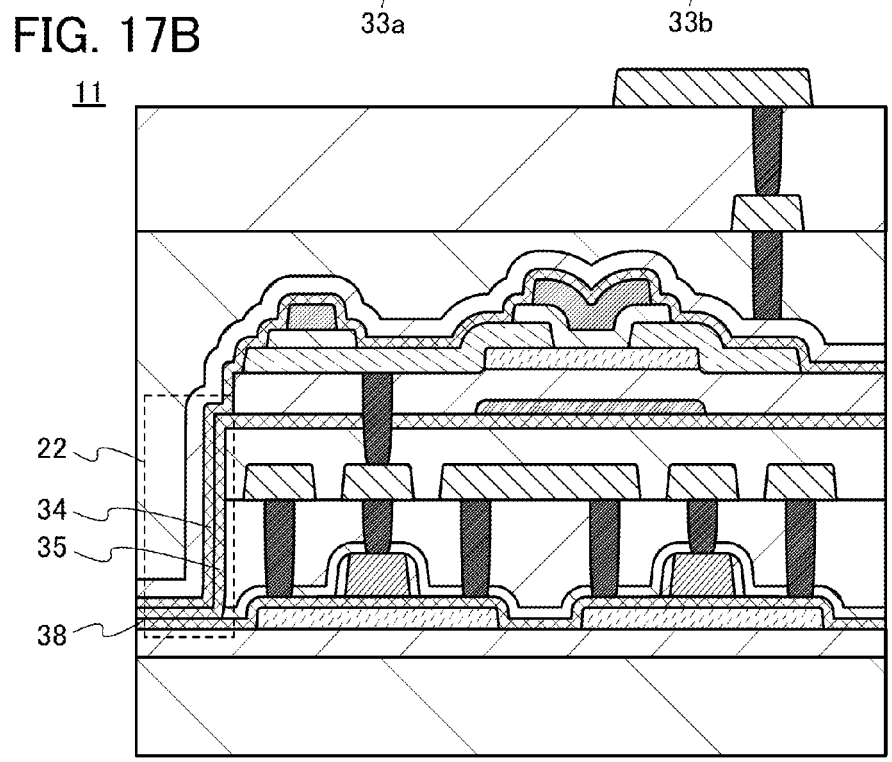

The edge of the sealing region 22 in which the protective film 34, the protective film 35, and the protective film 38 are in contact with each other may be part of the side surface of the element layer 11 as illustrated in FIG. 17B.

In the element layers in the semiconductor devices illustrated in FIGS. 16A to 17B, the transistor 32 is surrounded by the protective film 34 and the protective film 35. Thus, the hydrogen diffusion amount from the outside into the transistor 32 can be reduced. Therefore, when the transistor 32 is a transistor including an oxide semiconductor film, changes in the electric characteristics of the transistor can be reduced, improving the reliability of the semiconductor device.

<Fabricating Method of Semiconductor Device>

Next, a method for forming the element layer 11 illustrated in FIG. 6A will be described with reference to FIGS. 18A to 18C, FIGS. 19A and 19B, and FIG. 20. For methods for forming components of the transistor 32, 33a, and 33b, insulating films over the transistor 32, 33a, and 33b and conductive films connected to the transistor 32, 33a, and 33b that are not particularly described, any of known methods can be referred to as appropriate.

First, an example of a method for forming the transistors 33a and 33b that include part of the substrate 130 will be described.

Figure 18A:
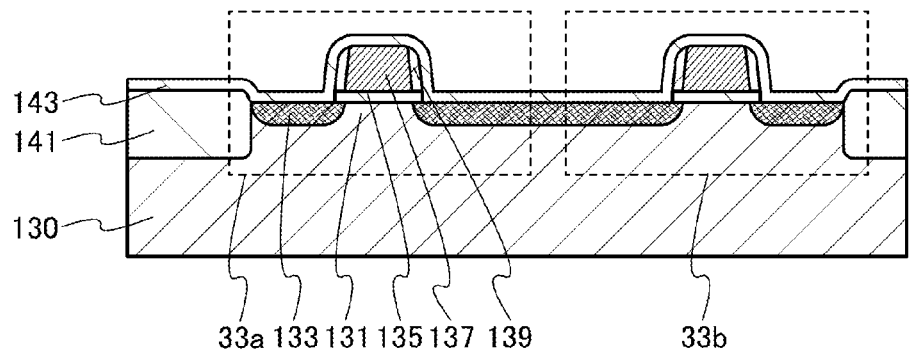
FIGS. 18A to 18C illustrate one embodiment of a method for fabricating a semiconductor device.

A single crystal silicon substrate is used as the substrate 130, and an element formation region isolated by an insulating film 141 (also referred to as a field oxide film) is formed in the surface as illustrated in FIG. 18A. The insulating film 141 serving as an element separation region can be formed by a local oxidation of silicon (LOCOS) method, a shallow trench isolation (STI) method, or the like.

Next, an insulating film is formed on the substrate 130. For example, a surface of the substrate 130 is oxidized by heat treatment to form a silicon oxide film as the insulating film. After the silicon oxide film is formed, a surface of the silicon oxide film may be nitrided by nitriding treatment.

After that, a conductive film is formed so as to cover the insulating film.

Then, the conductive film is selectively etched to form the conductive film 137 serving as a gate electrode over the insulating film.

Next, an insulating film such as a silicon oxide film or a silicon nitride film that covers the conductive film 137 is formed and etched back so that the sidewall insulating films 139 are formed on side surfaces of the conductive film 137. After that, the insulating film over the substrate 130 is etched using the conductive film 137 and the side wall insulating films 139 as masks to form the insulating film 135 serving as a gate insulating film.

Then, an impurity element is introduced into the substrate 130 to form the p-type impurity region 133. Here, in order to form p-channel transistors, an impurity element imparting p-type conductivity such as boron (B) or gallium (Ga) can be used as the impurity element.

Through the above steps, the p-channel transistors 33a and 33b including the channel regions 131 in the substrate 130 can be formed over the substrate 130. Note that the channel region 131 is preferably hydrogenated in such a manner that the insulating film 143 is formed over the transistors 33a and 33b and then heat treatment is performed at a temperature of 350° C. to 650° C. inclusive.

Figure 18B:
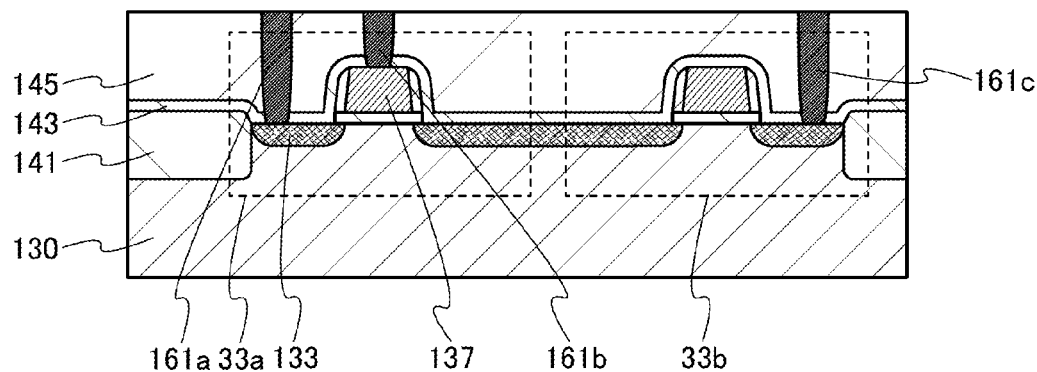

After that, the insulating film 145 is formed over the insulating film 141, the p-type impurity regions 133, the insulating film 135, the conductive film 137, the side wall insulating films 139, and the insulating film 143 as illustrated in FIG. 18B.

Then, openings are formed in the insulating films 143 and 145 so that the impurity regions 133 and the conductive film 137 in the transistors 33a and 33b are each partly exposed. Subsequently, the conductive film 161a, 161b, and 161c are formed in the openings in the insulating films 143 and 145.

Figure 18C:
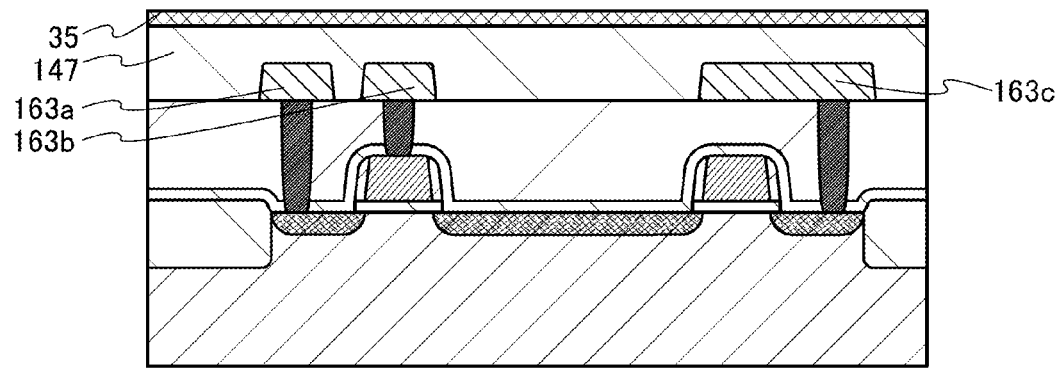

Next, the conductive films 163a, 163b, and 163c serving as wirings are formed over the insulating film 145 and the conductive films 161a, 161b, and 161c as illustrated in FIG. 18C. Note that the conductive films 163a, 163b, and 163c are connected to the conductive films 161a, 161b, and 161c, respectively.

Then, the insulating film 147 is formed over the insulating film 145 and the conductive films 163a, 163b, and 163c, and the protective film 35 is formed over the insulating film 147.

The protective film 35 can be formed by a sputtering method. Alternatively, in the case of using an oxide film as the protective film 35, the oxide film can be formed in the following manner: a conductive film is formed and at least one of an oxygen radical, an oxygen atom, an oxygen atomic ion, and an oxygen molecular ion is added to the conductive film. The thickness of the conductive film can be greater than or equal to 5 nm and less than or equal to 50 nm, preferably greater than or equal to 10 nm and less than or equal to 20 nm. The conductive film with a thickness greater than or equal to 5 nm or preferably greater than or equal to 10 nm can reduce variations in a large substrate. Meanwhile, the conductive film with a thickness less than or equal to 50 nm or preferably less than or equal to 20 nm can increase the productivity. Examples of a method for adding at least one of an oxygen radical, an oxygen atom, an oxygen atomic ion, and an oxygen molecular ion include an ion doping method, an ion implantation method, and plasma treatment. In the case where an oxygen radical, an oxygen atom, an oxygen atomic ion, or an oxygen molecular ion is added to the conductive film, the amount of oxygen to be added can be increased by application of a bias to the substrate side.

Next, methods for forming the transistor 32 and the capacitor 39 will be described.

Figure 19A:
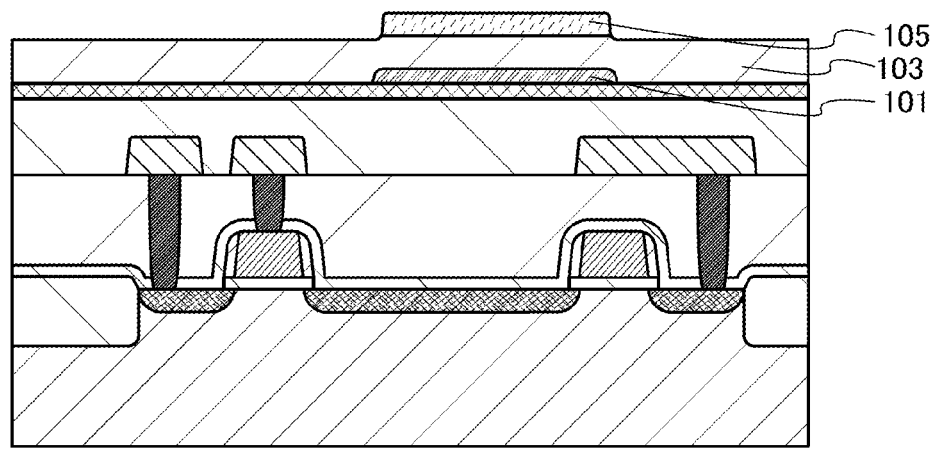
FIGS. 19A and 19B illustrate one embodiment of a method for fabricating a semiconductor device.

The conductive film 101 serving as a gate electrode is formed over the protective film 35 as illustrated in FIG. 19A. Then, the insulating film 103 is formed over the protective film 35 and the conductive film 101. Next, the oxide semiconductor film 105 is formed over the insulating film 103.

A method for forming the conductive film 101 will be described below. First, a conductive film is formed by a sputtering method, a chemical vapor deposition (CVD) method such as a metal organic chemical vapor deposition (MOCVD) method, a metal chemical vapor deposition method, an atomic layer deposition (ALD) method, or a plasma-enhanced chemical vapor deposition (PECVD) method, an evaporation method, a pulsed laser deposition (PLD) method, or the like. Then, a mask is formed over the conductive film through a lithography process. Next, the conductive film is etched with the use of the mask to form the conductive film 101. After that, the mask is removed.

For example, a tungsten film can be formed as the conductive film with a deposition apparatus employing an ALD method. In that case, a $WF_6$ gas and a $B_2H_6$ gas are sequentially introduced more than once to form an initial tungsten film, and then a $WF_6$ gas and an $H_2$ gas are introduced at a time, so that a tungsten film is formed. Note that an $SiH_4$ gas may be used instead of a $B_2H_6$ gas.

The insulating film 103 can be formed by a sputtering method, a CVD method such as a MOCVD method, an ALD method, or a PECVD method, a PLD method, a coating method, a printing method, or the like.

In the case where the insulating film 103 is formed using a silicon oxide film or a silicon oxynitride film, a deposition gas containing silicon and an oxidizing gas are preferably used as a source gas. Typical examples of the deposition gas containing silicon include silane, disilane, trisilane, and silane fluoride. Examples of the oxidizing gas include oxygen, ozone, dinitrogen monoxide, and nitrogen dioxide.

In the case where a hafnium oxide film is formed as the insulating film 103 by a thermal CVD method such as an MOCVD method or an ALD method, two kinds of gases, i.e., ozone ($O_3$) as an oxidizer and a source gas that is obtained by vaporizing a liquid containing a solvent and a hafnium precursor compound (a hafnium alkoxide or a hafnium amide such as tetrakis(dimethylamide)hafnium (TDMAH) are used. Note that the chemical formula of tetrakis(dimethylamide)hafnium is $Hf[N(CH_3)_2]_4$. Examples of another material liquid include tetrakis(ethylmethylamide)hafnium.

In the case where an aluminum oxide film is formed as the insulating film 103 by a thermal CVD method such as a MOCVD method or an ALD method, two kinds of gases, i.e., $H_2O$ as an oxidizer and a source gas that is obtained by vaporizing a liquid containing a solvent and an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

Furthermore, in the case where a silicon oxide film is formed as the insulating film 103 by a thermal CVD method such as an MOCVD method or an ALD method, hexachlorodisilane is adsorbed on a deposition surface, chlorine contained in the adsorbate is removed, and radicals of an oxidizing gas (e.g., $O_2$ or dinitrogen monoxide) are supplied to react with the adsorbate.

Note that the insulating film 103 may contain excess oxygen by addition of any one or more of an oxygen radical, an oxygen atom, an oxygen atomic ion, an oxygen molecular ion, and the like. Examples of a method for adding any one or more of an oxygen radical, an oxygen atom, an oxygen atomic ion, an oxygen molecular ion, and the like to the insulating film 103 include an ion doping method and an ion implantation method.

A forming method of the oxide semiconductor film 105 will be described below. First, an oxide semiconductor film is formed by a sputtering method, a coating method, a pulsed laser deposition method, a laser ablation method, an MOCVD method, an ALD method, or the like. Then, a mask is formed through a lithography process. Next, the oxide semiconductor film is etched with the use of the mask to form the oxide semiconductor film 105. After that, the mask is removed. Note that when the oxide semiconductor film is etched, part of the insulating film 103 is also etched at the same time as the oxide semiconductor film in some cases. In that case, a projection is formed in a region of the insulating film 103 that overlaps with the oxide semiconductor film 105.

As a power supply device for generating plasma in the case of forming the oxide semiconductor film by a sputtering method, an RF power supply device, an AC power supply device, a DC power supply device, or the like can be used as appropriate.

Note that in the case where the oxide semiconductor film is formed using a magnetron sputtering apparatus provided with a magnet on the rear surface of a sputtering target, the oxide semiconductor film is formed while one or more of the sputtering target, the magnet, and a substrate is rocked, whereby the oxide semiconductor film can have a uniform thickness distribution.

As a sputtering gas, a rare gas (typically argon), oxygen, or a mixed gas of a rare gas and oxygen is used as appropriate.

Furthermore, a target may be appropriately selected in accordance with the composition of the oxide semiconductor film to be formed. When a target containing an In—Ga—Zn oxide, preferably a polycrystalline target containing an In—Ga—Zn oxide is used, a CAAC-OS film and a microcrystalline oxide semiconductor film can be formed.

For example, in the case where the oxide semiconductor film is formed by a sputtering method at a substrate temperature higher than or equal to 150° C. and lower than or equal to 750° C., preferably higher than or equal to 150° C. and lower than or equal to 450° C., more preferably higher than or equal to 200° C. and lower than or equal to 350° C., the oxide semiconductor film can be a CAAC-OS film.

For the deposition of the CAAC-OS film, the following conditions are preferably used.

By suppressing entry of impurities into the CAAC-OS film during the deposition, the crystal state can be prevented from being broken by the impurities. For example, the concentration of impurities (e.g., hydrogen, water, carbon dioxide, or nitrogen) that exist in a deposition chamber may be reduced. Furthermore, the concentration of impurities in a deposition gas may be reduced. Specifically, a deposition gas whose dew point is −80° C. or lower, preferably −100° C. or lower, more preferably −125° C. or lower is used.

For example, when an oxide semiconductor film, e.g., an InGaZnOx (X>0) film is formed using a deposition apparatus employing an ALD method, an $In(CH_3)_3$ gas and an $O_3$ gas are sequentially introduced more than once to form an $InO_2$ layer, a $Ga(CH_3)_3$ gas and an $O_3$ gas are introduced at the same time to form a GaO layer, and then a $Zn(CH_3)_2$ gas and an $O_3$ gas are introduced at the same time to form a ZnO layer. Note that the order of these layers is not limited to this example. Alternatively, these gases may be mixed to form a mixed compound layer such as an $InGaO_2$ layer, an $InZnO_2$ layer, or a GaZnO layer. Note that although an $H_2O$ gas that is obtained by bubbling with an inert gas such as Ar may be used instead of an $O_3$ gas, it is preferred that an $O_3$ gas, which does not contain H, be used. Instead of an $In(CH_3)_3$ gas, an $In(C_2H_5)_3$ may be used. Instead of a $Ga(CH_3)_3$ gas, a $Ga(C_2H_5)_3$ gas may be used. Alternatively, a $Zn(CH_3)_2$ gas may be used.

Note that after the formation of the oxide semiconductor film, any one or more of an oxygen radical, an oxygen atom, an oxygen atomic ion, an oxygen molecular ion, and the like may be added to the oxide semiconductor film in order to reduce oxygen vacancies in the oxide semiconductor film. Examples of a method for adding at least one of an oxygen radical, an oxygen atom, an oxygen atomic ion, an oxygen molecular ion, and the like to the oxide semiconductor film include an ion doping method and an ion implantation method.

After an oxide semiconductor film to be the oxide semiconductor film 105 is formed, heat treatment is preferably performed. The heat treatment may be performed at a temperature higher than or equal to 250° C. and lower than or equal to 650° C., or preferably higher than or equal to 300° C. and lower than or equal to 500° C., in an inert gas atmosphere, an atmosphere containing an oxidizing gas at 10 ppm or more, or a reduced pressure state. Alternatively, the heat treatment may be performed in such a manner that heat treatment is performed in an inert gas atmosphere, and then another heat treatment is performed in an atmosphere containing an oxidization gas at 10 ppm or more, in order to compensate desorbed oxygen. Note that the heat treatment may be performed directly after the formation of the oxide semiconductor film or performed after the oxide semiconductor film is processed into the oxide semiconductor layer 105. Through the heat treatment, oxygen can be supplied to the oxide semiconductor film; thus, oxygen vacancies in the oxide semiconductor film can be reduced.

Figure 19B:
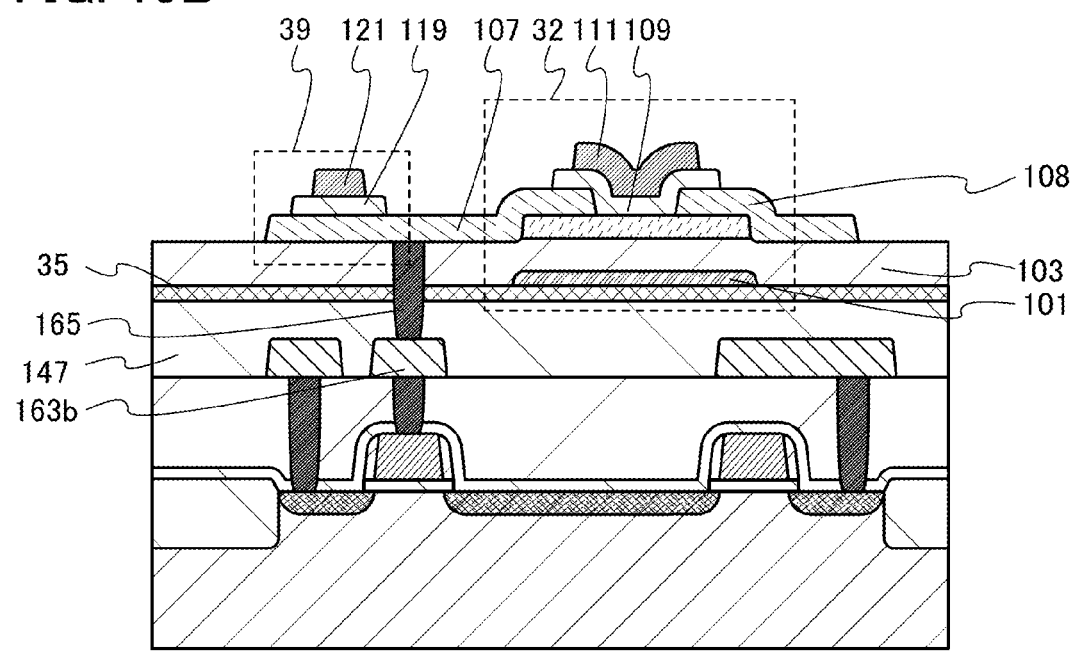

Then, an opening is formed in the insulating film 147, the protective film 35, and the insulating film 103, and the conductive film 163b is partly exposed. Subsequently, the conductive film 165 is formed in the opening in the insulating film 147, the protective film 35, and the insulating film 103 as illustrated in FIG. 19B.

Then, conductive films 107 and 108 are formed over the insulating film 103, the oxide semiconductor film 105, and the conductive film 165. The conductive films 107 and 108 can be formed by the forming method of the conductive film 101 as appropriate.

Then, the insulating film 109 over the oxide semiconductor film 105 and the conductive films 107 and 108, the conductive film 111 over the insulating film 109, the insulating film 119 over the conductive film 107, and the conductive film 121 over the insulating film 119 are formed.

A forming method of the insulating films 109 and 119 and the conductive films 111 and 121 will be described below. First, an insulating film is formed by a sputtering method, a coating method, a pulsed laser deposition method, a laser ablation method, an MOCVD method, an ALD method, or the like. Then, a conductive film is formed over the insulating film. Subsequently, a mask is formed over the conductive film through a lithography process. The conductive film is etched using the mask to form the conductive films 111 and 121. After that, the mask is removed.

Since the conductive films 107 and 108 are covered with the insulating film, surfaces of the conductive films 107 and 108 are not electrically charged in the etching step. Thus, electrostatic breakdown is less likely to occur between the conductive films 107 and 108 and the conductive films 111 and 121, so that an yield can be increased.

Then, a mask is formed over the conductive films 111 and 121 and the insulating film through a lithography process, and then, the insulating film is etched using the mask, whereby the insulating films 109 and 119 are formed.

Since the conductive films 111 and 121 are covered with the mask, surfaces of the conductive films 111 and 121 are not electrically charged in the etching step. Thus, even in the case where the conductive films 107 and 108 are exposed when the insulating films 109 and 119 are formed, electrostatic breakdown is less likely to occur between the conductive films 107 and 108 and the conductive films 111 and 121. This can increase an yield.

Through the above steps, the insulating film 109 serving as a gate insulating film and the conductive film 111 serving as a gate electrode in the transistor 32, and the insulating film 119 serving as a dielectric film and the conductive film 121 serving as an electrode in the capacitor 39 can be formed.

Figure 20:
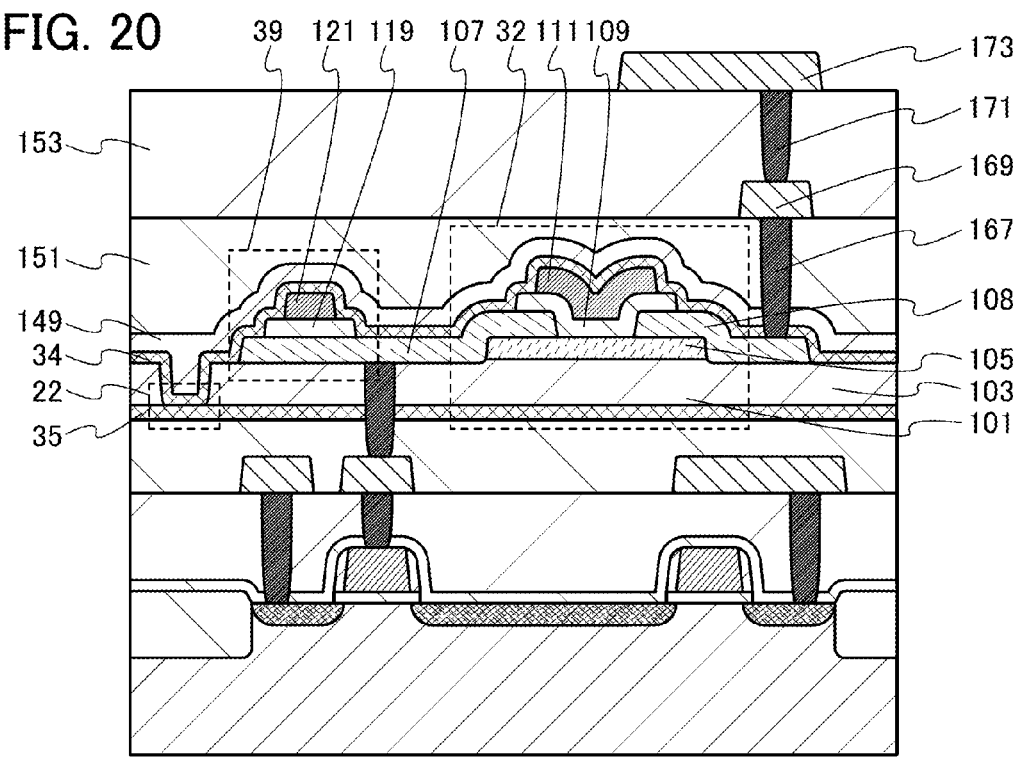
FIG. 20 illustrates one embodiment of a method for fabricating a semiconductor device.

Next, part of the insulating film 103 is etched to expose part of the protective film 35 as illustrated in FIG. 20.

Then, the protective film 34 is formed over the protective film 35, the insulating film 103, the conductive films 107 and 108, the insulating film 109, the insulating film 119, the conductive film 111, and the conductive film 121. Consequently, the sealing region 22 in which the protective films 34 and 35 are in contact with each other can be formed.

Note that the protective film 34 can be formed using the method for forming the protective film 35 as appropriate.

The sealing region 22 has a closed-loop shape when seen from above. This can reduce the hydrogen diffusion amount from the outside into the transistor 32 in the element layer 11.

Next, the insulating film 149 and the insulating film 151 are formed over the protective film 34. Then, an opening is formed in the insulating films 149 and 151. After that, the conductive film 167 is formed in the opening in the insulating films 149 and 151 so as to be in contact with the conductive film 108.

Then, the conductive film 169 is formed over the insulating film 151 and the conductive film 167.

After the insulating film 153 is formed over the insulating film 151 and the conductive film 169, an opening is formed in the insulating film 153. Then, the conductive film 171 is formed in the opening in the insulating film 153.

Subsequently, the conductive film 173 is formed over the insulating film 153 and the conductive film 171.

Through the above steps, the element layer 11 included in the semiconductor device can be formed.

The method for forming the element layer 11 illustrated in FIG. 6A is described here, and appropriately modifying the forming method in FIGS. 18A to 18C, FIGS. 19A and 19B, and FIG. 20 allows formation of the element layer 11 in any of FIG. 6B to 17B.

The structures, methods, and the like described in this embodiment can be used in combination with any of the structures, methods, and the like described in the other embodiments, as appropriate. The structure described in this embodiment can be used in combination with any of the structures described in the other embodiments, as appropriate.

Embodiment 3

In this embodiment, the structure of an element layer included in a semiconductor device will be described with reference to FIGS. 21A and 21B.

In this embodiment, an example of a semiconductor device including a CMOS circuit will be described with reference to FIGS. 21A and 21B.

Figure 21A:
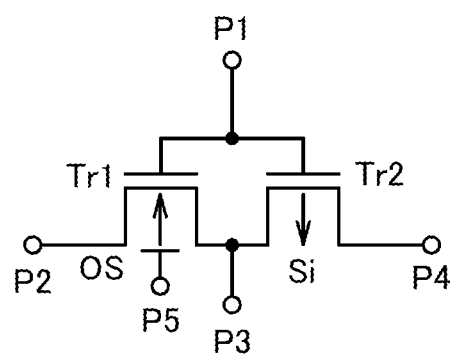
FIGS. 21A and 21B are a circuit diagram and a schematic cross-sectional view illustrating one embodiment of a semiconductor device, respectively.

FIG. 21A is a circuit diagram of a CMOS circuit 202 included in a semiconductor device. The CMOS circuit 202 illustrated in FIG. 21A includes the transistors Tr1 and Tr2. A gate of the transistor Tr1 is electrically connected to a first terminal P1. One of a source and a drain of the transistor Tr1 is electrically connected to a second terminal P2. The other of the source and the drain of the transistor Tr1 is electrically connected to a third terminal P3.

A gate of the transistor Tr2 is electrically connected to the first terminal P1. One of a source and a drain of the transistor Tr2 is electrically connected to the third terminal P3. The other of the source and the drain of the transistor Tr2 is electrically connected to a fourth terminal P4.

The transistor Tr1 has a dual gate structure. One gate is electrically connected to the first terminal P1, and the other gate is electrically connected to the fifth terminal P5. Note that the transistor Tr1 may have a single gate structure as necessary.

A region where a channel region of the transistor Tr1 is formed is included in an oxide semiconductor film. Thus, the transistor Tr1 has an extremely low off-state current (extremely high off-state resistance). The transistor Tr1 is either an n-channel transistor or a p-channel transistor. In the following description, the transistor Tr1 is an n-channel transistor.

The transistor Tr2 is a p-channel transistor. Any of various materials such as an oxide semiconductor and silicon can be used for a region in which a channel region of the transistor Tr2 is formed.

Note that a transistor including an oxide semiconductor film has frequency characteristics equivalent to those of an n-channel transistor including a channel region in a semiconductor substrate. Thus, the CMOS circuit formed using the transistor Tr1 including an oxide semiconductor film and the p-channel transistor Tr2 whose channel region is in a semiconductor substrate can operate at high speed. In addition, since the transistor Tr1 including the oxide semiconductor film can be stacked over the transistor Tr2, the transistors can be three-dimensionally positioned, leading to the fabrication of a highly integrated or small semiconductor device.

Figure 21B:
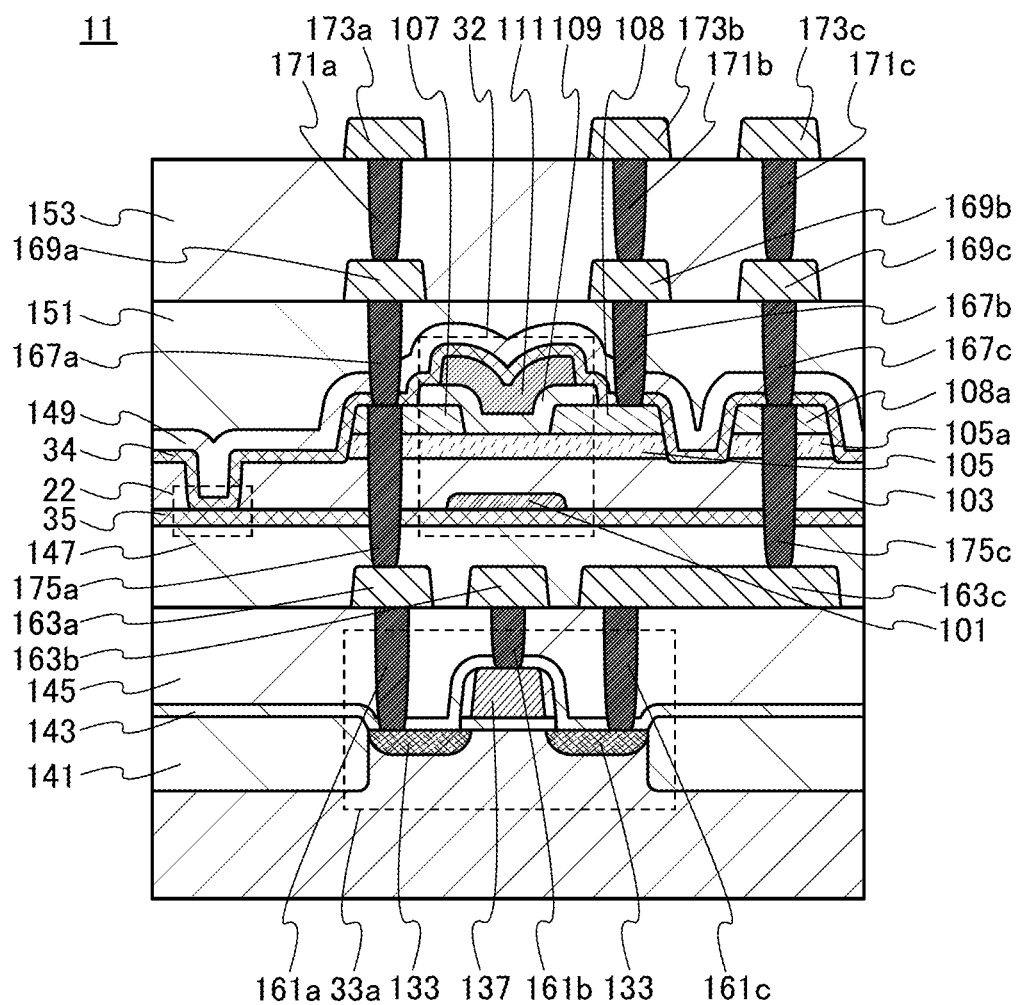

FIG. 21B is an enlarged schematic cross-sectional view illustrating the vicinity of a side surface of the element layer 11 included in a semiconductor device. Although in this embodiment, description will be given taking, as an example of a sealing region included in the element layer 11, a sealing region having the same structure as the sealing region 22 illustrated in FIG. 6A in Embodiment 2, any of the other structures of the sealing region 22 described in Embodiment 2 can be used as appropriate instead of the sealing region 22 illustrated in FIG. 21B. In addition, the transistor 33a illustrated in FIG. 6A in Embodiment 2 is taken as an example of the transistor 33a included in the element layer 11; however, any of the other structures of the transistor 33a described in Embodiment 2 can alternatively be used as appropriate.

As illustrated in FIG. 21B, the element layer 11 includes the transistor 32 in an upper portion and the transistor 33a in a lower portion. The transistor 32 and the transistor 33a illustrated in FIG. 21B correspond to the transistor Tr1 and the transistor Tr2 in FIG. 21A, respectively. A conductive film 173a illustrated in FIG. 21B is electrically connected to the terminal P3 in FIG. 21A. A conductive film 173b illustrated in FIG. 21B is electrically connected to the terminal P2 in FIG. 21A. The conductive film 173c illustrated in FIG. 21B is electrically connected to the terminal P4 in FIG. 21A. Note that the terminals P1 and P5 in FIG. 21A are not illustrated in FIG. 21B.

In FIG. 21B, the conductive film 107 in the transistor 32, one p-type impurity region in the transistor 33a, and the conductive film 173a are electrically connected through the conductive film 161a serving as a plug, the conductive film 163a serving as a wiring, a conductive film 175a serving as a plug, a conductive film 167a serving as a plug, a conductive film 169a serving as a wiring, and a conductive film 171a serving as a plug.

The conductive film 108 in the transistor 32 and the conductive film 173b are electrically connected through a conductive film 167b serving as a plug, a conductive film 169b serving as a wiring, and a conductive film 171b serving as a plug.

The other p-type impurity region in the transistor 33a and the conductive film 173c are electrically connected through the conductive film 161c serving as a plug, the conductive film 163c serving as a wiring, a conductive film 175c serving as a plug, a conductive film 167c serving as a plug, a conductive film 169c serving as a wiring, and a conductive film 171c serving as a plug.

Although not illustrated, the conductive film 111 that is included in the transistor 32 and serves as a gate electrode is electrically connected to the conductive film 137 that is included in the transistor 33a and serves as a gate electrode.

The conductive films 161a, 161b, and 161c each serving as a plug are formed in openings in the insulating films 143 and 145.

The conductive films 163a, 163b, and 163c each serving as a wiring are formed over the insulating film 145 and the conductive films 161a, 161b, and 161c.

The insulating film 147 is formed over the insulating film 145 and the conductive films 163a, 163b, and 163c. The protective film 35 is formed over the insulating film 147. The transistor 32 is formed over the protective film 35. Specifically, the conductive film 101 and the insulating film 103 that are included in the transistor 32 are formed over the protective film 35.

The conductive film 175a serving as a plug is formed in an opening in the insulating film 147, the protective film 35, the oxide semiconductor film 105, and the conductive film 107. The conductive film 175c serving as a plug is formed in an opening in the insulating film 147, the protective film 35, an oxide semiconductor film 105a, and a conductive film 108a. Note that the oxide semiconductor film 105a is formed at the same time as the oxide semiconductor film 105. The conductive film 108a is formed at the same time as the conductive films 107 and 108. Providing the oxide semiconductor film 105a and the conductive film 108a allows the bottoms of openings formed in the protective film 34, the insulating film 149, and the insulating film 151 to be level with each other, which can reduce variations in a forming process. Note that the oxide semiconductor film 105a and the conductive film 108a are not necessarily formed.

In addition, since the transistor 32 including the oxide semiconductor film can be stacked over the transistor 33a, the transistors can be three-dimensionally positioned, leading to the fabrication of a highly integrated or small semiconductor device.

The protective film 34 is formed over the transistor 32. The insulating film 149 is formed over the protective film 34 that is formed over the transistor 32. The insulating film 151 is formed over the insulating film 149.

The conductive films 167a, 167b, and 167c each serving as a plug are formed in openings in the protective film 34 and the insulating films 149 and 151.

The conductive film 169a, 169b, and 169c each serving as a wiring are formed over the insulating film 151 and the conductive films 167a, 167b, and 167c.

The insulating film 153 is formed over the insulating film 151 and the conductive films 169a, 169b, and 169c.

The conductive films 171a, 171b, and 171c each serving as a plug are formed in openings in the insulating film 153.

The conductive films 173a, 173b, and 173c each serving as an electrode are formed over the insulating film 153 and the conductive film 171a, 171b, and 171c.

The element layer 11 also includes the protective film 34 that is in contact with the transistor 32, and the protective film 35 that is between the transistor 32 and the transistor 33a. The protective film 34 is in contact with the transistor 32 and formed in an opening in an insulating film provided between the protective films 34 and 35. Note that the insulating film provided between the protective films 34 and 35 is, but is not limited to, the insulating film 103.

The sealing region 22 is provided between the transistor 32 and the side surface of the element layer 11. In the sealing region 22, the protective film 34 and the protective film 35 are in contact with each other in an opening in the insulating film 103. The transistor 32 included in the element layer 11 is surrounded by the protective films 34 and 35.

Although description is given taking the CMOS circuit as an example in this embodiment, an analog switch circuit, a NOR circuit, an OR circuit, a NAND circuit, an AND circuit, and other circuits each can also be formed using the transistors 32 and 33a.

Note that unless otherwise specified, the specific structure of the semiconductor device, such as a material used for the semiconductor device and the structure of the semiconductor device, needs not to be limited to that described here. For example, the structures of the insulating film, the conductive film serving as a wiring, and the conductive film serving as a plug that are provided between the transistor 32 and the transistor 33a can be changed as appropriate. Furthermore, the structures of the insulating film, the conductive film serving as a wiring, and the conductive film serving as a plug that are provided between the transistor 33 and the conductive film serving as an electrode pad can be changed as appropriate.

The structures, methods, and the like described in this embodiment can be used in combination with any of the structures, methods, and the like described in the other embodiments, as appropriate. The structure described in this embodiment can be used in combination with any of the structures described in the other embodiments, as appropriate.

Embodiment 4

In this embodiment, the structures of transistors that can be used in Embodiments 1 to 3 will be described.
<Transistor Structure 1>

Figure 22A:
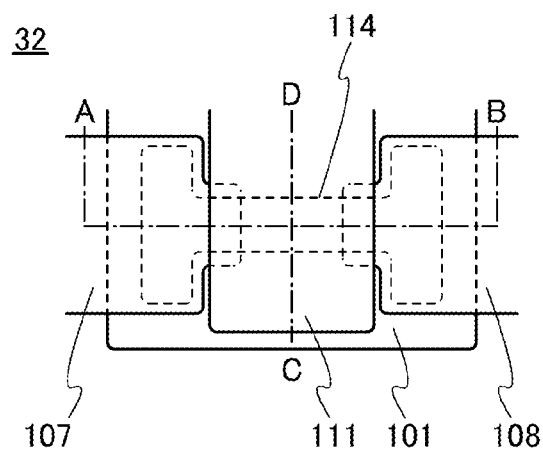
FIGS. 22A to 22C illustrate one embodiment of a transistor.
Figure 22B:
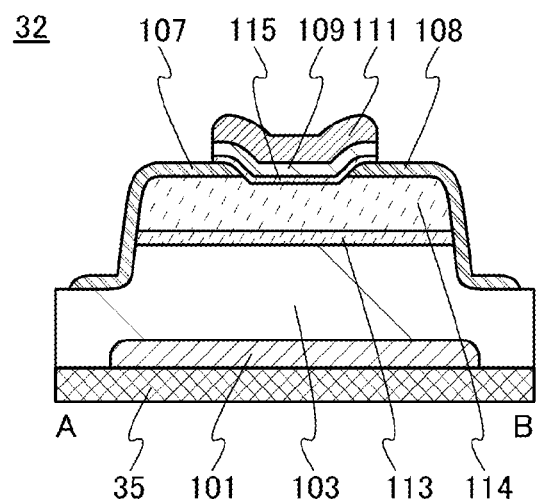
Figure 22C:
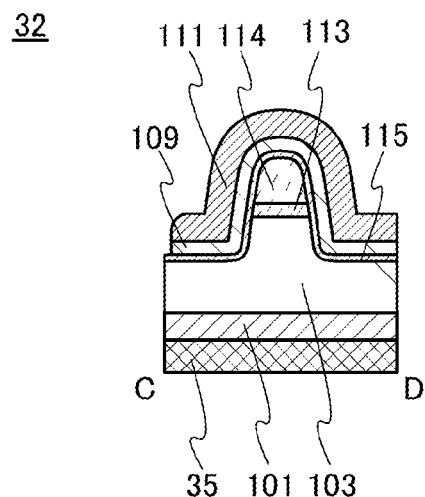

FIGS. 22A to 22C are a schematic top view and schematic cross-sectional views of the transistor 32 in a semiconductor device. FIG. 22A is the schematic top view of the transistor 32, FIG. 22B is the schematic cross-sectional view along dashed-dotted line A-B in FIG. 22A, and FIG. 22C is the schematic cross-sectional view along dashed-dotted line C-D in FIG. 22A. Note that, for example, the protective film 35, the insulating film 103, the oxide semiconductor film 113, the oxide semiconductor film 115, and the insulating film 109 are not illustrated in FIG. 22A for simplicity.

FIG. 22B is a schematic cross-sectional view of the transistor 32 in the channel length direction. FIG. 22C is a schematic cross-sectional view of the transistor 32 in the channel width direction. In the transistor illustrated in FIGS. 22A to 22C, a plurality of oxide semiconductor films are stacked between the insulating films 103 and 109.

The transistor 32 in FIGS. 22A to 22C includes the conductive film 101 over the protective film 35; the insulating film 103 over the protective film 35 and the conductive film 101; the oxide semiconductor film 113 in contact with the insulating film 103; the oxide semiconductor film 114 in contact with the oxide semiconductor film 113; the conductive films 107 and 108 in contact with at least the top surface and side surfaces of the oxide semiconductor film 114 and side surfaces of the oxide semiconductor film 113; the oxide semiconductor film 115 in contact with the oxide semiconductor film 114 and the conductive films 107 and 108; the insulating film 109 overlapping with the oxide semiconductor film 114 with the oxide semiconductor film 115 therebetween; and the conductive film 111 in contact with the insulating film 109 and overlapping with the oxide semiconductor film 114 with the oxide semiconductor film 115 and the insulating film 109 therebetween.

The insulating film 103 included in the transistor 32 includes a projection. The oxide semiconductor films 113 and 114 are formed over the projection. Thus, in the channel width direction, the conductive film 111 faces side surfaces of the oxide semiconductor films 113 and 114 with the insulating film 109 therebetween, as illustrated in FIG. 22C. In other words, when a voltage is applied to the conductive film 111, the oxide semiconductor films 113 and 114 are surrounded by the electric field of the conductive film 111 in the channel width direction. The transistor structure in which an oxide semiconductor film is surrounded by the electric field of the conductive film 111 is referred to as a surrounded channel (s-channel) structure. In the transistor with the s-channel structure, carriers flow in the whole oxide semiconductor film 111 (bulk) in an on state; as a result, an on-state current is increased. In an off state, the entire region of the channel region formed in the oxide semiconductor film 114 is depleted; as a result, an off-state current can be further reduced. Furthermore, the transistor 32 can have low off-state current even when the channel length thereof is shortened. Consequently, with the short channel length, the transistor 32 can have a high on-state current when in an on state and a low off-state current when in an off state.

Furthermore, the s-channel structure enables miniaturization of the transistor 32. Thus, the integration degree of the semiconductor device including the transistor can be increased. Moreover, high density of the semiconductor device can be achieved. For example, when provided with the transistor with a channel length of greater than or equal to 1 nm and less than 100 nm, preferably greater than or equal to 5 nm and less than or equal to 60 nm, the semiconductor device can have a higher integration degree.

The structure of the transistor 32 that is different from that of the transistor 32 in Embodiment 2 or 3 will be described below.

The oxide semiconductor film 114 can be formed using as appropriate any of the materials for the oxide semiconductor film 105 in the transistor 32 described in Embodiment 2.

The oxide semiconductor films 113 and 115 each contain one or more elements that are contained in the oxide semiconductor film 114. Therefore, interface scattering is unlikely to occur at the interface between the oxide semiconductor film 114 and each of the oxide semiconductor films 113 and 115. Thus, the transistor 32 can have a high field-effect mobility because the movement of carriers is not hindered at the interface.

The oxide semiconductor films 113 and 115 are typically each an In—Ga oxide film, an In—Zn oxide film, an In—Mg oxide film, an Zn—Mg oxide film, or an In-M-Zn oxide (M is Al, Ti, Ga, Y, Zr, Sn, La, Ce, Mg, or Nd), and has the energy level at the bottom of the conduction band closer to a vacuum level than that of the oxide semiconductor film 114. Typically, a difference between the energy at the bottom of the conduction band of the oxide semiconductor film 115 and the energy at the bottom of the conduction band of each of the oxide semiconductor films 113 and 115 is greater than or equal to 0.05 eV, greater than or equal to 0.07 eV, greater than or equal to 0.1 eV, or greater than or equal to 0.2 eV and also less than or equal to 2 eV, less than or equal to 1 eV, less than or equal to 0.5 eV, or less than or equal to 0.4 eV. That is, the difference between the electron affinity of the oxide semiconductor film 114 and the electron affinity of each of the oxide semiconductor films 113 and 115 is greater than or equal to 0.05 eV, greater than or equal to 0.07 eV, greater than or equal to 0.1 eV, or greater than or equal to 0.2 eV and also less than or equal to 2 eV, less than or equal to 1 eV, less than or equal to 0.5 eV, or less than or equal to 0.4 eV. Note that the electron affinity refers to an energy gap between the vacuum level and the bottom of the conduction band.

When the oxide semiconductor films 113 and 115 each contain a larger amount of Al, Ti, Ga, Y, Zr, Sn, La, Ce, Mg, or Nd than the amount of In in an atomic ratio, any of the following effects may be obtained: (1) The energy gap of each of the oxide semiconductor films 113 and 115 is widened; (2) The electron affinity of each of the oxide semiconductor films 113 and 115 is reduced; (3) Impurities from the outside are blocked; (4) The insulating property of each of the oxide semiconductor films 113 and 115 is more excellent than that of the oxide semiconductor film 114; (5) Oxygen vacancies are less likely to be generated because Al, Ti, Ga, Y, Zr, Sn, La, Ce, Mg, and Nd are metal elements that can be strongly bonded to oxygen.

Note that since the oxide semiconductor films 113 and 115 each have a more excellent insulating property than the oxide semiconductor film 114, they each have a function similar to that of a gate insulating film.

In the case of using an In-M-Zn oxide for the oxide semiconductor films 113 and 115, when Zn and O are eliminated from consideration, the proportion of In and the proportion of M are preferably less than 50 at. % and greater than or equal to 50 at. %, respectively, more preferably less than 25 at. % and greater than or equal to 75 at. %, respectively.

In the case where the oxide semiconductor films 113, 114, and 115 are each an In-M-Zn oxide film (M is Al, Ti, Ga, Y, Zr, Sn, La, Ce, Mg, or Nd), the proportion of M atoms in each of the oxide semiconductor films 113 and 115 is higher than the proportion of M atoms in the oxide semiconductor film 114. Typically, the proportion of M atoms in each of the oxide semiconductor films 113 and 115 is more than or equal to 1.5 times, preferably more than or equal to 2 times, more preferably more than or equal to 3 times as high as that in the oxide semiconductor film 114. The above-described elements represented by M are more strongly bonded to oxygen than indium is, and thus have a function of suppressing generation of oxygen vacancies in the oxide semiconductor films 113 and 115. That is, oxygen vacancies are less likely to be generated in the oxide semiconductor films 113 and 115 than in the oxide semiconductor film 114.

In the case where the oxide semiconductor film 114 is an In-M-Zn oxide film (M represents Al, Ti, Ga, Y, Zr, Sn, La, Ce, Mg, or Nd) and a target having the atomic ratio of metal elements of In:M:Zn=$x_1$:$y_1$:$z_1$ is used for forming the oxide semiconductor film 114, $x_1/y_1$ is preferably higher than or equal to 1/3 and lower than or equal to 6, more preferably higher than or equal to 1 and lower than or equal to 6, and $z_1/y_1$ is preferably higher than or equal to 1/3 and lower than or equal to 6, more preferably higher than or equal to 1 and lower than or equal to 6. Note that when $z_1/y_1$ is higher than or equal to 1 and lower than or equal to 6, a CAAC-OS film is easily formed as the oxide semiconductor film 114. Typical examples of the atomic ratio of the metal elements in the target include In:M:Zn=1:1:1, In:M:Zn=1:1:1.2, In:M:Zn=2:1:1.5, In:M:Zn=2:1:2.3, In:M:Zn=2:1:3, In:M:Zn=3:1:2, and In:M:Zn=4:1:4.1.

In the case where the oxide semiconductor films 113 and 115 are each an In-M-Zn oxide film (M is Al, Ti, Ga, Y, Zr, Sn, La, Ce, Mg, or Nd) and a target having the atomic ratio of metal elements of In:M:Zn=$x_2$:$y_2$:$z_2$ is used for forming each of the oxide semiconductor films 113 and 115, $x_2/y_2$ is preferably lower than $x_1/y_1$, and $z_2/y_2$ is preferably higher than or equal to 1/3 and lower than or equal to 6, more preferably higher than or equal to 1 and lower than or equal to 6. Note that when $z_2/y_2$ is higher than or equal to 1 and lower than or equal to 6, a CAAC-OS film is easily formed as each of the oxide semiconductor films 113 and 115. Typical examples of the atomic ratio of the metal elements of the target include In:M:Zn=1:3:2, In:M:Zn=1:3:4, In:M:Zn=1:3:6, In:M:Zn=1:3:8, In:M:Zn=1:4:4, In:M:Zn=1:4:5, In:M:Zn=1:4:6, In:M:Zn=1:4:7, In:M:Zn=1:4:8, In:M:Zn=1:5:5, In:M:Zn=1:5:6, In:M:Zn=1:5:7, In:M:Zn=1:5:8, and In:M:Zn=1:6:8.

Note that the atomic ratio of each of the oxide semiconductor films 113, 114, and 115 can allow a difference within a range of ±40% as an error.

The atomic ratio is not limited to the above, and the atomic ratio may be appropriately set in accordance with needed semiconductor characteristics.

The oxide semiconductor films 113 and 115 may have the same composition. For example, the oxide semiconductor films 113 and 115 may each be an In—Ga—Zn oxide with an atomic ratio of In:Ga:Zn=1:3:2, 1:3:4, or 1:4:5.

Alternatively, the oxide semiconductor films 113 and 115 may have different compositions. For example, the oxide semiconductor film 113 may be an In—Ga—Zn oxide with an atomic ratio of In:Ga:Zn=1:3:2, and the oxide semiconductor film 115 may be an In—Ga—Zn oxide with an atomic ratio of In:Ga:Zn=1:3:4 or 1:4:5.

The oxide semiconductor films 113 and 115 each have a thickness of greater than or equal to 3 nm and less than or equal to 100 nm, or greater than or equal to 3 nm and less than or equal to 50 nm.

Here, it is preferred that the thickness of the oxide semiconductor film 114 be at least larger than that of the oxide semiconductor film 113. The thicker the oxide semiconductor film 114 is, the higher the on-state current of the transistor is. The thickness of the oxide semiconductor film 113 is set such that formation of an interface state at the interface with the oxide semiconductor film 114 is inhibited. For example, the thickness of the oxide semiconductor film 114 is larger than that of the oxide semiconductor film 113, preferably 2 or more times, more preferably 4 or more times, still more preferably 6 or more times as large as that of the oxide semiconductor film 113. Note that the above does not apply in the case where the on-state current of the transistor does not need to be increased, and the thickness of the oxide semiconductor film 113 may be larger than that of the oxide semiconductor film 114.

The thickness of the oxide semiconductor film 115 is set, in a manner similar to that of the oxide semiconductor film 113, such that formation of an interface state at the interface with the oxide semiconductor film 114 is inhibited. For example, the thickness of the oxide semiconductor film 115 is set smaller than or equal to that of the oxide semiconductor film 113. If the oxide semiconductor film 115 is thick, it might become difficult for the electric field from the conductive film 101 to reach the oxide semiconductor film 114; thus, it is preferred that the oxide semiconductor film 115 be thin. In addition, to prevent oxygen contained in the oxide semiconductor film 115 from diffusing into and oxidizing the conductive films 107 and 108, it is preferred that the oxide semiconductor film 115 be thin. For example, the oxide semiconductor film 115 is preferably thinner than the oxide semiconductor film 114. Note that the thickness of the oxide semiconductor film 115 is not limited to the above, and is set as appropriate depending on a driving voltage of the transistor in consideration of the withstand voltage of the insulating film 109.

Hydrogen contained in the oxide semiconductor films 113, 114, and 115 reacts with oxygen bonded to a metal atom to be water, and in addition, an oxygen vacancy is formed in a lattice from which oxygen is released (or a portion from which oxygen is released). Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor including an oxide semiconductor that contains hydrogen is likely to be normally on.

Accordingly, hydrogen is preferably reduced as much as possible as well as the oxygen vacancies in the oxide semiconductor films 113, 114, and 115 like in the oxide semiconductor film 105.

Furthermore, silicon and carbon are preferably reduced as much as possible in the oxide semiconductor films 113, 114, and 115 like in the oxide semiconductor film 105.

Furthermore, the concentration of an alkali metal or an alkali earth metal is preferably reduced as much as possible in the oxide semiconductor films 113, 114, and 115 like in the oxide semiconductor film 105.

Furthermore, the concentration of nitrogen is preferably reduced as much as possible in the oxide semiconductor films 113, 114, and 115 like in the oxide semiconductor film 105.

When impurities in the oxide semiconductor films 113, 114, and 115 are reduced, the carrier density of the oxide semiconductor films can be lowered like in the oxide semiconductor film 105.

The use of oxide semiconductor films each having a low impurity concentration and a low density of defect states as the oxide semiconductor film 113, 114, and 115 like the oxide semiconductor film 105 allows formation of a transistor having more excellent electric characteristics.

Any of the crystal structures described as those of the oxide semiconductor film 105 can be employed as the crystal structures of the oxide semiconductor film 113, 114, and 115.

By providing an oxide semiconductor film in which oxygen vacancies are less likely to be generated than in the oxide semiconductor film 114, over and under and in contact with the oxide semiconductor film 114, oxygen vacancies in the oxide semiconductor film 114 can be reduced. Further, since the oxide semiconductor film 114 is in contact with the oxide semiconductor films 113 and 115 containing one or more metal elements contained in the oxide semiconductor film 114, the densities of interface levels at the interface between the oxide film 113 and the oxide semiconductor film 115 and at the interface between the oxide semiconductor films 114 and 115 are extremely low. Thus, after oxygen is added to the oxide semiconductor film 113 and 115, the oxygen is transferred from the oxide semiconductor film 113 and 115 to the oxide semiconductor film 114 by heat treatment. The oxygen is hardly trapped by the interface levels at this time, and the oxygen in the oxide semiconductor film 113 and 115 can be efficiently transferred to the oxide semiconductor film 114. Accordingly, oxygen vacancies in the oxide semiconductor film 114 can be reduced. Since oxygen is added to the oxide semiconductor film 113 and 115, oxygen vacancies in the oxide semiconductor films 113 and 115 can be reduced. In other words, the density of localized levels of at least the oxide semiconductor film 114 can be reduced.

In addition, when the oxide semiconductor film 114 is in contact with an insulating film containing a different constituent element (e.g., a silicon oxide film), an interface level might be formed and the interface level might form a channel. In such a case, a second transistor having a different threshold voltage might appear, changing an apparent threshold voltage of the transistor. However, since the oxide semiconductor films 113 and 115 containing one or more metal elements contained in the oxide semiconductor film 114 are in contact with the oxide semiconductor film 114, an interface state is not easily formed at the interfaces between the oxide semiconductor films 113 and 114 and between the oxide semiconductor films 115 and 114.

The oxide semiconductor films 113 and 115 also serve as barrier films that prevent constituent elements of the insulating films 103 and 109 from entering the oxide semiconductor film 114 and forming an impurity level.

For example, in the case of using silicon-containing insulating films as the insulating films 103 and 109, silicon in the insulating films 103 and 109 or carbon which might be contained in the insulating films 103 and 109 enters the oxide semiconductor film 113 or 115 to a depth of several nanometers from the interface in some cases. An impurity such as silicon or carbon entering the oxide semiconductor film 114 forms an impurity level. The impurity level serves as a donor and generates an electron, so that the oxide semiconductor film 114 might become n-type.

However, when the thicknesses of the oxide semiconductor films 113 and 115 are each larger than several nanometers, the impurity such as silicon or carbon does not reach the oxide semiconductor film 114, so that the influence of impurity levels is suppressed.

Thus, providing the oxide semiconductor films 113 and 115 makes it possible to reduce variations in electric characteristics of the transistor, such as a threshold voltage.

In the case where a channel is formed at the interfaces between the insulating film 103 and the oxide semiconductor film 114 and between the gate insulating film 109 and the oxide semiconductor film 114, interface scattering occurs at the interfaces and the field-effect mobility of the transistor is decreased. However, since the oxide semiconductor films 113 and 115 each containing one or more of metal elements contained in the oxide semiconductor film 114 are provided in contact with the oxide semiconductor film 114, scattering of carriers does not easily occur at the interfaces between the oxide semiconductor film 114 and each of the oxide semiconductor films 113 and 115, and thus the field-effect mobility of the transistor can be increased.

In this embodiment, the number of oxygen vacancies in the oxide semiconductor film 114, and moreover, the number of oxygen vacancies in the oxide semiconductor films 113 and 115 in contact with the oxide semiconductor film 114 can be reduced; thus, the density of localized levels of the oxide semiconductor film 114 can be reduced. As a result, the transistor 32 in this embodiment has a small change in the threshold voltage and high reliability. Furthermore, the transistor 32 in this embodiment has excellent electric characteristics.

Note that in the oxide semiconductor film 114, a channel formation region refers to a region that overlaps with the conductive film 111 and is located between the conductive films 107 and 108. Furthermore, a channel region refers to a region through which a current mainly flows in the channel formation region. Here, a channel region is part of the oxide semiconductor film 114, which is positioned between the conductive films 107 and 108. A channel length refers to the distance between the conductive films 107 and 108.

A side surface of the insulating film 109 may be substantially aligned with side surfaces of the conductive film 111 and the oxide semiconductor film 115 as illustrated in FIG. 22B. Alternatively, the side surface of the insulating film 109 may be on the outside of the side surface of the conductive film 111 as described in Embodiment 2.

The transistor illustrated in FIGS. 22A to 22C can be formed by forming a stack of the oxide semiconductor films 113 and 114 instead of the oxide semiconductor film 105 illustrated in FIG. 19A in the forming method of the transistor described in Embodiment 2.

Next, the conductive films 107 and 108 are formed, and then, an oxide semiconductor film to be the oxide semiconductor film 115, an insulating film to be the insulating film 109, and a conductive film to be the conductive film 111 are formed. After that, a mask is formed over the conductive film through a lithography process. Then, the oxide semiconductor film, the insulating film, and the conductive film are each etched using the mask, so that the oxide semiconductor film 115, the insulating film 109, and the conductive film 111 can be formed. Through the above steps, the transistor 32 can be formed.

<Band Structure>

Here, a band structure will be described. For easy understanding, the energy level (Ec) of the bottom of the conduction band of each of the insulating film 103, the oxide semiconductor film 113, the oxide semiconductor film 114, the oxide semiconductor film 115, and the insulating film 109 is shown in the band structure.

Figure 23A:
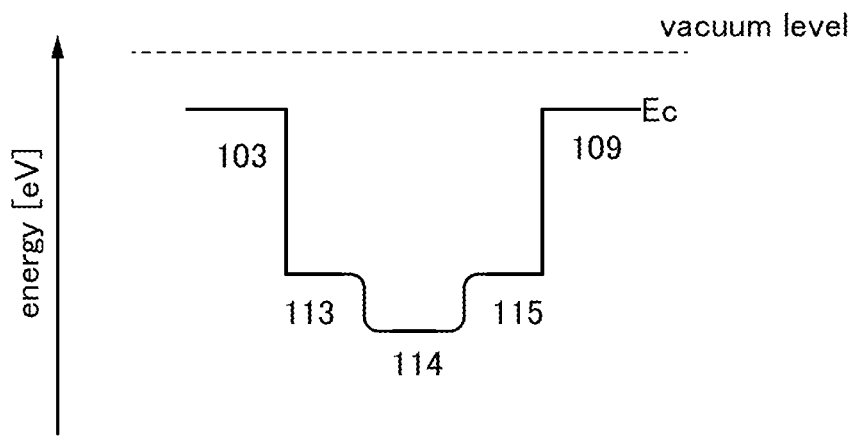
FIGS. 23A and 23B illustrate band structures of transistors.
Figure 23B:
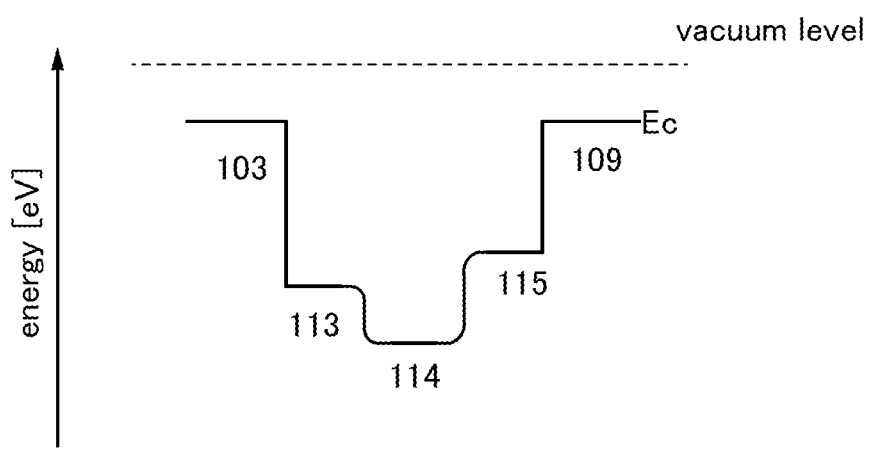

As illustrated in FIGS. 23A and 23B, the energy levels (Ec) of the bottoms of the conduction bands changes continuously within the oxide semiconductor films 113, 114, and 115. This is probably because the constituent elements are common among the oxide semiconductor films 113, 114, and 115 and thus oxygen is easily diffused among the oxide semiconductor films 113, 114, and 115. Thus, the oxide semiconductor films 113, 114, and 115 have a continuous physical property although they are a stack of films having different compositions.

The oxide semiconductor films that are stacked and contain the same main components have not only a simple layered structure of the layers but also a continuous energy band (here, in particular, a well structure having a U shape in which the bottom of the conduction band continuously varies among the layers (U-shaped well)). In other words, the layered structure is formed such that there exists no impurities that form a defect level such as a trap center or a recombination center at each interface. If impurities exist between the stacked layers in the multilayer film, the continuity of the energy band is lost and carriers disappear by a trap or recombination.

Note that FIG. 23A illustrates the case where the energy level (Ec) of the bottom of the conduction band of the oxide semiconductor film 113 and that of the oxide semiconductor film 115 are equal to each other; however, they may be different from each other. For example, FIG. 23B illustrates part of the band structure of the case where the energy level (Ec) of the bottom of the conduction band of the oxide semiconductor film 115 is closer to the vacuum level than that of the oxide semiconductor film 113 is.

As illustrated in FIGS. 23A and 23B, the oxide semiconductor film 114 serves as a well and a channel of the transistor 32 is formed in the oxide semiconductor film 114. Note that since the energy levels (Ec) of the bottoms of the conduction bands of the oxide semiconductor films 113, 114, and 115 change continuously, a channel having a U-shaped well structure can also be referred to as a buried channel.

Note that trap levels due to impurities or defects might be formed in the vicinity of the interface between an insulating film such as a silicon oxide film and each of the oxide semiconductor films 113 and 115. The oxide semiconductor film 114 can be located away from the trap levels owing to the existence of the oxide semiconductor films 113 and 115. However, when the energy difference between the Ec of the oxide semiconductor film 113 or the oxide semiconductor film 115 and the Ec of the oxide semiconductor film 114 is small, electrons in the oxide semiconductor film 114 might reach the trap levels across the energy difference. When the electron is trapped in the trap level, negative fixed charge is generated at the interface with the insulating film, whereby the threshold voltage of the transistor is shifted in the positive direction.

Thus, to reduce a change in the threshold voltage of the transistor, an energy difference between the Ec of the oxide semiconductor film 114 and the Ec of each of the oxide semiconductor films 113 and 115 is necessary. The energy difference is preferably greater than or equal to 0.1 eV, more preferably greater than or equal to 0.2 eV.

The oxide semiconductor films 113, 114, and 115 preferably include a crystal portion. In particular, when crystals whose c-axes are aligned are used, the transistor can have stable electric characteristics.

In the band structure shown in FIG. 23B, instead of the oxide semiconductor film 115, an In—Ga oxide (e.g., an In—Ga oxide with an atomic ratio of In:Ga=7:93) may be provided between the oxide semiconductor film 114 and the gate insulating film 109.

As the oxide semiconductor 114, an oxide semiconductor film having an electron affinity higher than those of the oxide semiconductor films 113 and 115 is used. For example, as the oxide semiconductor film 114, an oxide semiconductor film having an electron affinity higher than that of each of the oxide semiconductor films 113 and 115 by 0.07 eV or higher and 1.3 eV or lower, preferably 0.1 eV or higher and 0.7 eV or lower, and more preferably 0.2 eV or higher and 0.4 eV or lower is used.

Since the transistor described in this embodiment includes the oxide semiconductor films 113 and 115 each containing one or more kinds of metal elements contained in the oxide semiconductor film 114, interface levels are unlikely to occur at the interface between the oxide semiconductor films 113 and 114 and the interface between the oxide semiconductor films 115 and 114. Thus, providing the oxide semiconductor films 113 and 115 makes it possible to reduce variations or changes in electric characteristics of the transistor, such as a threshold voltage.

When a channel is formed at the interface between the insulating film 109 and the oxide semiconductor film 114, interface scattering occurs at the interface and the field-effect mobility of the transistor is reduced in some cases. In the transistor of this structural example, however, the oxide semiconductor film 115 contains one or more of metal elements contained in the oxide semiconductor film 114. Therefore, scattering of carriers is less likely to occur at the interface between the oxide semiconductor films 114 and 115, and thus the field-effect mobility of the transistor can be increased.

<Transistor Structure 2>

A transistor including the oxide semiconductor film 114 having a shape different from that of the oxide semiconductor film 114 included in the transistor 32 illustrated in FIGS. 22A to 22C will be described with reference to FIGS. 24A to 24C.

Figure 24A:
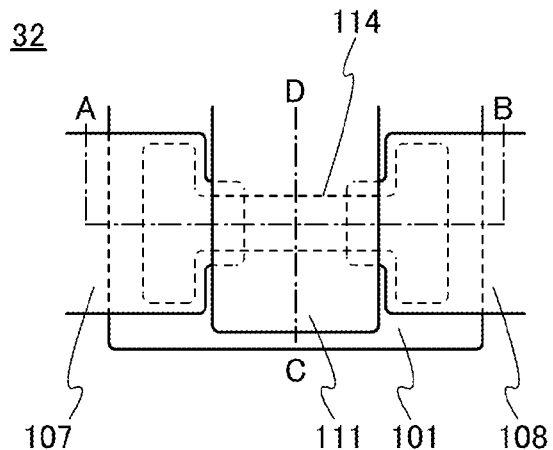
FIGS. 24A to 24C illustrate one embodiment of a transistor.
Figure 24B:
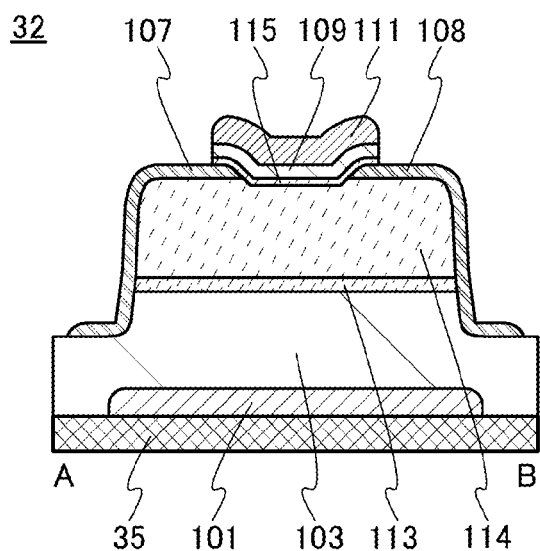
Figure 24C:
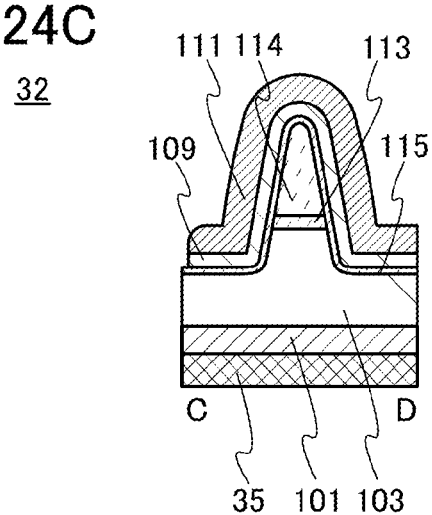

FIGS. 24A to 24C are a schematic top view and schematic cross-sectional views of the transistor 32 of a semiconductor device. FIG. 24A is the schematic top view of the transistor 32, FIG. 24B is the schematic cross-sectional view along dashed-dotted line A-B in FIG. 24A, and FIG. 24C is the schematic cross-sectional view along dashed-dotted line C-D in FIG. 24A.

FIG. 24B is the schematic cross-sectional view in the channel length direction of the transistor 32, and FIG. 24C is the schematic cross-sectional view in the channel width direction of the transistor 32.

Note that, for example, the protective film 35, the insulating film 103, the oxide semiconductor film 113, and the insulating film 109 are not illustrated in FIG. 24A for simplicity.

As illustrated in FIG. 24C, the transistor 32 includes the oxide semiconductor film 114 whose cross section in the channel width direction is substantially triangular or substantially trapezoidal. Here, the substantial triangle and the substantial trapezoid refer to the shapes in which the angle between the bottom surface in contact with the oxide semiconductor film 113 and the side surface in contact with the oxide semiconductor film 115 in the oxide semiconductor film 114 is greater than 0° and less than or equal to 85° or greater than or equal to 30° and less than or equal to 80°. In addition, the surface on the side opposite to the bottom surface may have a sharp corner or a rounded corner. The shape may have a vertex on the side opposite to the bottom surface.

Compared with an upper region in an oxide semiconductor film whose cross section in the channel width direction is substantially rectangular, a region in the oxide semiconductor film 114 whose cross section is substantially triangular or substantially trapezoidal has a small cross-sectional area on the insulating film 109 side. This decreases a region having high current density on the insulating film 109 side. As a result, an excellent S value and an increased on-state current can be achieved.

A method for forming the oxide semiconductor film 114 with the substantially triangular or trapezoidal cross section will be described. The oxide semiconductor films 113 and 114 are formed instead of the oxide semiconductor film 105 illustrated in FIG. 19A, and a mask is formed over the oxide semiconductor film 114 through a lithography process. Then, the oxide semiconductor film 114 is etched while the mask is made to recede. Thus, the oxide semiconductor film whose cross section in the channel width direction is substantially triangular or substantially trapezoidal as illustrated in FIG. 24C can be formed.

<Transistor Structure 3>

The transistor 32 that is different from that illustrated in FIGS. 22A to 22C in the shapes of the oxide semiconductor film 115 and the insulating film 109 will be described with reference to FIGS. 25A and 25B.

Figure 25A:
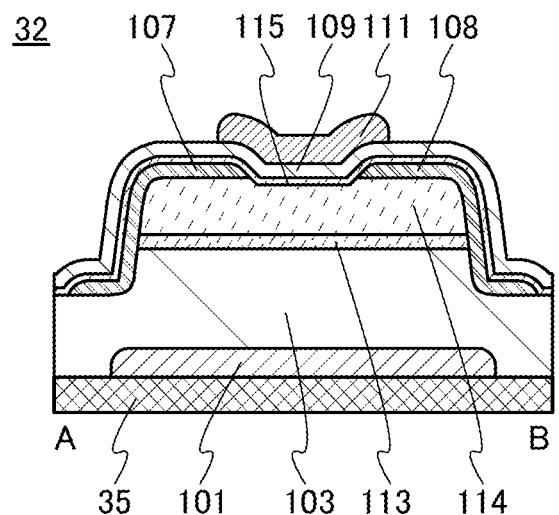
FIGS. 25A and 25B illustrate embodiments of transistors.

The transistor 32 illustrated in FIG. 25A includes the oxide semiconductor film 115 in contact with the oxide semiconductor film 114 and the conductive films 107 and 108, and the insulating film 109 in contact with the oxide semiconductor film 115. The insulating film 109 is in contact with the conductive film 111.

The oxide semiconductor film 115 and the insulating film 109 included in the transistor 32 are not divided for element isolation and cover the conductive films 107 and 108 and the insulating film 103.

The transistor 32 illustrated in FIG. 25A can be formed by forming a stack of the oxide semiconductor films 113 and 114 instead of the oxide semiconductor film 105 illustrated in FIG. 19A in the forming method of the transistor described in Embodiment 2.

Next, the conductive films 107 and 108 are formed, and then, the oxide semiconductor film 115, the insulating film 109, and a conductive film to be the conductive film 111 are formed. After that, a mask is formed over the conductive film through a lithography process. Then, the conductive film is etched using the mask, so that the conductive film 111 can be formed. Through the above steps, the transistor 32 can be formed.

Figure 25B:
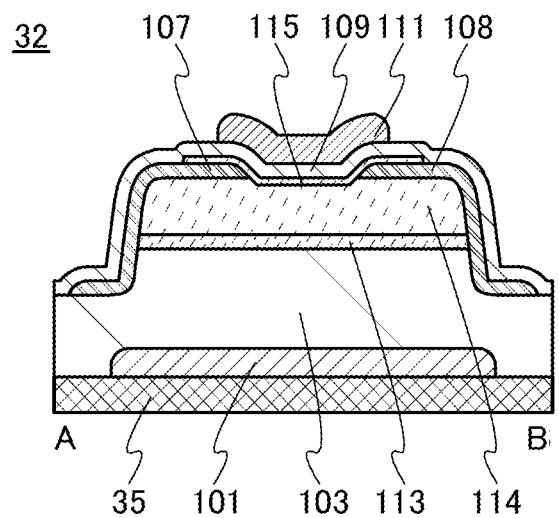

The transistor 32 illustrated in FIG. 25B includes the oxide semiconductor film 115 in contact with the oxide semiconductor film 114 and the conductive films 107 and 108, and the insulating film 109 in contact with the oxide semiconductor film 115. The insulating film 109 is in contact with the conductive film 111.

End portions of the oxide semiconductor film 115 included in the transistor 32 do not overlap with the conductive film 111. The insulating film 109 is not divided for element isolation and cover the conductive films 107 and 108 and the insulating film 103.

The transistor 32 illustrated in FIG. 25B can be formed by forming a stack of the oxide semiconductor films 113 and 114 instead of the oxide semiconductor film 105 illustrated in FIG. 6A in the forming method of the transistor described in Embodiment 2.

Next, an oxide semiconductor film to be the oxide semiconductor film 115 is formed, and then a mask is formed over the oxide semiconductor film through a lithography process. Subsequently, the oxide semiconductor film is etched using the mask to form the oxide semiconductor film 115. After that, the mask is removed.

Next, the insulating film 109 is formed over the oxide semiconductor film 115. Then, the conductive film 111 is formed over the insulating film 109. Through the above steps, the transistor 32 can be formed.

<Transistor Structure 4>

Next, transistors each having a layered structure of oxide semiconductor films different from those in the transistors illustrated in FIGS. 22A to 25B will be described with reference to FIGS. 26A to 26C.

Figure 26A:
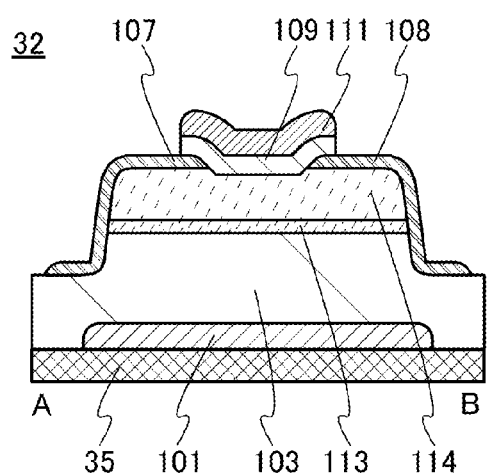
FIGS. 26A to 26C illustrate embodiments of transistors.

The transistor 32 illustrated in FIG. 26A is different from the transistor 32 illustrated in FIG. 22B in not including the oxide semiconductor film 115. That is, the transistor 32 in FIG. 26A includes the insulating film 109 in contact with the oxide semiconductor film 114, the conductive films 107 and 108, and the conductive film 111.

Figure 26B:
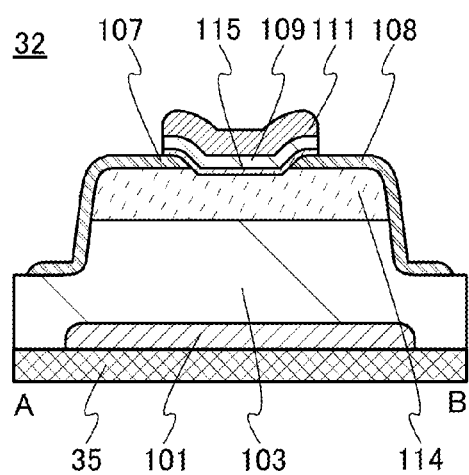

The transistor 32 illustrated in FIG. 26B is different from the transistor 32 illustrated in FIG. 22B in not including the oxide semiconductor film 113. That is, the transistor 32 in FIG. 26B includes the insulating film 103 in contact with the conductive film 101 and the oxide semiconductor film 114.

Figure 26C:
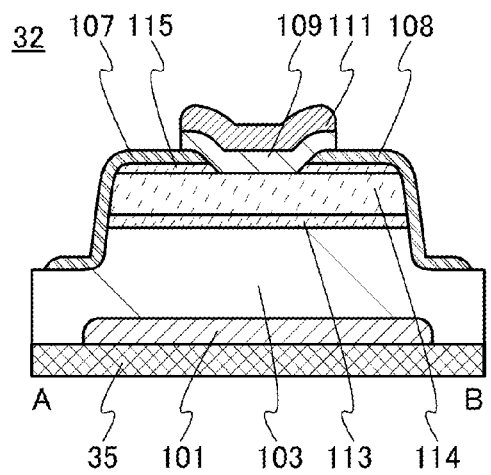

The transistor 32 illustrated in FIG. 26C is different from the transistor 32 illustrated in FIG. 22B in including the oxide semiconductor film 115 between the oxide semiconductor film 114 and the conductive films 107 and 108. That is, the transistor 32 in FIG. 26C includes the oxide semiconductor film 115 in contact with the oxide semiconductor film 114, the conductive films 107 and 108, and the insulating film 109. The oxide semiconductor film 115 is located between the oxide semiconductor film 114 and the conductive films 107 and 108.

<Transistor Structure 5>

The transistor 32 that is different from that illustrated in FIGS. 22A to 22C in the shapes of the conductive films 107 and 108 will be described with reference to FIGS. 27A to 27D.

Figure 27A:
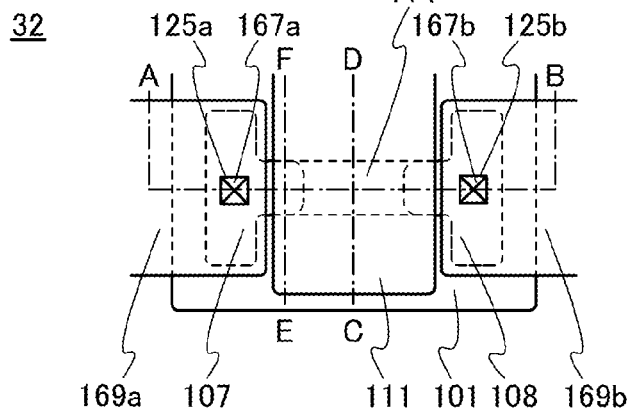
FIGS. 27A to 27D illustrate one embodiment of a transistor.
Figure 27B:
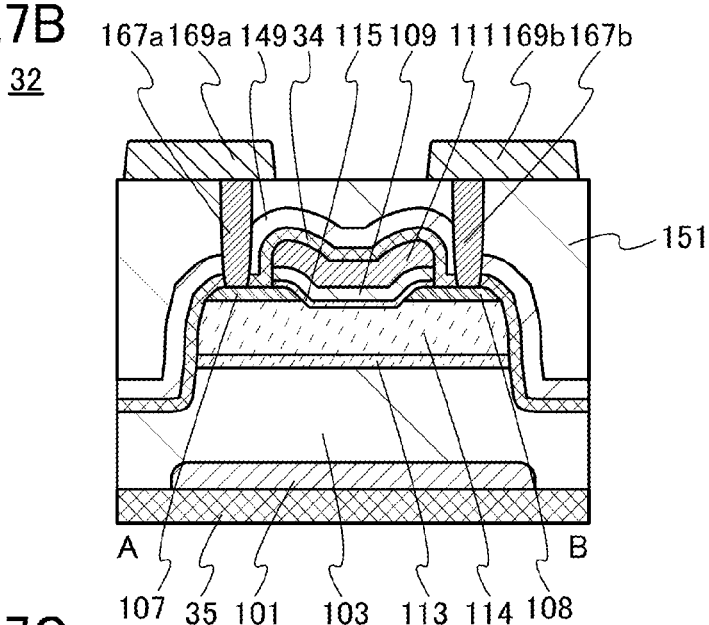
Figure 27C:
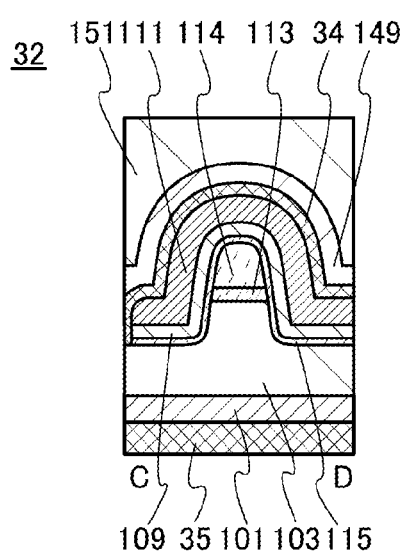
Figure 27D:
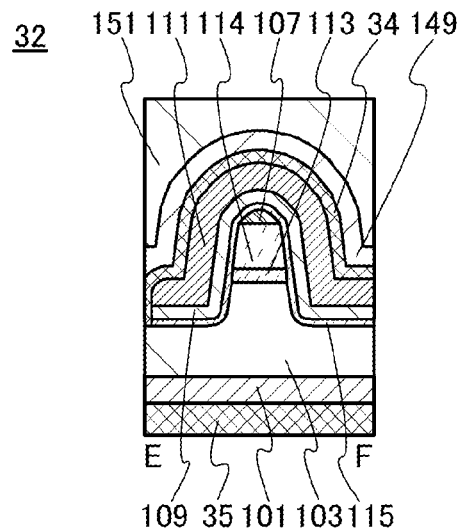

FIGS. 27A to 27D are a schematic top view and schematic cross-sectional views of the transistor 32 of a semiconductor device. FIG. 27A is the schematic top view of the transistor 32, FIG. 27B is the schematic cross-sectional view along dashed-dotted line A-B in FIG. 27A, FIG. 27C is the schematic cross-sectional view along dashed-dotted line C-D in FIG. 27A, and FIG. 27D is the schematic cross-sectional view along dashed-dotted line E-F in FIG. 27A.

FIG. 27B is the schematic cross-sectional view in the channel length direction of the transistor 32, FIG. 27C is the schematic cross-sectional view in the channel width direction of the transistor 32, and FIG. 27D is the schematic cross-sectional view in the channel width direction of the transistor 32 showing the region where a source or drain region and the oxide semiconductor films are stacked.

Note that, for example, the protective film 35, the insulating film 103, the oxide semiconductor film 113, the insulating film 109, the protective film 34, and the insulating films 149 and 151 are not illustrated in FIG. 27A for simplicity.

The transistor 32 illustrated in FIGS. 27A to 27D includes the pair of conductive films 107 and 108 that is not in contact with the side surfaces of the oxide semiconductor films 113 and the oxide semiconductor film 114 and are in contact with the top surface of the oxide semiconductor film 114. The protective film 34 and the insulating films 149 and 151 may be provided over the transistor 32. Furthermore, the conductive films 167a and 167b in contact with the pair of conductive films 107 and 108 in openings 125a and 125b in the protective film 34 and the insulating films 149 and 151 may be provided.

Since side surfaces of the oxide semiconductor films 113 and 114 are not in contact with the pair of conductive films 107 and 108 in the channel width direction as illustrated in FIG. 27D, the pair of conductive films 107 and 108 do not block the electric field of the conductive film 111. This can increase the effect of the electric field of the conductive film 111 at the side surfaces of the oxide semiconductor films 113 and 114, and the transistor can have a small subthreshold swing (hereinafter referred to as S value) and a high field-effect mobility. Note that the S value is the value of a gate voltage necessary to change the on-state current by one digit; a smaller S value means better transistor characteristics.

Next, a forming method of the transistor 32 will be described with reference to FIGS. 28A to 28D. Here, the forming method of the transistor 32 will be described with reference to schematic cross-sectional views along dashed-dotted line A-B and C-D in FIG. 27A.

Figure 28A:
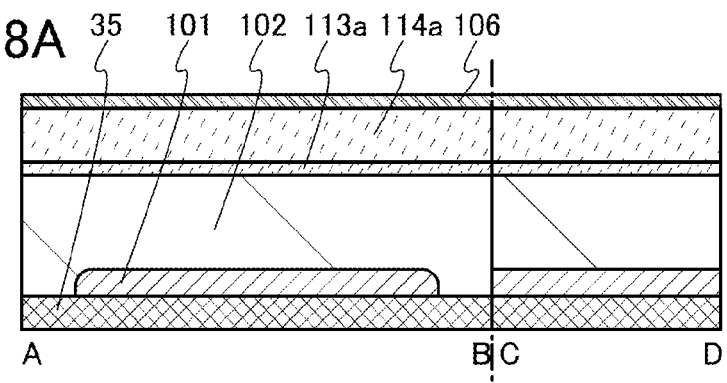
FIGS. 28A to 28D illustrate one embodiment of a method for forming a transistor.
Figure 28B:
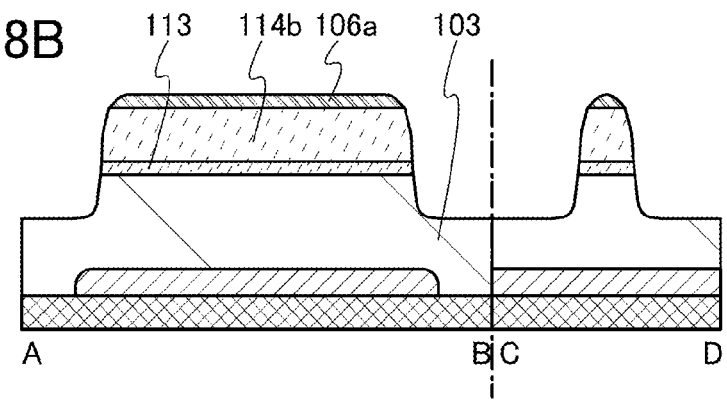
Figure 28C:
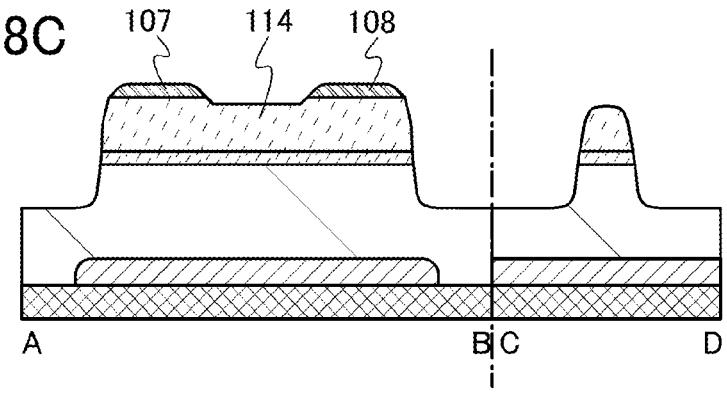

The conductive film 101, the insulating film 102, the oxide semiconductor film 113a, and an oxide semiconductor film 114a are formed over the protective film 35 as illustrated in FIG. 28A. Then, the conductive film 106 is formed over the oxide semiconductor film 114a.

Next, a mask is formed over the conductive film 106 through a lithography process, and then the oxide semiconductor film 113a, the oxide semiconductor film 114a, and the conductive film 106 are etched using the mask to form the oxide semiconductor film 113, an oxide semiconductor film 114b, and a conductive film 106a. After that, the mask is removed. In this step, part of the insulating film 102 is also etched, so that the insulating film 103 is formed (see FIG. 28B).

In the etching step, the shape of a resist mask is changed, so that if etching is performed using only the resist mask without providing a hard mask, the shapes of the oxide semiconductor films 113 and 114b might be different from predetermined shapes. This problem arises outstandingly in micropatterning such as electron beam exposure, liquid immersion exposure, or EUV exposure. However, since the conductive film 106a provided over the oxide semiconductor film 114b serves as a hard mask here, the oxide semiconductor films 113 and 114b with predetermined shapes can be obtained.

Then, a mask is formed over the conductive film 106a through a lithography process, and the conductive film 106a is etched using the mask to form the conductive films 107 and 108. In the case of using a positive-type photoresist as the mask, the exposing time can be shortened. In the etching step, part of the oxide semiconductor film 114b may be etched to form a depression. Here, the oxide semiconductor film having a depression is referred to as the oxide semiconductor film 114 (see FIG. 28C).

Figure 28D:
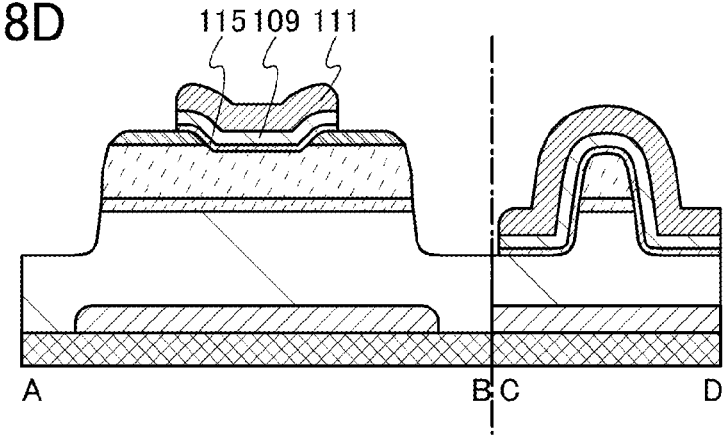

Sequentially, the oxide semiconductor film 115, the insulating film 109, and the conductive film 111 are formed as illustrated in FIG. 28D, whereby the transistor 32 illustrated in FIGS. 27A to 27D can be formed.

<Transistor Structure 6>

Figure 29:
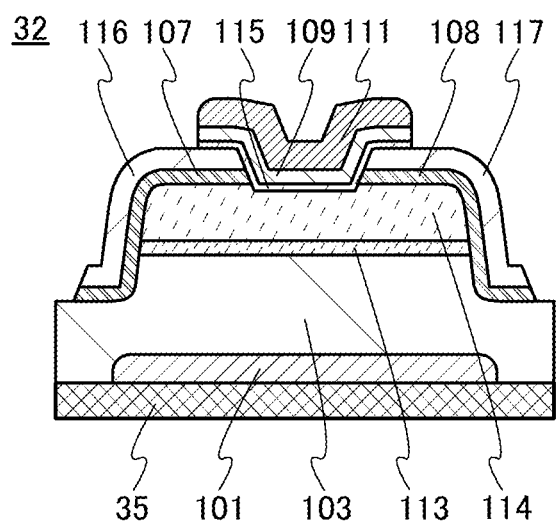
FIG. 29 illustrates one embodiment of a transistor.

A transistor whose structure is different from structures of the transistor 32 illustrated in FIGS. 22A to 28D will be described with reference to FIG. 29. FIG. 29 is a schematic cross-sectional view of the transistor 32 in the channel length direction.

As illustrated in FIG. 29, the transistor 32 includes the conductive film 101 over the protective film 35; the insulating film 103 over the protective film 35 and the conductive film 101; the oxide semiconductor film 113 in contact with the insulating film 103; the oxide semiconductor film 114 in contact with the oxide semiconductor film 113; the conductive films 107 and 108 in contact with at least the top surface and side surfaces of the oxide semiconductor film 114 and side surfaces of the oxide semiconductor film 113; an insulating film 116 over the conductive film 107; an insulating film 117 over the conductive film 108; the oxide semiconductor film 115 over the oxide semiconductor film 114, the conductive films 107 and 108, the insulating films 116 and 117; the insulating film 109 over the oxide semiconductor film 115; and the conductive film 111 over the insulating film 109.

The insulating films 116 and 117 can be formed using any of the materials for the insulating film 109 as appropriate. The thickness of each of the insulating films 116 and 117 is large enough to reduce the parasitic capacitance between the conductive film 111 and the conductive films 107 and 108 and is preferably, for example, greater than or equal to 50 nm and less than or equal to 500 nm.

The transistor 32 in FIG. 29 includes the insulating films 116 and 117 as well as the oxide semiconductor film 115 and the insulating film 109 between the conductive film 111 serving as a gate electrode and the conductive films 107 and 108 serving as source and drain electrodes. Thus, parasitic capacitance between the conductive film 111 and the conductive films 107 and 108 can be reduced, increasing the on-state current and the field-effect mobility of the transistor.

<Transistor Structure 7>

Figure 30:
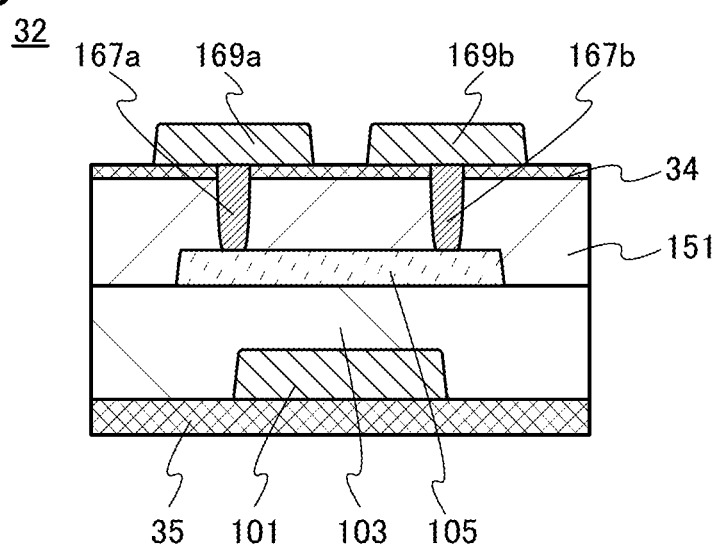
FIG. 30 illustrates one embodiment of a transistor.

A transistor whose structure is different from structures of the transistor 32 illustrated in FIGS. 22A to 29 will be described with reference to FIG. 30. FIG. 30 is a schematic cross-sectional view of the transistor 32 in the channel length direction.

As illustrated in FIG. 30, the transistor 32 includes the conductive film 101 over the protective film 35; the insulating film 103 over the protective film 35 and the conductive film 101; the oxide semiconductor film 105 in contact with the insulating film 103; the insulating film 151 over the oxide semiconductor film 105; the protective film 34 over the insulating film 151; the conductive films 167a and 167b in contact with the oxide semiconductor film 105 in openings in the insulating film 151 and the protective film 34; and the conductive films 169a and 169b over the protective film 34 and the conductive films 167a and 167b.

The structures, methods, and the like described in this embodiment can be used in combination with any of the structures, methods, and the like described in the other embodiments, as appropriate. The structure described in this embodiment can be used in combination with any of the structures described in the other embodiments, as appropriate.

Embodiment 5

In this embodiment, a structure example of a display device of one embodiment of the present invention will be described.

<Structure Example>

Figure 31A:
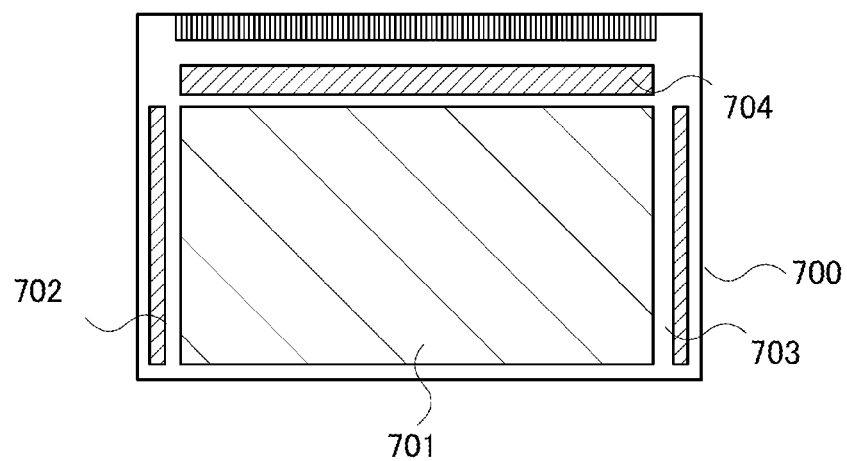
FIGS. 31A to 31C illustrate display devices.
Figure 31B:
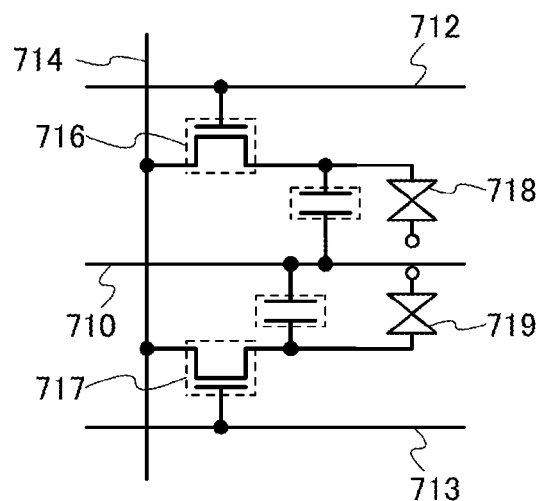
Figure 31C:
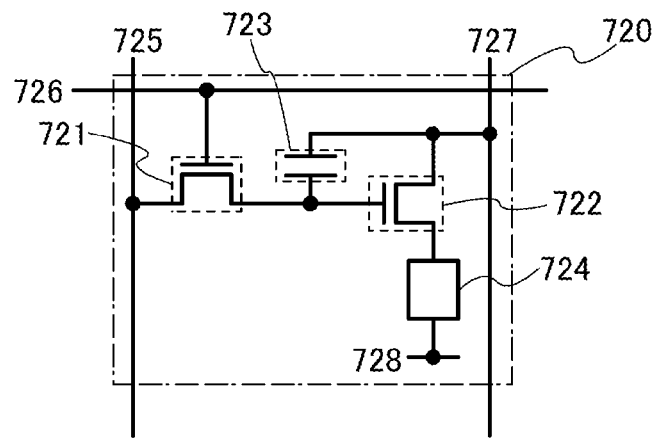

FIG. 31A is a schematic top view of the display device of one embodiment of the present invention. FIG. 31B is a circuit diagram illustrating a pixel circuit that can be used in the case where a liquid crystal element is used in a pixel in the display device of one embodiment of the present invention. FIG. 31C is a circuit diagram illustrating a pixel circuit that can be used in the case where an organic EL element is used in a pixel in the display device of one embodiment of the present invention.

A transistor in a pixel portion can be formed in accordance with the above embodiment. Furthermore, the transistor can easily be an n-channel transistor; thus, part of a driver circuit that can be formed using an n-channel transistor in the driver circuit is formed over the same substrate as the transistor of the pixel portion. With the use of the transistor described in the above embodiment for the pixel portion or the driver circuit in this manner, a highly reliable display device can be provided.

FIG. 31A illustrates an example of a schematic top view of an active matrix display device. A pixel portion 701, a first scan line driver circuit 702, a second scan line driver circuit 703, and a signal line driver circuit 704 are formed over the substrate 130 of the display device. In the pixel portion 701, a plurality of signal lines extended from the signal line driver circuit 704 are arranged and a plurality of scan lines extended from the first scan line driver circuit 702 and the second scan line driver circuit 703 are arranged. Note that pixels each including a display element are provided in matrix in respective regions in each of which the scan line and the signal line intersect with each other. Furthermore, the substrate 130 in the display device is connected to a timing control circuit (also referred to as a controller or a controller IC) through a connection portion such as a flexible printed circuit (FPC).

In FIG. 31A, the first scan line driver circuit 702, the second scan line driver circuit 703, and the signal line driver circuit 704 are provided over the same substrate 130 as the pixel portion 701. Accordingly, the number of components which are provided outside, such as a driver circuit, are reduced, so that a reduction in cost can be achieved. Furthermore, if the driver circuit is provided outside the substrate 130, wirings would need to be extended and the number of connections of wirings would be increased. However, by providing the driver circuit over the substrate 130, the number of connections of the wirings can be reduced, leading to improved reliability or yield.

<Liquid Crystal Display Device>

FIG. 31B illustrates an example of a circuit configuration of the pixel. Here, a pixel circuit that can be used in a pixel of a VA liquid crystal display device is illustrated.

This pixel circuit can be used in a structure where one pixel includes a plurality of pixel electrodes. The pixel electrodes are connected to different transistors, and the transistors can be driven with different gate signals. Accordingly, signals supplied to individual pixel electrodes in a multi-domain pixel can be controlled independently.

A gate wiring 712 of a transistor 716 and a gate wiring 713 of a transistor 717 are separated from each other so that different gate signals can be supplied thereto. In contrast, a source or drain electrode 714 serving as a data line is shared by the transistors 716 and 717. Any of the transistors described in the above embodiments can be used as appropriate as each of the transistors 716 and 717. Thus, a highly reliable liquid crystal display device can be provided.

A first pixel electrode is electrically connected to the transistor 716 and a second pixel electrode is electrically connected to the transistor 717. The first pixel electrode and the second pixel electrode are separated. The shape of the first pixel electrode and the second pixel electrode is not particularly limited. For example, the first pixel electrode may be a V-like.

A gate electrode of the transistor 716 is connected to the gate wiring 712, and a gate electrode of the transistor 717 is connected to the gate wiring 713. Different gate signals are supplied to the gate wiring 712 and the gate wiring 713, whereby operation timings of the transistor 716 and the transistor 717 can be varied. As a result, alignment of liquid crystals can be controlled.

A storage capacitor may be formed using a capacitor wiring 710, a gate insulating film serving as a dielectric, and a capacitor electrode electrically connected to the first pixel electrode or the second pixel electrode.

The multi-domain pixel includes a first liquid crystal element 718 and a second liquid crystal element 719. The first liquid crystal element 718 includes the first pixel electrode layer, a counter electrode layer, and a liquid crystal layer therebetween. The second liquid crystal element 719 includes the second pixel electrode, a counter electrode, and a liquid crystal layer therebetween.

Note that a pixel circuit of one embodiment of the present invention is not limited to that shown in FIG. 31B. For example, a switch, a resistor, a capacitor, a transistor, a sensor, or a logic circuit may be added to the pixel illustrated in FIG. 31B.

<Organic EL Display Device>

FIG. 31C illustrates another example of a circuit configuration of the pixel. Here, a pixel structure of a display device using an organic EL element is illustrated.

In an organic EL element, by application of voltage to a light-emitting element, electrons are injected from one of a pair of electrodes and holes are injected from the other of the pair of electrodes, into a layer containing a light-emitting organic compound; thus, current flows. The electrons and holes are recombined, and thus, the light-emitting organic compound is excited. The light-emitting organic compound returns to a ground state from the excited state, thereby emitting light. Based on such a mechanism, such a light-emitting element is referred to as a current-excitation type light-emitting element.

FIG. 31C illustrates an example of a pixel circuit that can be used. In this example, one pixel includes two n-channel transistors. Note that an oxide semiconductor film of one embodiment of the present invention can be used for channel formation regions of the n-channel transistors. Digital time grayscale driving can be employed for the pixel circuit.

A pixel 720 includes a switching transistor 721, a driver transistor 722, a light-emitting element 724, and a capacitor 723. A gate electrode of the switching transistor 721 is connected to a scan line 726, a first electrode (one of a source electrode and a drain electrode) of the switching transistor 721 is connected to a signal line 725, and a second electrode (the other of the source electrode and the drain electrode) of the switching transistor 721 is connected to a gate electrode of the driver transistor 722. The gate electrode of the driver transistor 722 is connected to a power supply line 727 through the capacitor 723, a first electrode of the driver transistor 722 is connected to the power supply line 727, and a second electrode of the driver transistor 722 is connected to a first electrode (pixel electrode) of the light-emitting element 724. A second electrode of the light-emitting element 724 corresponds to a common electrode 728. The common electrode 728 is electrically connected to a common potential line formed over the same substrate as the common electrode 728.

As the switching transistor 721 and the driver transistor 722, any of the transistors described in the above embodiments can be used as appropriate. Thus, a highly reliable organic EL display device can be provided.

Note that the configuration of the pixel circuit is not limited to that shown in FIG. 31C. For example, a switch, a resistor, a capacitor, a sensor, a transistor, a logic circuit, or the like may be added to the pixel circuit illustrated in FIG. 31C.

For example, in this specification and the like, a display element, a display device, which is a device including a display element, a light-emitting element, and a light-emitting device, which is a device including a light-emitting element, can employ a variety of modes or can include a variety of elements. Examples of a display element, a display device, a light-emitting element, or a light-emitting device include at least one of an electroluminescence (EL) element (e.g., an EL element including organic and inorganic materials, an organic EL element, and an inorganic EL element), an LED (e.g., a white LED, a red LED, a green LED, and a blue LED), a transistor (a transistor that emits light depending on current), an electron emitter, a liquid crystal element, electronic ink, an electrophoretic element, a grating light valve (GLV), a plasma display panel (PDP), a display element using micro electro mechanical system (MEMS), a digital micromirror device (DMD), a digital micro shutter (DMS), an interferometric modulation (IMOD) element, a MEMS shutter display element, an optical-interference-type MEMS display element, an electrowetting element, a piezoelectric ceramic display, and a display element using a carbon nanotube. Other than the above, a display medium whose contrast, luminance, reflectance, transmittance, or the like is changed by electrical or magnetic action may be included. Note that examples of display devices using EL elements include an EL display. Examples of display devices including electron emitters include a field emission display (FED) and an SED-type flat panel display (SED: surface-conduction electron-emitter display). Examples of display devices using liquid crystal elements include a liquid crystal display (e.g., a transmissive liquid crystal display, a transflective liquid crystal display, a reflective liquid crystal display, a direct-view liquid crystal display, and a projection liquid crystal display). An example of a display device including electronic ink or electrophoretic elements is electronic paper. In the case of a transflective liquid crystal display or a reflective liquid crystal display, some or all of pixel electrodes function as reflective electrodes. For example, some or all of pixel electrodes are formed to contain aluminum, silver, or the like. In such a case, a storage circuit such as an SRAM can be provided under the reflective electrodes, leading to lower power consumption.

The structures, methods, and the like described in this embodiment can be used in combination with any of the structures, methods, and the like described in the other embodiments, as appropriate. The structure described in this embodiment can be used in combination with any of the structures described in the other embodiments, as appropriate.

Embodiment 6

In this embodiment, a display module using a semiconductor device of one embodiment of the present invention will be described with reference to FIG. 32.

Figure 32:
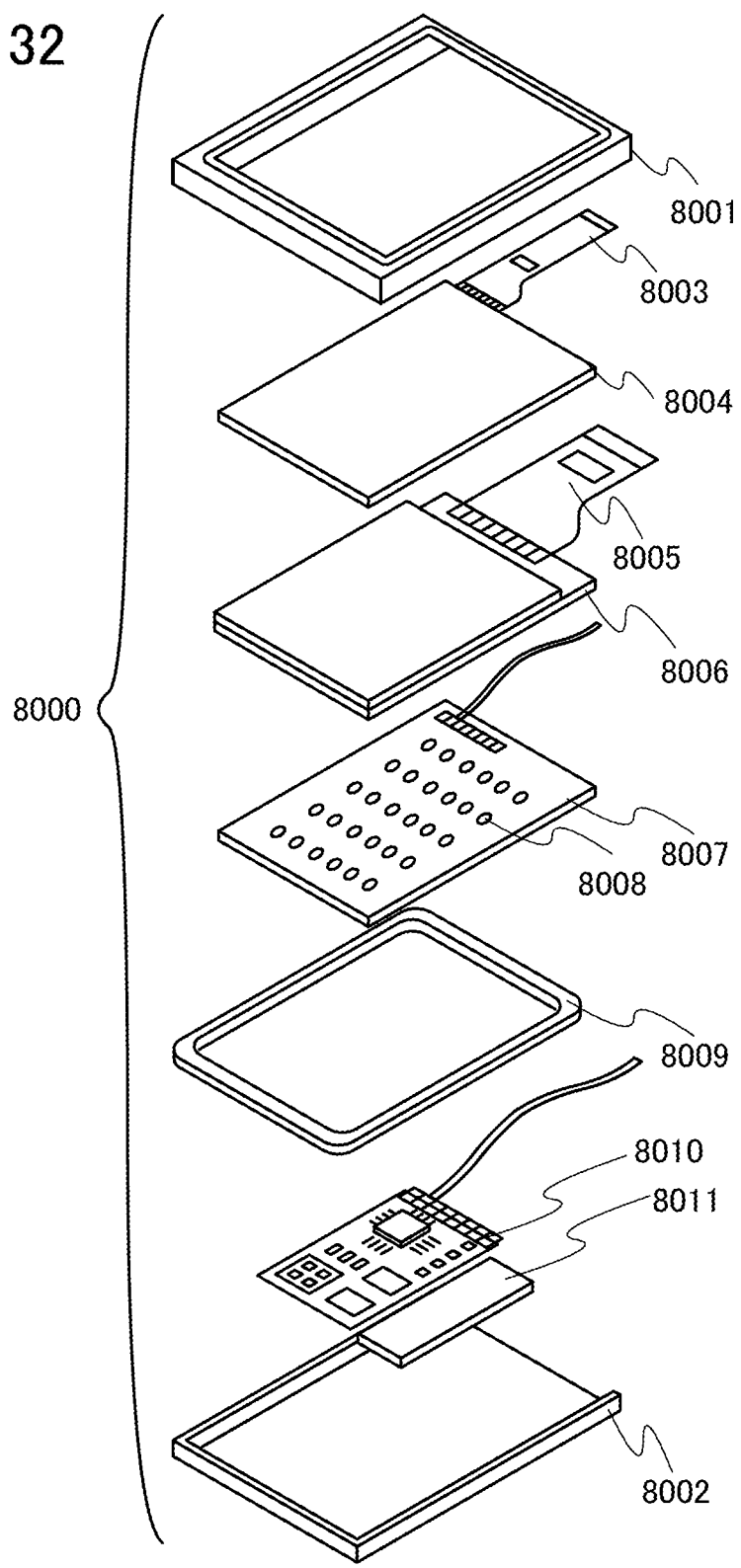
FIG. 32 illustrates a display module.

In a display module 8000 illustrated in FIG. 32, a touch panel 8004 connected to an FPC 8003, a display panel 8006 connected to an FPC 8005, a backlight unit 8007, a frame 8009, a printed board 8010, and a battery 8011 are provided between an upper cover 8001 and a lower cover 8002. Note that the backlight unit 8007, the battery 8011, the touch panel 8004, and the like are not provided in some cases.

The semiconductor device of one embodiment of the present invention can be used for, for example, the display panel 8006.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and may be formed so as to overlap with the display panel 8006. A counter substrate (sealing substrate) of the display panel 8006 can have a touch panel function. A photosensor may be provided in each pixel of the display panel 8006 to form an optical touch panel. An electrode for a touch sensor may be provided in each pixel of the display panel 8006 so that a capacitive touch panel is obtained.

The backlight unit 8007 includes a light source 8008. The light source 8008 may be provided at an end portion of the backlight unit 8007 and a light diffusing plate may be used.

The frame 8009 protects the display panel 8006 and functions as an electromagnetic shield for blocking electromagnetic waves generated by the operation of the printed board 8010. The frame 8009 may function as a radiator plate.

The printed board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a member such as a polarizing plate, a retardation plate, or a prism sheet.

The structures, methods, and the like described in this embodiment can be used in combination with any of the structures, methods, and the like described in the other embodiments, as appropriate. The structure described in this embodiment can be used in combination with any of the structures described in the other embodiments, as appropriate.

Embodiment 7

In this embodiment, examples of electronic devices each using a semiconductor device of one embodiment of the present invention will be described.

Examples of electronic devices each utilizing the semiconductor device of one embodiment of the present invention are as follows: display devices of televisions, monitors, and the like, lighting devices, desktop personal computers and laptop personal computers, word processors, image reproduction devices which reproduce still images and moving images stored in recording media such as digital versatile discs (DVDs), portable CD players, portable radios, tape recorders, headphone stereos, stereos, table clocks, wall clocks, cordless phone handsets, transceivers, portable wireless devices, mobile phones, car phones, portable game machines, tablet terminals, large-sized game machines such as pachinko machines, calculators, portable information terminals, electronic notebooks, e-book readers, electronic translators, audio input devices, video cameras, digital still cameras, electric shavers, high-frequency heating appliances such as microwave ovens, electric rice cookers, electric washing machines, electric vacuum cleaners, water heaters, electric fans, hair dryers, air-conditioning systems such as air conditioners, humidifiers, and dehumidifiers, dishwashers, dish dryers, clothes dryers, futon dryers, electric refrigerators, electric freezers, electric refrigerator-freezers, freezers for preserving DNA, flashlights, tools such as a chain saw, smoke detectors, and medical equipment such as dialyzers. Furthermore, industrial equipment such as guide lights, traffic lights, belt conveyors, elevators, escalators, industrial robots, power storage systems, and power storage devices for leveling the amount of power supply and smart grid can be given. In addition, moving objects driven by electric motors using electric power from fuel engines and electric motors using power from non-aqueous secondary batteries are also included in the category of electronic devices. Examples of the moving objects are electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats, ships, submarines, helicopters, aircrafts, rockets, artificial satellites, space probes, planetary probes, and spacecrafts.

Figure 33A:
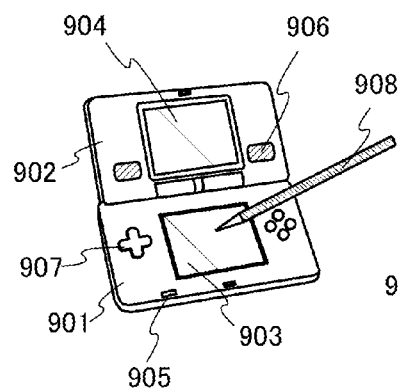
FIGS. 33A to 33F illustrate electronic devices of embodiments of the present invention.

FIG. 33A illustrates an example of a portable game machine that includes a housing 901, a housing 902, a display portion 903, a display portion 904, a microphone 905, a speaker 906, an operation key 907, a stylus 908, and the like. Although the portable game machine in FIG. 33A has the two display portions 903 and 904, the number of display portions included in a portable game machine is not limited to this. Any of the semiconductor devices described in Embodiments 1 to 4 can be used in a CPU, a memory device, or the like that is not illustrated in FIG. 33A.

Figure 33B:
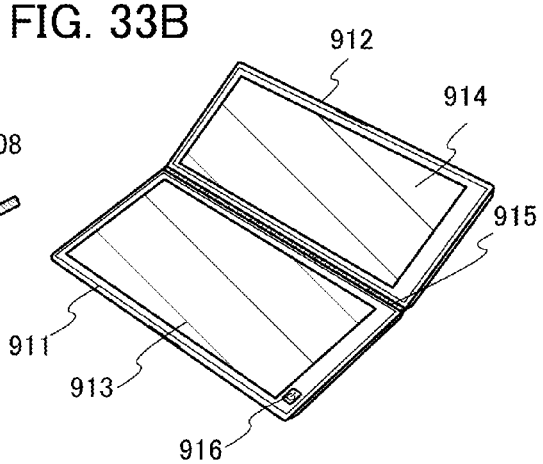

FIG. 33B illustrates an example of a portable data terminal that includes a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image on the first display portion 913 may be changed in accordance with the angle at the joint 915 between the first housing 911 and the second housing 912. A display device with a position input function may be used as at least one of the first display portion 913 and the second display portion 914. Note that the position input function can be added by provision of a touch panel in a display device. Alternatively, the position input function can be added by provision of a photoelectric conversion element called a photosensor in a pixel portion of a display device. Any of the semiconductor devices described in Embodiments 1 to 4 can be used in a CPU, a memory device, or the like that is not illustrated in FIG. 33B.

Figure 33C:
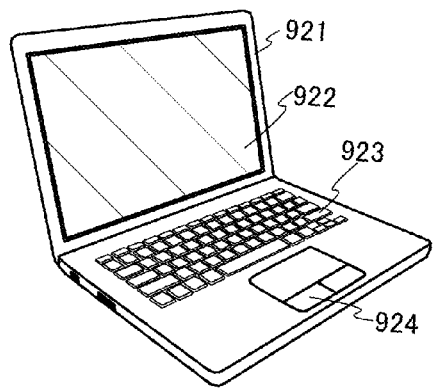

FIG. 33C illustrates an example of a laptop personal computer that includes a housing 921, a display portion 922, a keyboard 923, a pointing device 924, and the like. Any of the semiconductor devices described in Embodiments 1 to 4 can be used in a CPU, a memory device, or the like that is not illustrated in FIG. 33C.

Figure 33D:
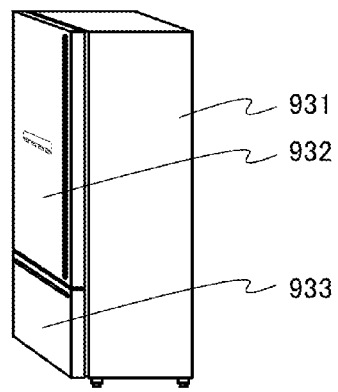

FIG. 33D illustrates an example of an electric refrigerator-freezer that includes a housing 931, a door for a refrigerator 932, a door for a freezer 933, and the like. Any of the semiconductor devices described in Embodiments 1 to 4 can be used in a CPU, a memory device, or the like that is not illustrated in FIG. 33D.

Figure 33E:
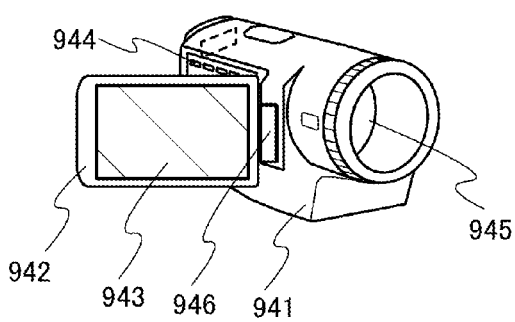

FIG. 33E illustrates an example of a video camera that includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. An image displayed on the display portion 943 may be changed in accordance with the angle at the joint 946 between the first housing 941 and the second housing 942. Any of the semiconductor devices described in Embodiments 1 to 4 can be used in a CPU, a memory device, or the like that is not illustrated in FIG. 33E.

Figure 33F:
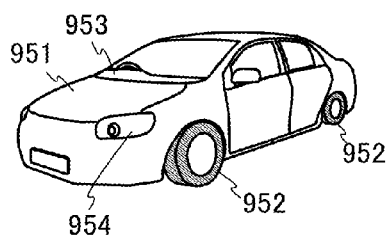

FIG. 33F illustrates an example of an automobile that includes a car body 951, wheels 952, a dashboard 953, lights 954, and the like. Any of the semiconductor devices described in Embodiments 1 to 4 can be used in a CPU, a memory device, or the like that is not illustrated in FIG. 33F.

This embodiment can be combination with any of the other embodiments described in this specification, as appropriate.

EXPLANATION OF REFERENCE

10: semiconductor device, 11: element layer, 12: terminal, 13: die pad, 14: conductive paste, 15: conductive film, 16: conductive member, 17: organic resin layer, 21: region, 22: sealing region, 22a: region, 22b: region, 22c: sealing region, 31: broken line, 32: transistor, 33: transistor, 33a: transistor, 33b: transistor, 34: protective film, 35: protective film, 36: protective film, 37: conductive film, 38: protective film, 39: capacitor, 40: protective film, 50: stage, 51: element substrate, 53: frame body, 54: adhesive sheet, 55: cutting water, 56: dicing wheel, 58: UV light, 59: lead frame, 59a: die pad, 59b: external electrode, 60: conductive paste, 101: conductive film, 102: insulating film, 103: insulating film, 105: oxide semiconductor film, 105a: oxide semiconductor film, 106: conductive film, 106a: conductive film, 107: conductive film, 108: conductive film, 108a: conductive film, 109: insulating film, 111: conductive film, 113: oxide semiconductor film, 113a: oxide semiconductor film, 114: oxide semiconductor film, 114a: oxide semiconductor film, 114b: oxide semiconductor film, 115: oxide semiconductor film, 116: insulating film, 117: insulating film, 119: insulating film, 121: conductive film, 125a: opening, 125b: opening, 130: substrate, 131: channel region, 133: impurity region, 135: insulating film, 137: conductive film, 139: side wall insulating film, 141: insulating film, 143: insulating film, 145: insulating film, 147: insulating film, 149: insulating film, 151: insulating film, 153: insulating film, 161a: conductive film, 161b: conductive film, 161c: conductive film, 163a: conductive film, 163b: conductive film, 163c: conductive film, 165: conductive film, 167: conductive film, 167a: conductive film, 167b: conductive film, 167c: conductive film, 169: conductive film, 169a: conductive film, 169b: conductive film, 169c: conductive film, 171: conductive film, 171a: conductive film, 171b: conductive film, 171c: conductive film, 173: conductive film, 173a: conductive film, 173b: conductive film, 173c: conductive film, 175a: conductive film, 175c: conductive film, 180: substrate, 181: semiconductor film, 183: insulating film, 201: memory cell, 202: CMOS circuit, 701: pixel portion, 702: scan line driver circuit, 703: scan line driver circuit, 704: signal line driver circuit, 710: capacitor wiring, 712: gate wiring, 713: gate wiring, 714: drain electrode, 716: transistor, 717: transistor, 718: liquid crystal element, 719: liquid crystal element, 720: pixel, 721: switching transistor, 722: driver transistor, 723: capacitor, 724: light-emitting element, 725: signal line, 726: scan line, 727: power supply line, 728: common electrode, 901: housing, 902: housing, 903: display portion, 904: display portion, 905: microphone, 906: speaker, 907: operation key, 908: stylus, 911: housing, 912: housing, 913: display portion, 914: display portion, 915: joint, 916: operation key, 921: housing, 922: display portion, 923: keyboard, 924: pointing device, 931: housing, 932: door for refrigerator, 933: door for freezer, 941: housing, 942: housing, 943: display portion, 944: operation key, 945: lens, 946: joint, 951: car body, 952: wheel, 953: dashboard, 954: light, 8000: display module, 8001: upper cover, 8002: lower cover, 8003: FPC, 8004: touch panel, 8005: FPC, 8006: display panel, 8007: backlight unit, 8008: light source, 8009: frame, 8010: printed board, and 8011: battery This application is based on Japanese Patent Application serial no. 2014-086311 filed with Japan Patent Office on Apr. 18, 2014, the entire contents of which are hereby incorporated by reference.

The invention claimed is:

1. A semiconductor device comprising:
    an element layer comprising:
        a first film;
        a second film; and
        a first transistor between the first film and the second film, the first transistor comprising:
            a first gate electrode;
            a first gate insulating layer over the first gate electrode;
            an oxide semiconductor layer over the first gate insulating layer;
            a second gate insulating layer over the oxide semiconductor layer;
            a second gate electrode over the second gate insulating layer; and
            source and drain electrodes electrically connected to the oxide semiconductor layer,
    wherein the first film is over and in contact with the second gate electrode and the source and drain electrodes,
    wherein each of the first film and the second film is configured to suppress diffusion of at least one of hydrogen and water,
    wherein the element layer comprises a region in which the first film and the second film are in contact with each other,
    wherein the region has a closed-loop shape when seen from a top of the semiconductor device, and
    wherein the region is between a side surface of the element layer and the first transistor.

2. The semiconductor device according to claim 1, further comprising:

a second transistor comprising:
    a third gate electrode;
    a semiconductor region in a semiconductor substrate; and
    a third gate insulating film between the third gate electrode and the semiconductor region,
wherein the second film is between the first transistor and the second transistor.

3. The semiconductor device according to claim 2, wherein the second film is configured to as the third gate insulating film in the second transistor.

4. The semiconductor device according to claim 1, further comprising:
a second transistor over a substrate, the second transistor comprising:
    a third gate electrode;
    a semiconductor film; and
    a third gate insulating film between the third gate electrode and the semiconductor film.

5. The semiconductor device according to claim 4, wherein the second film is between the first transistor and the second transistor.

6. The semiconductor device according to claim 4, wherein the second film is configured to serve as the third gate insulating film in the second transistor.

7. The semiconductor device according to claim 4, wherein the second film is between the substrate and the second transistor.

8. The semiconductor device according to claim 2, further comprising:
a third film in contact with the first film,
wherein the third film is between the first transistor and the second transistor.

9. The semiconductor device according to claim 4, further comprising:
a third film in contact with at least one of the first film and the second film,
wherein the second film is located between the substrate and the second transistor, and
wherein the third film is between the first transistor and the second transistor.

10. The semiconductor device according to claim 1, wherein at least one of the first and second films comprises any of a silicon nitride film, a silicon nitride oxide film, an aluminum oxide film, an aluminum oxynitride film, a gallium oxide film, a gallium oxynitride film, a yttrium oxide film, a yttrium oxynitride film, a hafnium oxide film, and a hafnium oxynitride film.

11. The semiconductor device according to claim 1, further comprising a terminal electrically connected to the first transistor.

12. The semiconductor device according to claim 11, wherein the terminal and the one of the first film and the second film are in contact with each other.

13. The semiconductor device according to claim 11, wherein the terminal is configured to suppress diffusion of at least one of hydrogen and water.

14. The semiconductor device according to claim 11, wherein the terminal comprises any of a titanium film, a tantalum film, a titanium nitride film, a tantalum nitride film, and an $Ir_xTa_{1-x}$ ($0<x<1$) film.

15. An electronic device comprising:
the semiconductor device according to claim 1; and
one of a display device, a speaker, a microphone, an operation key, and a battery.

16. A semiconductor device comprising:
an element layer comprising:
    a first transistor comprising:
        first gate electrode;
        a first gate insulating layer over the first gate electrode;
        an oxide semiconductor layer over the first gate insulating layer;
        a second gate insulating layer over the oxide semiconductor layer;
        a second gate electrode over the second gate insulating layer; and
        source and drain electrodes electrically connected to the oxide semiconductor layer,
    a second transistor comprising:
        a third gate electrode;
        a semiconductor region in a semiconductor substrate; and
        a third gate insulating film between the third gate electrode and the semiconductor region,
    a first film over the second gate electrode, the second gate insulating layer, and the source and drain electrodes, and
    a second film between the first transistor and the second transistor,
wherein the first film is in contact with the second gate electrode and the source and drain electrodes,
wherein each of the first film and the second film is configured to suppress diffusion of at least one of hydrogen and water,
wherein the element layer comprises a region in which the first film and the second film are in contact with each other,
wherein the region has a closed-loop shape when seen from a top of the semiconductor device, and
wherein the region is between a side surface of the element layer and the first transistor.

17. The semiconductor device according to claim 16, further comprising:
a third film in contact with the first film,
wherein the third film covers the second film and the first gate electrode.

18. The semiconductor device according to claim 16, further comprising:
a capacitor comprising one of the source and drain electrodes, an electrode, and an insulating layer between the one of the source and drain electrodes and the electrode,
wherein the first film is over and in contact with the capacitor,
wherein the insulating layer and the second gate insulating layer are formed in the same layer, and
wherein the electrode and the second gate electrode are formed in the same layer.

* * * * *

UNITED STATES PATENT AND TRADEMARK OFFICE
CERTIFICATE OF CORRECTION

PATENT NO. : 9,502,434 B2  
APPLICATION NO. : 14/683567  
DATED : November 22, 2016  
INVENTOR(S) : Tetsuhiro Tanaka et al.

Page 1 of 1

It is certified that error appears in the above-identified patent and that said Letters Patent is hereby corrected as shown below:

In the Specification

Column 29, Line 24, after "to" replace "a." with --$\alpha$.--;

Column 37, Line 67, replace "(03)" with --($0_3$)--;

In the Claims

Column 63, Line 10, in Claim 3, between "to" and "as" insert --serve--;

Column 64, Line 12, in Claim 16, replace "laver;" with --layer;--; and

Column 64, Line 14, in Claim 16, replace "laver;" with --layer;--.

Signed and Sealed this  
Eighteenth Day of April, 2017

Michelle K. Lee  
*Director of the United States Patent and Trademark Office*